United States Patent
Yoneda et al.

(10) Patent No.: US 6,824,954 B2
(45) Date of Patent: Nov. 30, 2004

(54) SULFONYLOXIME COMPOUND, AND RADIATION SENSITIVE ACID GENERATOR, POSITIVE TYPE RADIATION SENSITIVE RESIN COMPOSITION AND NEGATIVE TYPE RADIATION SENSITIVE RESIN COMPOSITION USING SAME

(75) Inventors: Eiji Yoneda, Yokkaichi (JP); Tatsuya Toneri, Yokkaichi (JP); Yong Wang, Yokkaichi (JP); Tsutomu Shimokawa, Suzuka (JP)

(73) Assignee: JSR Corporation, Tokyo (JP)

( * ) Notice: Subject to any disclaimer, the term of this patent is extended or adjusted under 35 U.S.C. 154(b) by 138 days.

(21) Appl. No.: 10/226,348

(22) Filed: Aug. 23, 2002

(65) Prior Publication Data

US 2003/0113660 A1 Jun. 19, 2003

(30) Foreign Application Priority Data

Aug. 23, 2001 (JP) .................................. 2001-253703

(51) Int. Cl.$^7$ .......................... G03F 7/039; G03F 7/038; C07C 249/00; C07C 251/00; C07C 259/00
(52) U.S. Cl. ................... 430/270.1; 430/914; 430/919; 430/921; 564/253; 564/254; 564/265
(58) Field of Search ............................ 430/270.1, 914, 430/919, 921; 564/253, 254, 265

(56) References Cited

U.S. PATENT DOCUMENTS

| | | | |
|---|---|---|---|
| 5,800,964 A | * 9/1998 | Sato et al. | 430/919 |
| 6,004,724 A | * 12/1999 | Yamato et al. | 430/919 |
| 6,261,738 B1 | 7/2001 | Asakura et al. | 430/270.1 |
| 6,512,020 B1 | * 1/2003 | Asakura et al. | 564/253 |
| 2004/0002007 A1 | * 1/2004 | Hitoshi et al. | 430/270.1 |

* cited by examiner

Primary Examiner—Richard L. Schilling
(74) Attorney, Agent, or Firm—Piper Rudnick LLP; Steven B. Kelher

(57) ABSTRACT

A sulfonyloxime compound is provided which is represented by a general formula (1):

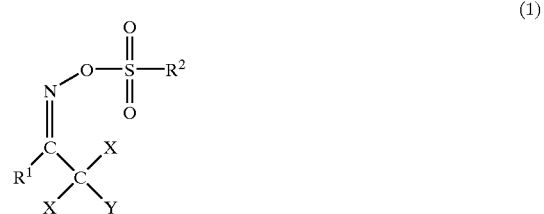

(1)

wherein, $R^1$ represents a hydrogen atom, an alkyl group, an aryl group, or a heteroaryl group; $R^2$ represents an alkyl group, an aryl group, or a heteroaryl group; X represents a halogen atom; Y represents —$R^3$, a —CO—$R^3$ group, —COO—$R^3$ group, —CONR$^3$R$^4$ group, —S—$R^3$ group, —SO—$R^3$ group, —SO$_2$—$R^3$ group, a —CN group or a —NO$_2$ group, and $R^3$ and $R^4$ within the Y group each represent a hydrogen atom, an alkyl group, an aryl group, or a heteroaryl group, although any two of $R^1$, $R^2$ and $R^3$ may also be bonded together to form a cyclic structure, and furthermore dimers of a compound represented by the general formula (1) in which $R^1$, $R^2$ or Y groups from separate molecules are bonded together to form a single bivalent group, are also possible. This compound is very useful as a radiation sensitive acid generator which is sensitive to activated radiation such as far ultraviolet radiation or electron beams and the like, and displays superior heat stability and storage stability. Furthermore, chemically amplified positive type or negative type radiation sensitive resin compositions incorporating such a radiation sensitive acid generator are also provided.

17 Claims, 24 Drawing Sheets

(a)

0.25 μm

ΔCD (b)

SULFONYLOXIME COMPOUND, AND RADIATION SENSITIVE ACID GENERATOR, POSITIVE TYPE RADIATION SENSITIVE RESIN COMPOSITION AND NEGATIVE TYPE RADIATION SENSITIVE RESIN COMPOSITION USING SAME

BACKGROUND OF THE INVENTION

1. Field of the Invention

The present invention relates to a novel sulfonyloxime compound suitable for use as a radiation sensitive acid generator and thermosensitive acid generator constituent of a radiation sensitive resin composition used as a chemically amplified resist in which ultrafine processing is performed using any of a variety of different types of radiation including KrF excimer lasers, ArF excimer lasers, $F_2$ excimer lasers, (ultra) far ultraviolet radiation such as EUV, X rays such as synchrotron radiation, and charged particle beams such as electron beams, and also relates to a radiation sensitive acid generator, a chemically amplified positive type radiation sensitive resin composition and a chemically amplified negative type radiation sensitive resin composition using such a sulfonyloxime compound.

2. Description of the Related Art

In the area of ultrafine processing, typified by the manufacture of integrated circuit elements, lithography techniques which enable ultrafine processing to be performed at a level of less than 0.20 μm have become necessary in order to achieve ever greater levels of integration.

However, in conventional lithography production processes, near ultraviolet radiation such as an i line is typically used as the radiation, and it has been reported that when this type of near ultraviolet radiation is used, ultrafine processing at the subquarter micron level is extremely difficult.

Consequently, in order to make ultrafine processing possible at levels of less than 0.20 μm, the use of radiation of shorter wavelengths is being investigated. Examples of radiation with a shorter wavelength include far ultraviolet radiation typified by an excimer laser or the line spectrum of a mercury light, X rays, and electron beams and the like, and of these, KrF excimer lasers (wavelength 248 nm), ArF excimer lasers (wavelength 193 nm), $F_2$ excimer lasers (wavelength 157 nm), EUV (wavelength 13 nm or the like) and electron beams and the like are attracting particular interest.

Examples of radiation sensitive resin compositions which are suitable for use with this type of short wavelength radiation include compositions which utilize the chemical amplification effect between a constituent with an acid dissociable functional group, and a radiation sensitive acid generator which generates an acid on irradiation with the radiation (hereafter described as "exposure"), and many of these types of compositions (hereafter described as chemically amplified radiation sensitive compositions) have been reported.

Specific examples of chemically amplified radiation sensitive compositions include the compositions disclosed in Japanese Post-Examination publication (kokoku) No. 2-27660 (JP2-27660B), incorporating a polymer with a t-butyl ester group of a carboxylic acid or a t-butyl carbonate group of a phenol, and a radiation sensitive acid generator. When these compositions are exposed, the acid generated by the exposure causes a dissociation of the t-butyl ester groups or the t-butyl carbonate groups in the polymer, forming acidic carboxyl groups or phenolic hydroxyl groups within the polymer, and as a result, the exposed regions of the resist become readily soluble in the alkali developing solution.

However, when the design dimensions of a device fall below the subhalf micron level, requiring even more precise control of the line width, high resolution alone is insufficient, and a superior level of smoothness of the film surface following formation of the resist pattern is now also becoming an important factor. If a chemically amplified resist with an inferior level of surface smoothness is used, then when the resist pattern is transferred to a substrate using a process such as etching, the irregularities in the film surface (so-called nano edge roughness) are also transferred to the substrate, causing a deterioration in the precision of the dimensions, and ultimately a deterioration in the electrical characteristics of the device (for example, J. Photopolym. Sci. Tech. p571, 1988; Proc. SPIE Vol. 3333, p313; Proc. SPIE Vol. 3333, p634; J. Vac. Sci. Technol. B16(1), 1998, p69).

Taking the above circumstances into consideration, an object of the present invention is to provide a sulfonyloxime compound which displays superior heat stability and storage stability, and which is capable of generating a resist pattern with superior smoothness of the surface and side walls thereof, for use as an acid generator sensitive to activated radiation such as KrF excimer lasers, ArF excimer lasers or $F_2$ excimer lasers, far ultraviolet radiation typified by EUV, or electron beams and the like, as well as to provide a radiation sensitive acid generator, a positive type radiation sensitive resin composition and a negative type radiation sensitive resin composition using such a sulfonyloxime compound.

SUMMARY OF THE INVENTION

The above object was able to be achieved by using a specific sulfonyloxime compound, described below, as a constituent of a radiation sensitive acid generator.

In other words, a first aspect of the present invention provides a sulfonyloxime compound represented by a general formula (1) shown below,

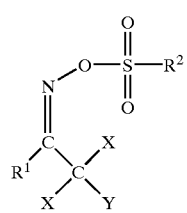

(1)

wherein, $R^1$ represents a hydrogen atom, or a substituted or unsubstituted alkyl group of 1 to 20 carbon atoms, substituted or unsubstituted aryl group, or substituted or unsubstituted heteroaryl group, $R^2$ represents a substituted or unsubstituted alkyl group of 1 to 20 carbon atoms, substituted or unsubstituted aryl group, or substituted or unsubstituted heteroaryl group, X represents a halogen atom, Y represents —$R^3$, a —CO—$R^3$ group, —COO—$R^3$ group, —CONR$^3$R$^4$ group, —S—$R^3$ group, —SO—$R^3$ group, —SO$_2$—$R^3$ group, a —CN group or a —NO$_2$ group, and $R^3$ and $R^4$ within the Y group each represent, independently, a hydrogen atom, or a substituted or unsubstituted alkyl group of 1 to 20 carbon atoms, substituted or unsubstituted aryl group, or substituted or unsubstituted heteroaryl group, although any two of $R^1$, $R^2$ and $R^3$ may also be bonded together to form a cyclic structure having the formula (2-1), formula (2-2) or formula (2-3) below,

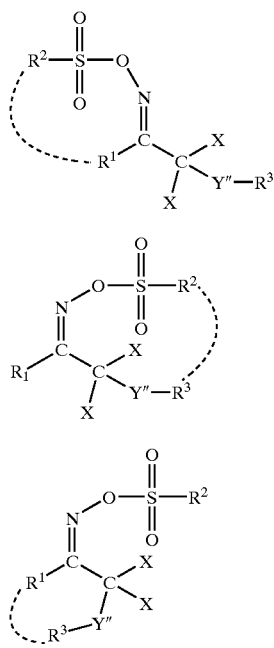

(2-1)

(2-2)

(2-3)

wherein, Y" represents a single bond or a bivalent group formed when the $R^3$ group is removed from the aforementioned Y group, and furthermore dimers represented by the formula (3-1), formula (3-2) or formula (3-3) shown below, in which one of the groups $R^1$, $R^2$ or Y functions as a linkage group $R^{1\prime}$, $R^{2\prime}$, or Y' respectively, are also possible.

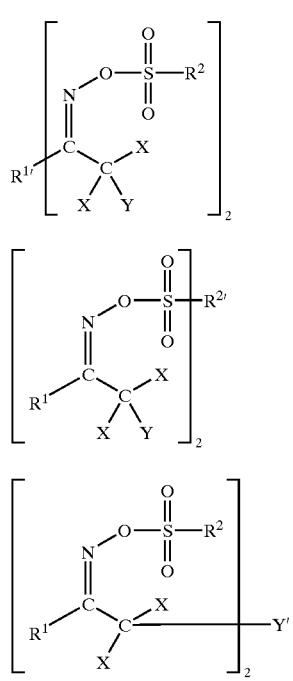

(3-1)

(3-2)

(3-3)

wherein, $R^{1\prime}$, $R^{2\prime}$ and Y' each represent a bivalent group formed by bonding together residues generated by dissociating one atom or group from two separate $R^1$, $R^2$ or Y groups belonging to separate molecules.

A second aspect of the present invention provides a radiation sensitive acid generator comprising an aforementioned sulfonyloxime compound.

A third aspect of the present invention provides a chemically amplified positive type radiation sensitive resin composition comprising (A) a radiation sensitive acid generator incorporating an aforementioned sulfonyloxime compound, and (B) an alkali insoluble or alkali sparingly soluble resin protected with an acid dissociable group, which becomes alkali-soluble on dissociation of the acid dissociable group.

A fourth aspect of the present invention provides a chemically amplified negative type radiation sensitive resin composition comprising (A) a radiation sensitive acid generator incorporating an aforementioned sulfonyloxime compound, (C) an alkali-soluble resin, and (D) a compound which is capable of cross-linking with the alkali-soluble resin in the presence of an acid.

BRIEF DESCRIPTION OF THE DRAWINGS

In the accompanying drawings.

DETAILED DESCRIPTION OF THE PREFERRED EMBODIMENTS

Figure 1:
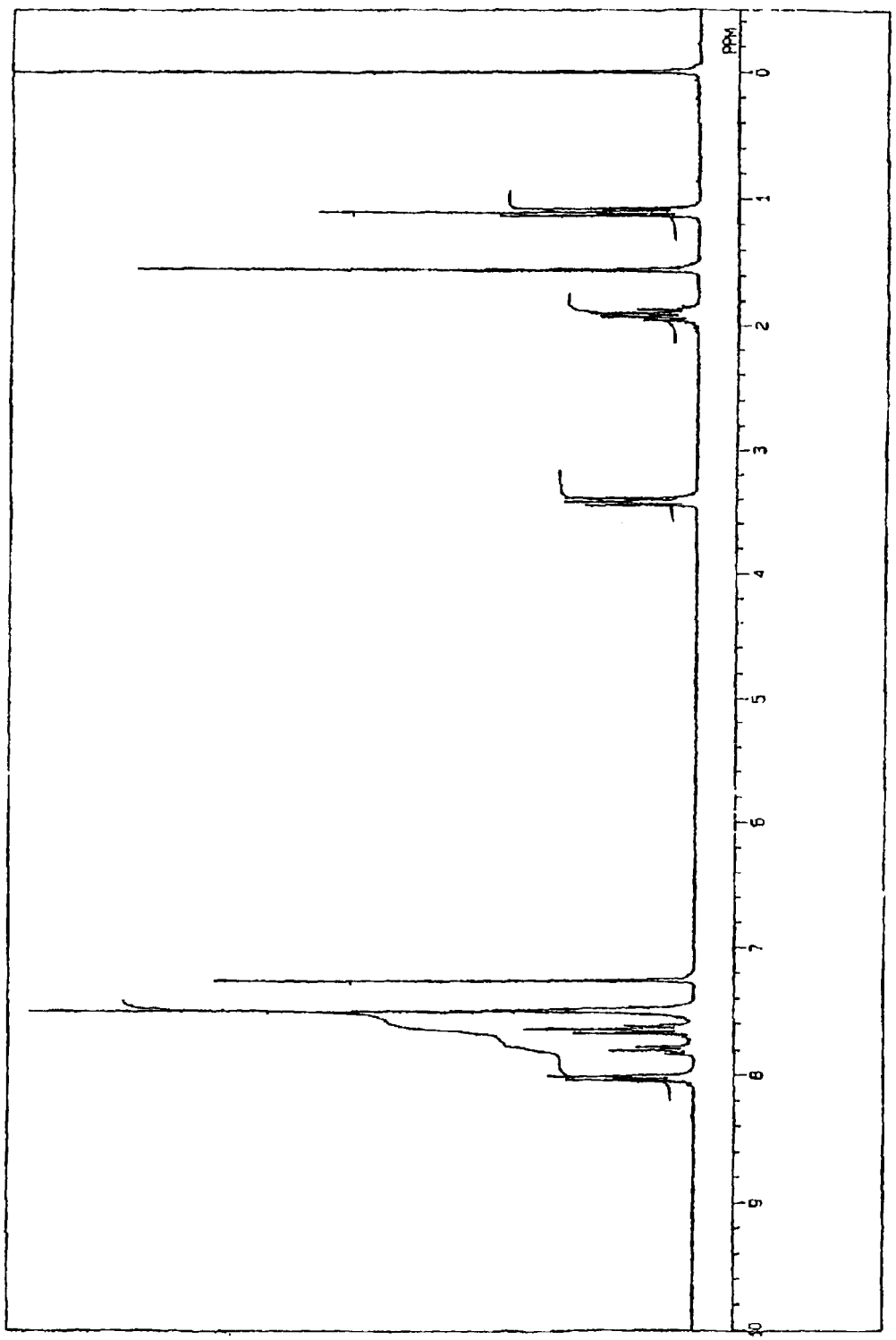
FIG. 1 is a diagram showing results of $^1$H-NMR spectrometry analysis of a sulfonyloxime compound obtained in an example 1.

As follows is a more detailed description of the present invention.

Sulfonyloxime Compound

The sulfonyloxime compound represented by the general formula (1) of the first aspect of the present invention is now described.

In the general formula (1), $R^1$ represents a hydrogen atom, or a substituted or unsubstituted alkyl group of 1 to 20 carbon atoms, substituted or unsubstituted aryl group, or substituted or unsubstituted heteroaryl group, and $R^2$ represents a substituted or unsubstituted alkyl group of 1 to 20 carbon atoms, substituted or unsubstituted aryl group, or substituted or unsubstituted heteroaryl group. Examples of suitable unsubstituted alkyl groups of 1 to 20 carbon atoms include straight chain, branched, or cyclic structures, such as methyl groups, ethyl groups, propyl groups, isopropyl groups, butyl groups, t-butyl groups, pentyl groups, isopentyl groups, hexyl groups, 2-hexyl groups, isohexyl groups, n-octyl groups, s-octyl groups, n-dodecyl groups, cyclopropyl groups, cyclopentyl groups, and cyclohexyl groups. Examples of suitable substituents for substituted alkyl groups include aryl groups, alkenyl groups, cycloalkyl groups, halogen atoms and organic groups incorporating hetero atoms such as oxygen, nitrogen, sulfur, phosphorus or silicon, and suitable substituted alkyl groups include groups in which one of these substituents replaces one or more hydrogen atoms bonded to carbon atoms within the aforementioned unsubstituted alkyl groups. Specific examples of such substituted alkyl groups include benzyl groups, methoxyethyl groups, acetylmethyl groups, methylthiomethyl groups, ethoxycarbonylmethyl groups, chloromethyl groups, trichloromethyl groups, trifluoromethyl groups, 2-bromopropyl groups, trichloroacetylmethyl groups, trifluoroacetylmethyl groups, pentafluorobenzoylmethyl groups, 2-phenylethyl groups, 3-phenylpropyl groups, cyclohexylaminomethyl groups, aminomethyl groups, 2-aminoethyl groups, phenoxymethyl groups, methoxymethyl groups, diphenylphosphinomethyl groups and trimethylsilylmethyl groups.

Suitable examples of aryl groups include phenyl groups, naphthyl groups, anthryl groups and phenanthryl groups, and examples of heteroaryl groups include thienyl groups, thianthrenyl groups, furyl groups, pyranyl groups, pyrrolyl groups, pyrazolyl groups, isothiazolyl groups, isooxazolyl groups, pyrazinyl groups, pyrimidinyl groups and pyridazinyl groups. Examples of suitable substituents for substituted aryl groups and substituted heteroaryl groups include alkyl groups, haloalkyl groups, halogen atoms and organic groups incorporating hetero atoms such as oxygen, nitrogen, sulfur, phosphorus or silicon, and specific examples of suitable substituted aryl groups include p-methoxyphenyl groups, m-trifluorophenyl groups, p-tolyl groups, mesityl groups, o-cumenyl groups, 2,3-xylyl groups, o-bromophenyl groups, m-chlorophenyl groups, p-iodophenyl groups, 3-methoxythienyl groups and 2-bromofuryl groups.

X represents a halogen atom, and fluorine and chlorine are preferred.

Y represents —$R^3$, a —CO—$R^3$ group, —COO—$R^3$ group, —CONR$^3$R$^4$ group, —S—$R^3$ group, —SO—$R^3$ group, —SO$_2$—$R^3$ group, a —CN group or a —NO$_2$ group, and $R^3$ and $R^4$ within the Y group each represent, independently, a hydrogen atom, or a substituted or unsubstituted alkyl group of 1 to 20 carbon atoms, substituted or unsubstituted aryl group, or substituted or unsubstituted heteroaryl group, and specific examples thereof include those groups described above for $R^1$ and $R^2$.

However in the sulfonyloxime compound represented by the general formula (1), any two of $R^1$, $R^2$ and $R^3$ may also be bonded together to form a cyclic structure shown in the formula (2-1), formula (2-2) or formula (2-3) below,

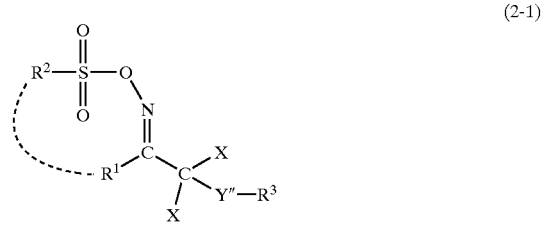

(2-1)

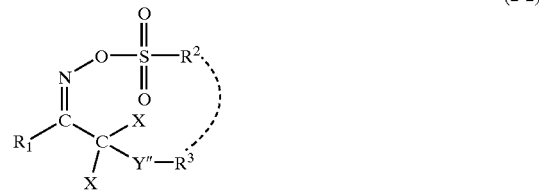

(2-2)

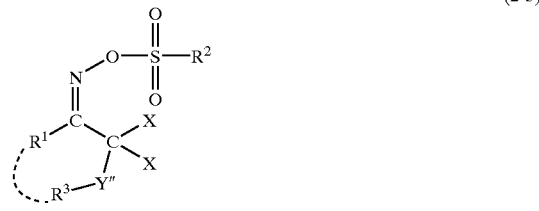

(2-3)

wherein, Y" represents a single bond or a bivalent group formed when the $R^3$ group is removed from the aforementioned Y group.

Furthermore dimers represented by the formula (3-1), formula (3-2) or formula (3-3) shown below, in which one of the groups $R^1$, $R^2$ or Y functions as a linkage group $R^{1'}$, $R^{2'}$, or Y' respectively, are also possible.

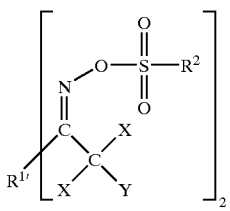
(3-1)

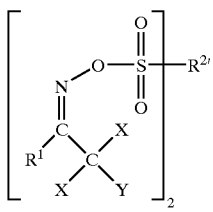
(3-2)

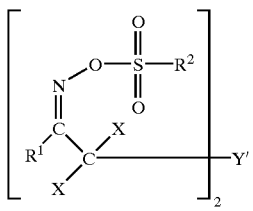
(3-3)

wherein, $R^{1'}$, $R^{2'}$ and $Y'$ each represent a bivalent group formed by bonding together residues generated by dissociating one atom or group from two $R^1$, $R^2$ or $Y$ groups belonging to separate molecules.

In the general formula (1), $R^1$ represents preferably a substituted or unsubstituted aryl group, and more preferably a substituted or unsubstituted phenyl group, and $R^2$ represents preferably a substituted or unsubstituted alkyl group of 1 to 20 carbon atoms, and more preferably a substituted or unsubstituted alkyl group of 3 to 8 carbon atoms.

X represents a halogen atom, preferably a fluorine or chlorine atom, more preferably a fluorine atom.

Y represents —$R^3$, —$CONR^3R^4$ group, —SO—$R^3$ group, —$SO_2$—$R^3$ group, or a —$NO_2$ group, and $R^3$ and $R^4$ within the Y group each represent, independently, a hydrogen atom, or a substituted or unsubstituted alkyl group of 1 to 20 carbon atoms, substituted or unsubstituted aryl group, or substituted or unsubstituted heteroaryl group. Y represents more preferably —SO—$R^3$ group or a —$NO_2$ group.

However in the sulfonyloxime compound represented by the general formula (1), any two of $R^1$, $R^2$ and $R^3$ may also be bonded together to form a cyclic structure shown in the formula (2-1), formula (2-2) or formula (2-3) below,

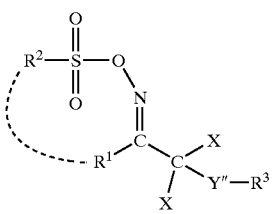
(2-1)

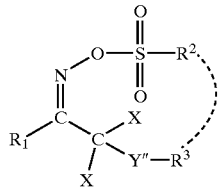
(2-2)

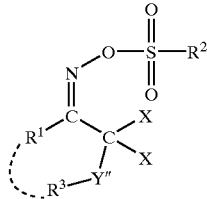
(2-3)

wherein, Y" represents a single bond or a bivalent group formed when the $R^3$ group is removed from the aforementioned Y group.

Furthermore dimers represented by the formula (3-1), formula (3-2) or formula (3-3) shown below, in which one of the groups $R^1$, $R^2$ or Y functions as a linkage group $R^{1'}$, $R^{2'}$ or $Y'$ respectively, are also possible.

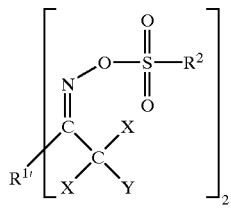
(3-1)

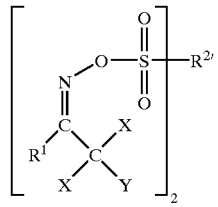
(3-2)

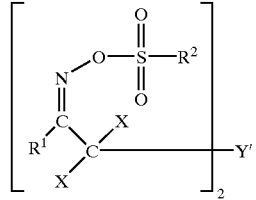
(3-3)

wherein, $R^{1'}$, $R^{2'}$ and $Y'$ each represent a bivalent group formed by bonding together residues generated by dissociating one atom or group from two $R^1$, $R^2$ or Y groups belonging to separate molecules.

Synthesis of a Sulfonyloxime Compound Represented by the General Formula (1)

(i) A compound of the aforementioned general formula (1) can be produced as shown in the equation below.

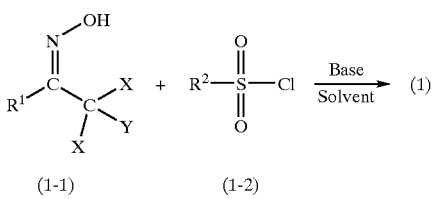

(1-1)  (1-2)

wherein, $R^1$, $R^2$, X and Y are as described above.

In other words, a compound represented by the general formula (1) can be produced from an oxime compound represented by a general formula (1-1) and a sulfonic acid chloride represented by a general formula (1-2), using a conventional sulfonate ester synthetic method. This method is disclosed, for example, in K. Hattori, Y. Matsumura, T. Miyazaki, K. Maruoka and H. Yamamoto, J. Am. Chem. Soc. 1981, 103, 7368. These reactions are normally conducted in an aprotic organic solvent such as toluene, tetrahydrofuran, methylene chloride, pyridine, DMF or DMSO, in the presence of a basic catalyst such as a tertiary amine (triethylamine or the like) or pyridine. The reaction temperature is normally from −35 to +50° C., and preferably from −20 to +25° C.

(ii) The oxime compound represented by the aforementioned general formula (1-1) can be prepared from a ketone compound represented by a general formula (1-3), using a conventional oxime compound synthetic method.

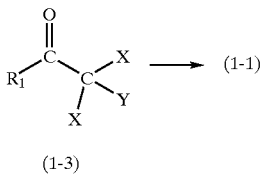

(1-3)

wherein, $R^1$, X and Y are as described above.

This method is disclosed, for example, in J. March, Advanced Organic Chemistry, 4th Edition, Wiley Interscience, 1992, or in S. R. Sandler and W. Karo, Organic functional group preparation, Vol. 3, Academic Press. In this method, the ketone compound and a hydroxylamine hydrochloride are reacted together in a polar solvent such as alcohol. In this case, a basic catalyst such as sodium acetate, potassium hydroxide or sodium ethoxide is added to regulate the pH of the reaction mixture. The reaction temperature is normally from −15 to +80° C., and preferably from 20 to 70° C.

(iii) The ketone compound represented by the general formula (1-3) can be synthesized from an α,α-dihydroketone represented by a general formula (1-4), using a conventional synthetic method.

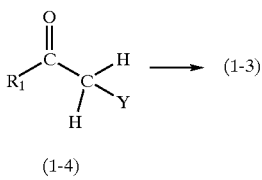

(1-4)

wherein, $R^1$ and Y are as described above.

For example, the ketone compound can be synthesized by halogenation from the α,α-dihydroketone represented by the general formula (1-4). This method is disclosed, for example, in Chemistry of Organic Fluorine Compounds II, ACS; Advanced Organic Chemistry, Part B, PLENUM; and Comprehensive Organic Transformations, VCH. In a representative example, the above ketone and an electrophilic fluorination reagent, bromination reagent or chlorination reagent (examples include N-fluoro-4,6-dimethylpyridinium-2-sulfonate, N-fluoro-4-methylpyridinium-2-sulfonate, N-fluoro-5-(trifluoromethyl)pyridinium-2-sulfonate, phosphorus tribromide, N-bromosuccinimide, thionyl chloride, phosphorus pentachloride, or hypochlorous acid) are reacted together in an organic solvent such as tetrahydrofuran. The reaction temperature is normally from −15 to 90° C., and preferably from 0 to 50° C.

Examples of preferred compounds represented by the general formula (1) include those described below.

0 1. Compounds in which Y Represents a —$R^3$ group:
2,2-difluoro-2-methylacetophenone-O-methylsulfonyloxime, 2,2-dichloro-2-methoxymethyl-2'-methylacetophenone-O-(n-propyl)sulfonyloxime, 2,2-difluoro-2-ethylacetophenone-O-(n-propyl)sulfonyloxime, 2,2-difluoro-2-phenylacetophenone-O-ethylsulfonyloxime, 2-chloro-2-fluoro-2-cyclohexylacetophenone-O-(p-methylphenyl)sulfonyloxime, 2,2-difluoro-2-propylacetophenone-O-camphorsulfonyloxime, 2,2-difluoro-2-methyl-4'-methoxyacetophenone-O-(n-propyl)sulfonyloxime, 2,2-difluoro-2-methylacetonaphthone-O-trifluoromethylsulfonyloxime, 1,1-difluoro-1-phenylacetone-O-(n-butyl)sulfonyloxime, (1,1-difluoro-1-cyclohexyl)methyl-2'-thienylketone-O-methylsulfonyloxime, and (1,1-dichloro-1-phenyl)methyl-2'-furylketone-O-propylsulfonyloxime.

2. Compounds in which Y Represents a —CO—$R^3$ group:
2,2-difluoro-2-methylcarbonylacetophenone-O-methylsulfonyloxime, 2,2-dichloro-2-methoxymethylcarbonyl-2'-methylacetophenone-O-(n-propyl)sulfonyloxime, 2,2-difluoro-2-ethylcarbonylacetophenone-O-(n-propyl)sulfonyloxime, 2,2-difluoro-2-phenylcarbonylacetophenone-O-ethylsulfonyloxime, 2-chloro-2-fluoro-2-cyclohexylcarbonylacetophenone-O-(p-methylphenyl)sulfonyloxime, 2,2-difluoro-2-propylcarbonylacetophenone-O-camphorsulfonyloxime, 2,2-difluoro-2-methylcarbonyl-4'-methoxyacetophenone-O-(n-propyl)sulfonyloxime, 2,2-difluoro-2-methylcarbonylacetonaphthone-O-trifluoromethylsulfonyloxime, 1,1-difluoro-1-phenylcarbonylacetone-O-(n-butyl)sulfonyloxime, (1,1-difluoro-1-cyclohexylcarbonyl)methyl-2'-thienylketone-O-methylsulfonyloxime, and (1,1-dichloro-1-phenylcarbonyl)methyl-2'-furylketone-O-propylsulfonyloxime.

3. Compounds in which Y Represents a —$Co_2R^3$ group:
2,2-difluoro-2-methoxycarbonylacetophenone-O-methylsulfonyloxime, 2,2-difluoro-2-ethoxycarbonylacetophenone-O-(n-propyl)sulfonyloxime, 2,2-difluoro-2-phenoxycarbonylacetophenone-O-ethylsulfonyloxime, 2-chloro-2-fluoro-2-cyclohexyloxycarbonylacetophenone-O-(p-methylphenyl)sulfonyloxime, 2,2-difluoro-2-propoxycarbonylacetophenone-O-camphorsulfonyloxime, 2,2-difluoro-2-methoxycarbonyl-4'-methoxyacetophenone-O-(n-propyl)sulfonyloxime, 2,2-difluoro-2-methoxycarbonylacetonaphthone-O-trifluoromethylsulfonyloxime, 1,1-difluoro-1-phenoxycarbonylacetone-O-(n-butyl)sulfonyloxime, (1,1-dichloro-1-cyclohexyloxycarbonyl)methyl-2'-thienylketone-O-methylsulfonyloxime, and (1,1-difluoro-1-phenoxycarbonyl)methyl-2'-furylketone-O-propylsulfonyloxime.

4. Compounds in which Y Represents a —CONR³R⁴ group:

2,2-difluoro-2-(N,N-dimethylamide)acetophenone-O-methylsulfonyloxime, 2,2-difluoro-2-(N-ethylamide)-2'-methyl-acetophenone-O-(n-propyl)sulfonyloxime, 2,2-difluoro-2-(N-phenylamide)acetophenone-O-ethylsulfonyloxime, 2-chloro-2-fluoro-2-(N-methyl-N-cyclohexylamide)acetophenone-O-(p-methylphenyl)sulfonyloxime, 2,2-difluoro-2-(N-propylamide)acetophenone-O-camphorsulfonyloxime, 2,2-difluoro-2-(N-methyl-N-cyclohexylamide)-4'-methoxyacetophenone-O-(n-propyl)sulfonyloxime, 2,2-difluoro-2-(N,N-dimethylamide)acetonaphthone-O-trifluoromethylsulfonyloxime, 1,1-difluoro-1-(N-phenylamide)acetone-O-(n-butyl)sulfonyloxime, (1,1-difluoro-1-(N-cyclohexylamide))methyl-2'-thienylketone-O-methylsulfonyloxime, and (1,1-dichloro-1-(N-phenylamide))methyl-2'-furylketone-O-propylsulfonyloxime.

5. Compounds in which Y Represents a —SR³ group:

2,2-difluoro-2-thiomethoxyacetophenone-O-methylsulfonyloxime, 2,2-difluoro-2-thioethoxyacetophenone-O-(n-propyl)sulfonyloxime, 2,2-difluoro-2-thiophenoxyacetophenone-O-ethylsulfonyloxime, 2-chloro-2-fluoro-2-thiocyclohexyloxyacetophenone-O-(p-methylphenyl)sulfonyloxime, 2,2-difluoro-2-thiomethoxy-4'-methoxyacetophenone-O-(n-propyl)sulfonyloxime, 2,2-difluoro-2-thiomethoxyacetonaphthone-O-trifluoromethylsulfonyloxime, 1,1-difluoro-1-thiophenoxyacetone-O-(n-butyl)sulfonyloxime, (1,1-difluoro-1-thiocyclohexyloxy)methyl-2'-thienylketone-O-methylsulfonyloxime, and (1,1-dichloro-1-thiophenoxy)methyl-2'-furylketone-O-propylsulfonyloxime.

6. Compounds in which Y Represents a —SOR³ group:

2,2-difluoro-2-methylsulfinylacetophenone-O-methylsulfonyloxime, 2,2-difluoro-2-ethylsulfinylacetophenone-O-(n-propyl)sulfonyloxime, 2,2-difluoro-2-phenylsulfinylacetophenone-O-ethylsulfonyloxime, 2-chloro-2-fluoro-2-cyclohexylsulfinylacetophenone-O-(p-methylphenyl)sulfonyloxime, 2,2-difluoro-2-propylsulfinylacetophenone-O-camphorsulfonyloxime, 2,2-difluoro-2-methylsulfinyl-4'-methoxyacetophenone-O-(n-propyl)sulfonyloxime, 2,2-difluoro-2-methylsulfinylacetonaphthone-O-trifluoromethylsulfonyloxime, 1,1-difluoro-1-phenylsulfinylacetone-O-(n-butyl)sulfonyloxime, (1,1-difluoro-1-cyclohexylsulfinyl)methyl-2'-thienylketone-O-methylsulfonyloxime, and (1,1-dichloro-1-phenylsulfinyl)methyl-2'-furylketone-O-propylsulfonyloxime.

7. Compounds in which Y Represents a —So₂R³ group:

2,2-difluoro-2-phenylsulfonylacetophenone-O-(n-propyl)sulfonyloxime, 2,2-difluoro-2-phenylsulfonylacetophenone-O-(n-hexyl)sulfonyloxime, 2,2-difluoro-2-phenylsulfonylacetophenone-O-(n-pentyl)sulfonyloxime, 2,2-difluoro-2-phenylsulfonylacetophenone-O-methylsulfonyloxime, 2,2-difluoro-2-phenylsulfonylacetophenone-O-ethylsulfonyloxime, 2,2-dichloro-2-phenylsulfonylacetophenone-O-methylsulfonyloxime, 2,2-difluoro-2-phenylsulfonylacetophenone-O-camphorsulfonyloxime, 2,2-difluoro-2-phenylsulfonylacetophenone-O-(p-methylphenyl)sulfonyloxime, 2,2-difluoro-2-phenylsulfonylacetophenone-O-trifluoromethylsulfonyloxime, 2,2-difluoro-2-phenylsulfonyl-4'-methoxyacetophenone-O-(n-propyl)sulfonyloxime, 2,2-difluoro-2-phenylsulfonyl-4'-methoxyacetophenone-O-methylsulfonyloxime, 2,2-difluoro-2-phenylsulfonyl-4'-methoxyacetophenone-O-ethylsulfonyloxime, 2,2-dichloro-2-phenylsulfonyl-4'-methoxyacetophenone-O-methylsulfonyloxime, 2,2-difluoro-2-phenylsulfonyl-4'-methoxyacetophenone-O-camphorsulfonyloxime, 2,2-difluoro-2-phenylsulfonyl-4'-methoxyacetophenone-O-(p-methylphenyl)sulfonyloxime, 2,2-difluoro-2-phenylsulfonyl-4'-methoxyacetophenone-O-trifluoromethylsulfonyloxime, 2,2-difluoro-2-phenylsulfonyl-2'-methylacetophenone-O-(n-propyl)sulfonyloxime, 2,2-difluoro-2-phenylsulfonyl-2'-methylacetophenone-O-methylsulfonyloxime, 2,2-difluoro-2-phenylsulfonyl-2'-methylacetophenone-O-ethylsulfonyloxime, 2,2-dichloro-2-phenylsulfonyl-2'-methylacetophenone-O-methylsulfonyloxime, 2,2-difluoro-2-phenylsulfonyl-2'-methylacetophenone-O-camphorsulfonyloxime, 2,2-difluoro-2-cyclohexylsulfonylacetophenone-O-(n-propyl)sulfonyloxime, 2,2-difluoro-2-cyclohexylsulfonylacetophenone-O-methylsulfonyloxime, 2,2-difluoro-2-cyclohexylsulfonylacetophenone-O-ethylsulfonyloxime, 2,2-dichloro-2-cyclohexylsulfonylacetophenone-O-methylsulfonyloxime, 2,2-difluoro-2-cyclohexylsulfonylacetophenone-O-camphorsulfonyloxime, 2,2-difluoro-2-cyclohexylsulfonylacetophenone-O-trifluoromethylsulfonyloxime, 2,2-difluoro-2-methylsulfonyl-4'-methoxyacetophenone-O-(n-propyl)sulfonyloxime, 2,2-difluoro-2-methylsulfonyl-4'-methoxyacetophenone-O-(n-hexyl)sulfonyloxime, 2,2-difluoro-2-methylsulfonyl-4'-methoxyacetophenone-O-(n-pentyl)sulfonyloxime, 2,2-difluoro-2-methylsulfonyl-4'-methoxyacetophenone-O-methylsulfonyloxime, 2,2-difluoro-2-methylsulfonyl-4'-methoxyacetophenone-O-ethylsulfonyloxime, 2,2-dichloro-2-methylsulfonyl-4'-methoxyacetophenone-O-methylsulfonyloxime, 2,2-difluoro-2-methylsulfonyl-4'-methoxyacetophenone-O-camphorsulfonyloxime, 2,2-difluoro-2-methylsulfonyl-4'-methoxyacetophenone-O-trifluoromethylsulfonyloxime, 2,2-dibromo-2-phenylsulfonylacetophenone-O-camphorsulfonyloxime, 2-chloro-2-fluoro-2-phenylsulfonylacetophenone-O-ethylsulfonyloxime, 2-chloro-2-fluoro-2-phenylsulfonylacetophenone-O-benzylsulfonyloxime, 2,2-difluoro-2-phenylsulfonylacetophenone-O-(1-naphthyl)sulfonyloxime, 2,2-dichloro-2-methylsulfonylacetophenone-O-(p-bromophenyl)sulfonyloxime, 2,2-difluoro-2-phenylsulfonylacetophenone-O-(2-thienyl)sulfonyloxime, 2,2-difluoro-2-cyclohexylsulfonyl-2'-cyanoacetophenone-O-ethylsulfonyloxime, 2,2-difluoro-2-ethylsulfonylacetophenone-O-(n-propyl)sulfonyloxime, 2,2-difluoro-2-propylsulfonylacetophenone-O-camphorsulfonyloxime, 2,2-difluoro-2-methylsulfonylacetonaphthone-O-trifluoromethylsulfonyloxime, 1,1-difluoro-1-phenylacetone-O-(n-butyl)sulfonyloxime, (1,1-difluoro-1-cyclohexyl)methylsulfonyl-2'-thienylketone-O-methylsulfonyloxime, and (1,1-dichloro-1-phenyl)methylsulfonyl-2'-furylketone-O-propylsulfonyloxime.

8. Compounds in which Y Represents a —CN group:

2,2-difluoro-2-cyanoacetophenone-O-methylsulfonyloxime, 2,2-dichloro-2-cyano-2'-methylacetophenone-O-(n-propyl)sulfonyloxime, 2,2-difluoro-2-cyanoacetophenone-O-ethylsulfonyloxime, 2-chloro-2-fluoro-2-cyanoacetophenone-O-(p-methylphenyl)sulfonyloxime, 2,2-difluoro-2-cyanoacetophenone-O-camphorsulfonyloxime, 2,2- difluoro-2-cyano-4'-methoxyacetophenone-O-(n-propyl) sulfonyloxime, 2,2-difluoro-2-cyanoacetonaphthone-O-trifluoromethylsulfonyloxime, 1,1-difluoro-1-cyanoacetone-O-(n-butyl)sulfonyloxime, (1,1-difluoro-1-cyano)methyl-2'-thienylketone-O-methylsulfonyloxime, and (1,1-dichloro-1-cyano)methyl-2'-furylketone-O-propylsulfonyloxime.

9. Compounds in which Y Represents a —NO$_2$ group:
2,2-difluoro-2-nitroacetophenone-O-methylsulfonyloxime, 2,2-dichloro-2-nitro-2'-methylacetophenone-O-(n-propyl)sulfonyloxime, 2,2-difluoro-2-nitroacetophenone-O-ethylsulfonyloxime, 2-chloro-2-fluoro-2-nitroacetophenone-O-(p-methylphenyl) sulfonyloxime, 2,2-difluoro-2-nitroacetophenone-O-camphorsulfonyloxime, 2,2-difluoro-2-nitro-4'-methoxyacetophenone-O-(n-propyl)sulfonyloxime, 2,2-difluoro-2-nitroacetonaphthone-O-trifluoromethylsulfonyloxime, 1,1-difluoro-1-nitroacetone-O-(n-butyl)sulfonyloxime, (1,1-difluoro-1-nitro)methyl-2'-thienylketone-O-methylsulfonyloxime, and (1,1-dichloro-1-nitro)methyl-2'-furylketone-O-propylsulfonyloxime.

10. Compounds with a Cyclic Structure:
2,2-dioxo-5-phenylsulfonyldifluoromethyl-3H,4H-1,2,5-oxathiazine, 2,2-dioxo-4,4-difluoro-5-phenyl-3H-1,2,5-oxathiazine, and 1,1-dioxo-2,2-difluoro-3-propylsulfonyloxyiminothiazine.

11. Dimer Compounds:
2,2-difluoro-1,3-di(phenylsulfonyl)-1,3-propanediol-O-(n-propylsulfonyl)dioxime, 1,1,5,5-tetrafluoro-1,5-di (methylsulfonyl)-2,4-pentanedione-O,O-dimethylsulfonyldioxime, bis(2',2'-difluoro-2'-cyanoacetophenoneoxime)-O-1,4-benzenesulfonic acid, 1,4-bis(1'-(propylsulfonyloxyimino)-2',2'-difluoro-2'-(methylsulfonyl)ethyl)benzene, and 1,1,4,4-tetrafluoro-1,4-di(methylsulfonyl)-2,3-butanedione-O,O-dimethylsulfonyldioxime.

Radiation Sensitive Acid Generator

A radiation sensitive acid generator of (the second aspect of) the present invention comprises a sulfonyloxime compound represented by the aforementioned general formula (1), and may incorporate either one, or a mixture of two or more such sulfonyloxime compounds.

Positive Type Radiation Sensitive Resin Composition

A positive type radiation sensitive resin composition of (the third aspect of) the present invention comprises (A) a radiation sensitive acid generator incorporating a sulfonyloxime compound represented by the general formula (1), and (B) an alkali insoluble or alkali sparingly soluble resin protected with an acid dissociable group, which becomes alkali-soluble on dissociation of the acid dissociable group, as described below.

Negative Type Radiation Sensitive Resin Composition

A positive type radiation sensitive resin composition of (the fourth aspect of) the present invention comprises (A) a radiation sensitive acid generator incorporating a sulfonyloxime compound represented by the general formula (1), (C) an alkali-soluble resin described below, and (D) a compound (cross-linking agent) which is capable of cross-linking with the alkali-soluble resin in the presence of an acid, as described below.

(B) Acid Dissociable Group-containing Resin

The constituent (B) used in the third aspect of the present invention is an alkali insoluble or alkali sparingly soluble resin protected with an acid dissociable group, which becomes alkali-soluble on dissociation of the acid dissociable group (hereafter described as an acid dissociable group-containing resin (B)). This acid dissociable group-containing resin (B) is a resin which comprises at least one type of acidic functional group such as a phenolic hydroxyl group or a carboxyl group, and is an alkali insoluble or alkali sparingly soluble resin formed by substituting the hydrogen atom of an acidic functional group within an alkali-soluble resin comprising a repeating unit represented by one of the formulas from (7-1) to (7-4) described below with at least one type of acid dissociable group which can be dissociated in the presence of acid.

The description "alkali insoluble or alkali sparingly soluble" describes a property wherein under the alkali developing conditions used in forming a resist pattern from a resist film formed using a radiation sensitive resin composition incorporating the acid dissociable group-containing resin (B), an attempt to develop a film incorporating only the acid dissociable group-containing resin (B) instead of the normal resist film results in at least 50% of the initial film thickness remaining at the completion of the developing process.

Examples of the aforementioned acid dissociable group in the acid dissociable group-containing resin (B) include substituted methyl groups, 1-substituted ethyl groups, 1-branched alkyl groups, silyl groups, germyl groups, alkoxycarbonyl groups, acyl groups, and cyclic acid dissociable groups.

Specific examples of substituted methyl groups include methoxymethyl groups, methylthiomethyl groups, ethoxymethyl groups, ethylthiomethyl groups, methoxyethoxymethyl groups, benzyloxymethyl groups, benzylthiomethyl groups, phenacyl groups, bromophenacyl groups, methoxyphenacyl groups, methylthiophenacyl groups, α-methylphenacyl groups, cyclopropylmethyl groups, benzyl groups, diphenylmethyl groups, triphenylmethyl groups, bromobenzyl groups, nitrobenzyl groups, methoxybenzyl groups, methylthiobenzyl groups, ethoxybenzyl groups, ethylthiobenzyl groups, piperonyl groups, methoxycarbonylmethyl groups, ethoxycarbonylmethyl groups, n-propoxycarbonylmethyl groups, i-propoxycarbonylmethyl groups, n-butoxycarbonylmethyl groups, and t-butoxycarbonylmethyl groups.

Furthermore, specific examples of the aforementioned 1-substituted ethyl groups include 1-methoxyethyl groups, 1-methylthioethyl groups, 1,1-dimethoxyethyl groups, 1-ethoxyethyl groups, 1-ethylthioethyl groups, 1,1-diethoxyethyl groups, 1-ethoxypropyl groups, 1-propoxyethyl groups, 1-cyclohexyloxyethyl groups, 1-phenoxyethyl groups, 1-phenylthioethyl groups, 1,1-diphenoxyethyl groups, 1-benzyloxyethyl groups, 1-benzylthioethyl groups, 1-cyclopropylethyl groups, 1-phenylethyl groups, 1,1-diphenylethyl groups, 1-methoxycarbonylethyl groups, 1-ethoxycarbonylethyl groups, 1-n-propoxycarbonylethyl groups, 1-isopropoxycarbonylethyl groups, 1-n-butoxycarbonylethyl groups, and 1-t-butoxycarbonylethyl groups.

Furthermore, specific examples of the aforementioned 1-branched alkyl groups include i-propyl groups, sec-butyl groups, t-butyl groups, 1,1-dimethylpropyl groups, 1-methylbutyl groups, and 1,1-dimethylbutyl groups.

Specific examples of the aforementioned silyl groups include tricarbylsilyl groups such as trimethylsilyl groups, ethyldimethylsilyl groups, methyldiethylsilyl groups, triethylsilyl groups, i-propyldimethylsilyl groups, methyldi-i-propylsilyl groups, tri-i-propylsilyl groups, t-butyldimethylsilyl groups, methyldi-t-butylsilyl groups, tri-t-butylsilyl groups, phenyldimethylsilyl groups, methyldiphenylsilyl groups, and triphenylsilyl groups.

Furthermore, specific examples of the aforementioned germyl groups include tricarbylgermyl groups such as trimethylgermyl groups, ethyldimethylgermyl groups, methyldiethylgermyl groups, triethylgermyl groups, isopropyldimethylgermyl groups, methyldi-i-propylgermyl groups, tri-i-propylgermyl groups, t-butyldimethylgermyl groups, methyldi-t-butylgermyl groups, tri-t-butylgermyl groups, phenyldimethylgermyl groups, methyldiphenylgermyl groups, and triphenylgermyl groups.

Specific examples of the aforementioned alkoxycarbonyl groups include methoxycarbonyl groups, ethoxycarbonyl groups, i-propoxycarbonyl groups, and t-butoxycarbonyl groups.

Furthermore, specific examples of the aforementioned acyl groups include acetyl groups, propionyl groups, butyryl groups, heptanoyl groups, hexanoyl groups, valeryl groups, pivaloyl groups, isovaleryl groups, lauroyl groups, myristoyl groups, palmitoyl groups, stearoyl groups, oxalyl groups, malonyl groups, succinyl groups, glutaryl groups, adipoyl groups, piperoyl groups, suberoyl groups, azelaoyl groups, sebacoyl groups, acryloyl groups, propioloyl groups, methacryloyl groups, crotonoyl groups, oleoyl groups, maleoyl groups, fumaroyl groups, mesaconoyl groups, camphoroyl groups, benzoyl groups, phthaloyl groups, isophthaloyl groups, terephthaloyl groups, naphthoyl groups, toluoyl groups, hydroatropoyl groups, atropoyl groups, cinnamoyl groups, furoyl groups, thenoyl groups, nicotinoyl groups, isonicotinoyl groups, p-toluenesulfonyl groups, and mesyl groups.

In addition, specific examples of the aforementioned cyclic acid dissociable groups include cyclopropyl groups, cyclopentyl groups, cyclohexyl groups, cyclohexenyl groups, 4-methoxycyclohexyl groups, tetrahydropyranyl groups, tetrahydrofuranyl groups, tetrahydrothiopyranyl groups, tetrahydrothiofuranyl groups, 3-bromotetrahydropyranyl groups, 4-methoxytetrahydropyranyl groups, 4-methoxytetrahydrothiopyranyl groups, and 3-tetrahydrothiophene-1,1-dioxide.

Of the acid dissociable groups listed above, t-butyl groups, benzyl groups, 1-methoxyethyl groups, 1-ethoxyethyl groups, trimethylsilyl groups, t-butoxycarbonyl groups, t-butoxycarbonylmethyl groups, tetrahydropyranyl groups, tetrahydrofuranyl groups, tetrahydrothiopyranyl groups and tetrahydrothiofuranyl groups and the like are preferred.

The rate of incorporation of the acid dissociable group within the acid dissociable group-containing resin (B) (the proportion of the number of acid dissociable groups relative to the combined total of the acid dissociable groups and unprotected acidic functional groups within the acid dissociable group-containing resin (B)) will vary depending on the type of acid dissociable group and the type of alkali-soluble resin into which that acid dissociable group is to be incorporated, although the rate of incorporation should preferably be within a range from 10 to 100%, and even more preferably from 15 to 100%.

The acid dissociable group-containing resin can be produced by a variety of methods including introduction of one or more acid dissociable groups into an alkali-soluble resin that has been prepared in advance, (co)polymerization of one or more polymerizable unsaturated monomers with an acid dissociable group, where necessary, with one or more other polymerizable unsaturated monomers, and (co) condensation polymerization of one or more condensation polymerization constituents with an acid dissociable group, where necessary, with one or more other condensation polymerization constituents.

Examples of the aforementioned polymerizable unsaturated monomer with an acid dissociable group include compounds based on the monomers corresponding with the repeating units represented by the formulas (7-1) to (7-3) described below, in which the hydrogen atom of the phenolic hydroxyl group or the carboxyl group within the monomer has been substituted with the acid dissociable group. Furthermore, examples of the aforementioned other polymerizable unsaturated monomers include the same compounds described below as suitable other polymerizable unsaturated monomers in relation to the alkali-soluble resins. In addition, examples of the aforementioned condensation polymerization constituent with an acid dissociable group include compounds based on condensation polymerization constituents corresponding with the repeating unit represented by the formula (7-4) described below, in which the hydrogen atom of the phenolic hydroxyl group has been substituted with the acid dissociable group.

The (co)polymerization of a polymerizable unsaturated monomer with an acid dissociable group during the production of an acid dissociable group-containing resin may utilize a selected polymerization initiator or polymerization catalyst such as a radical polymerization initiator, anionic polymerization catalyst, coordinated anionic polymerization catalyst or a cationic polymerization catalyst, and may be conducted using a selected polymerization method such as bulk polymerization, solution polymerization, precipitation polymerization, emulsion polymerization, suspension polymerization, or bulk suspension polymerization, and the selection of the initiator or catalyst, and the polymerization method should be made in accordance with the type of monomer and the reaction medium. Furthermore, (co) condensation of a condensation polymerization constituent with an acid dissociable group can be performed by conducting a (co)condensation polymerization in the presence of an acid catalyst, in either an aqueous medium or a mixed medium of water and a hydrophilic solvent.

A branched structure may also be introduced into an acid dissociable group-containing resin by using a polyfunctional monomer with two or more polymerizable unsaturated linkages. Examples of this type of polyfunctional monomer include the polyfunctional (meth)acrylates disclosed in Japanese Laid-open publication (kokai) No. 8-316888 (JP8-316888A), and polyfunctional aromatic vinyl compounds such as divinylbenzene and diisopropenylbenzene.

These polyfunctional monomers may be used singularly, or in mixtures of two or more such monomers.

In the case in which, for example, a di(meth)acrylate of 1,1-dimethylethylene glycol is used as the polyfunctional monomer, the acid dissociable branched structure represented by the formula (5) shown below can be introduced into the acid dissociable group-containing resin.

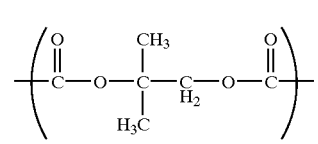

(5)

Furthermore, in those case in which the acid dissociable group-containing resin contains a phenolic hydroxyl group, a branched structure based on an acetal cross-linking group can be introduced into the acid dissociable group-containing resin by reacting the phenolic hydroxyl group with one or more divinyl ether compounds.

Examples of divinyl ether compounds capable of producing this type of branched structure include ethylene glycol divinyl ether, diethylene glycol divinyl ether, and cyclohexane-1,4-dimethanol divinyl ether.

An example of a branched structure based on an acetal cross-linking group is the acid dissociable branched structure represented by the formula (6) below.

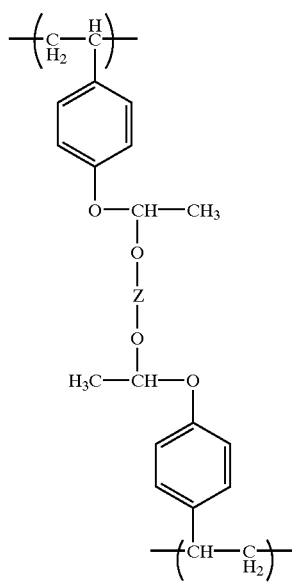

(6)

wherein in the formula (6), Z represents a bivalent organic group.

The rate of incorporation of branched structures based on a polyfunctional monomer and/or an acetal cross-linking group within the acid dissociable group-containing resin will vary depending on the type of branched structure and the type of acid dissociable group-containing resin into which the branched structure is introduced, although the rate of incorporation should preferably be no more than 10 mol % relative to the total number of repeating units.

Examples of particularly preferred acid dissociable group-containing resins of the third aspect of the present invention include resins in which either a portion of, or all of, the hydrogen atoms of the phenolic hydroxyl groups within a poly(p-hydroxystyrene) have been substituted with an aforementioned acid dissociable group, resins in which either a portion of, or all of, the hydrogen atoms of the phenolic hydroxyl groups and/or the hydrogen atoms of the carboxyl groups within a copolymer of p-hydroxystyrene and/or p-hydroxy-α-methylstyrene with (meth)acrylic acid have been substituted with an aforementioned acid dissociable group, and resins based on these resins, such as those resins incorporating the aforementioned type of branched structures.

The polystyrene equivalent weight average molecular weight (hereafter described as Mw) of an acid dissociable group-containing resin, measured using gel permeation chromatography is described below.

In the case of an acid dissociable group-containing resin with no branched structures, Mw is preferably from 1,000 to 150,000, and even more preferably from 3,000 to 100,000.

Furthermore, in the case of an acid dissociable group-containing resin with branched structures, Mw is preferably from 5,000 to 500,000, and even more preferably from 8,000 to 300,000.

The acid dissociable group-containing resin can be used singularly, or in mixtures of two or more such resins.

(C) Alkali-soluble Resin

The alkali-soluble resin used as the constituent (C) in the fourth aspect of the present invention (hereafter described as an alkali-soluble resin (C)) is a resin which contains at least one functional group which displays affinity for an alkali developing solution, such as an acidic functional group such as a phenolic hydroxyl group or a carboxyl group, and is consequently soluble in the alkali developing solution.

Examples of the alkali-soluble resin (C) include addition polymerization type resins with at least one type of repeating unit represented by one of the formulas (7-1) to (7-3) shown below, and condensation polymerization type resins with at least one type of repeating unit represented by the formula (7-4) shown below.

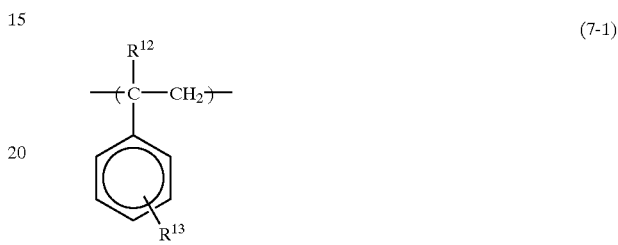

(7-1)

wherein in the formula (7-1), $R^{12}$ represents a hydrogen atom or a methyl group, $R^{13}$ represents an —OH, —COOH, —$R^{14}$COOH, —O$R^{14}$OOH, or —OCOR$^{14}$COOH group wherein $R^{14}$ represents —(CH$_2$)$_g$— where g is an integer of 1 to 4.

(7-2)

wherein in the formula (7-2), $R^{15}$ represents a hydrogen atom or a methyl group.

(7-3)

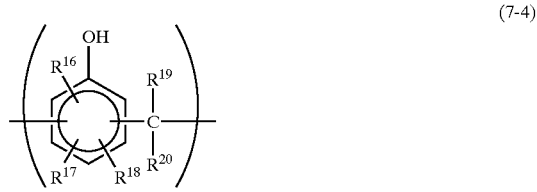

(7-4)

wherein in the formula (7-4), $R^{16}$, $R^{17}$, $R^{18}$, $R^{19}$ and $R^{20}$ each represent independently a hydrogen atom or an alkyl group of 1 to 4 carbon atoms.

In the case in which the alkali-soluble resin (C) is an addition polymerization type resin, the resin may comprise only repeating units represented by any of the aforementioned formulas (7-1) to (7-3), or may also comprise other additional repeating units, providing the generated resin remains soluble in the alkali developing solution.

Examples of these other repeating units include those units generated when the polymerizable double bond of a monomer with such a polymerizable double bond, such as styrene, α-methylstyrene, maleic anhydride, (meth) acrylonitrile, crontononitrile, maleonitrile, fumaronitrile, mesacononitrile, citracononitrile, itacononitrile, (meth) acrylamide, crotonamide, maleiamide, fumaramide, mesaconamide, citraconamide, itaconamide, vinylaniline, vinylpyridine, vinyl-ε-caprolactam, vinylpyrolidone or vinylimidazole participates in an addition polymerization.

An addition polymerization type resin can be produced by (co)polymerizing at least one of the monomers corresponding with each of the repeating units represented by the formulas (7-1) to (7-3), together with a monomer corresponding with one or more of the other repeating units described above where required.

This (co)polymerization may utilize a selected polymerization initiator or polymerization catalyst such as a radical polymerization initiator, anionic polymerization catalyst, coordinated anionic polymerization catalyst or a cationic polymerization catalyst, and may be conducted using a selected conventional polymerization method such as bulk polymerization, solution polymerization, precipitation polymerization, emulsion polymerization, suspension polymerization, or bulk suspension polymerization, and the selection of the initiator or catalyst, and the polymerization method should be made in accordance with the type of monomer and the reaction medium.

Furthermore, in the case in which the alkali-soluble resin (C) is a condensation polymerization type resin, the resin may comprise only repeating units represented by the aforementioned formula (7-4), or may also comprise other additional repeating units, providing the generated resin remains soluble in the alkali developing solution.

This type of condensation polymerization type resin can be produced by the (co)condensation polymerization of one or more phenols corresponding with the repeating unit represented by the formula (7-4) and one or more aldehydes, together with another condensation polymerization constituent for forming other repeating units where required, in the presence of an acid catalyst, and in either an aqueous medium or a mixed medium of water and a hydrophilic solvent.

Suitable examples of the phenol include o-cresol, m-cresol, p-cresol, 2,3-xylenol, 2,4-xylenol, 2,5-xylenol, 3,4-xylenol, 3,5-xylenol, 2,3,5-trimethylphenol, and 3,4,5-trimethylphenol, and suitable examples of the aforementioned aldehyde include formaldehyde, trioxane, paraformaldehyde, benzaldehyde, acetoaldehyde, propylaldehyde, and phenylacetoaldehyde.

The rate of incorporation of the repeating units represented by the formulas (7-1) to (7-4) within the alkali-soluble resin (C) will vary depending on the type of the other repeating units introduced into the resin, although the rate of incorporation should preferably be within a range from 10 to 100 mol %, and even more preferably from 20 to 100 mol %.

The Mw of the alkali-soluble resin (C) will vary depending on the desired characteristics of the radiation sensitive resin composition, although should preferably be within a range from 1,000 to 150,000, and even more preferably from 3,000 to 100,000.

Furthermore, the ratio Mw/Mn for the alkali-soluble resin (C) is typically from 1 to 10, and preferably from 1 to 5.

In those cases in which the alkali-soluble resin (C) contains repeating units incorporating carbon-carbon unsaturated bonds, such as those represented by the formulas (7-1) and (7-4), the hydrogenated form of the resin may also be used. The hydrogenation ratio in such a case should typically be no more than 70%, and preferably no more than 50%, and even more preferably no more than 40% of the carbon-carbon unsaturated bonds contained within the repeating units represented by the formulas (7-1) or (7-4). If the hydrogenation ratio exceeds 70% then there is a danger of a deterioration in the developing characteristics displayed by the alkali-soluble resin (C) in the developing solution.

Examples of particularly preferred alkali-soluble resins (C) include resins incorporating poly(hydroxystyrene), copolymers of hydroxystyrene and hydroxy-α-methylstyrene, or copolymers of hydroxystyrene and styrene as a main constituent.

The alkali-soluble resin (C) can be used singularly, or in mixtures of two or more such resins.

Cross-linking Agent

A constituent (D) used in the fourth aspect of the present invention is a compound (hereafter described as a cross-linking agent (D)) which is capable of cross-linking with the alkali-soluble resin (C) in the presence of an acid, such as the acid generated during exposure. Examples of the cross-linking agent (D) include compounds with one or more substituent groups (hereafter described as cross-linking substituents) capable of undergoing a cross-linking reaction with the alkali-soluble resin (C).

Suitable examples of the cross-linking substituents within the cross-linking agent (D) include the groups represented by the formulas (8-1) to (8-5) shown below.

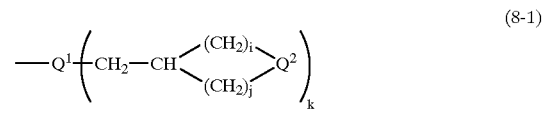
(8-1)

wherein in the formula (8-1), k represents 1 or 2, $Q^1$ represents a single bond, —O—, —S—, —COO— or —NH— when k=1, or a trivalent nitrogen atom when k=2, $Q^2$ represents either —O— or —S—, i represents an integer of 0 to 3, j represents an integer of 1 to 3, and i+j=1 to 4.

(8-2)

wherein in the formula (8-2), $Q^3$ represents —O—, —COO— or —CO—, $R^{21}$ and $R^{22}$ each represent independently a hydrogen atom or an alkyl group of 1 to 4 carbon atoms, $R^{23}$ represents an alkyl group of 1 to 5 carbon atoms, an aryl group of 6 to 12 carbon atoms or an aralkyl group of 7 to 14 carbon atoms, and y represents an integer of 1 or greater.

(8-3)

wherein in the formula (8-3), $R^{24}$, $R^{25}$ and $R^{26}$ each represent independently a hydrogen atom or an alkyl group of 1 to 4 carbon atoms.

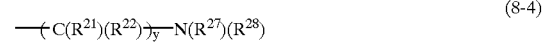
(8-4)

wherein in the formula (8-4), $R^{21}$ and $R^{22}$ represent the same meaning as in the formula (8-2), $R^{27}$ and $R^{28}$ each represent independently an alkyloyl group of 1 to 5 carbon atoms, and y represents an integer of 1 or greater.

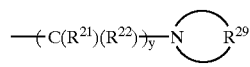

(8-5)

wherein in the formula (8-5), $R^{21}$ and $R^{22}$ represent the same meaning as in the formula (8-2), $R^{29}$ represents a bivalent organic group in the form of a 3 to 8 membered cyclic structure containing an oxygen atom, a sulfur atom or a nitrogen atom as a hetero atom, and y represents an integer of 1 or greater.

Specific examples of this type of cross-linking substituent include glycidyloxy groups, glycidyloxycarbonyl groups, glycidylamino groups, methoxymethyl groups, ethoxymethyl groups, benzyloxymethyl groups, dimethylaminomethyl groups, diethylaminomethyl groups, dimethylolaminomethyl groups, diethylolaminomethyl groups, morpholinomethyl groups, acetoxymethyl groups, benzoyloxymethyl groups, formyl groups, acetyl groups, vinyl groups, and isopropenyl groups.

Examples of the cross-linking agent (D) include bisphenol A type epoxy compounds, bisphenol F type epoxy compounds, bisphenol S type epoxy compounds, novolak resin type epoxy compounds, resol resin type epoxy compounds, poly(hydroxystyrene) based epoxy compounds, methylol group-containing melamine compounds, methylol group-containing benzoguanamine compounds, methylol group-containing urea compounds, methylol group-containing phenol compounds, alkoxyalkyl group-containing melamine compounds, alkoxyalkyl group-containing benzoguanamine compounds, alkoxyalkyl group-containing urea compounds, alkoxyalkyl group-containing phenol compounds, carboxymethyl group-containing melamine resins, carboxymethyl group-containing benzoguanamine resins, carboxymethyl group-containing urea resins, carboxymethyl group-containing phenol resins, carboxymethyl group-containing melamine compounds, carboxymethyl group-containing benzoguanamine compounds, carboxymethyl group-containing urea compounds, or carboxymethyl group-containing phenol resins, which contain an aforementioned cross-linking substituent.

Of these cross-linking agents (D), methylol group-containing phenol compounds, methoxymethyl group-containing melamine compounds, methoxymethyl group-containing phenol compounds, methoxymethyl group-containing glycoluril compounds, methoxymethyl group-containing urea compounds, and acetoxymethyl group-containing phenol compounds are preferred, and methoxymethyl group-containing melamine compounds (for example, hexamethoxymethylmelamine), methoxymethyl group-containing glycoluril compounds, and methoxymethyl group-containing urea compounds are even more desirable. Examples of commercially available materials include methoxymethyl group-containing melamine compounds marketed under brand names such as CYMEL300, CYMEL301, CYMEL303 and CYMEL305 (manufactured by Mitsui Cyanamid (Ltd.)), methoxymethyl group-containing glycoluril compounds marketed under the brand name CYMEL1174 (manufactured by Mitsui Cyanamid (Ltd.)), and methoxymethyl group-containing urea compounds marketed under the brand name MX290 (manufactured by Sanwa Chemical (Ltd.)).

An aforementioned cross-linking substituent may also be introduced into the acidic functional group of the alkali-soluble resin (C), to produce a compound with the functions of the cross-linking agent (D). In such a case, the rate of incorporation of the cross-linking functional group will vary depending on the type of the cross-linking functional group and the type of alkali-soluble resin (C) into which the cross-linking functional group is to be introduced, although the rate of incorporation should typically be 5 to 60 mol %, and preferably 10 to 50 mol %, and even more preferably 15 to 40 mol %, relative to the total number acidic functional groups within the alkali-soluble resin (C). If the rate of incorporation of the cross-linking functional group is less than 5 mol %, then there is a tendency for the yield of residual film thickness to decrease, for shape to stretch into a zigzag line, and for swelling of the pattern to become more prevalent, whereas at values exceeding 60 mol %, the developability tends to deteriorate.

Examples of particularly preferred cross-linking agents (D) of the fourth aspect of the present invention include methoxymethyl group-containing glycoluril compounds and methoxymethyl group-containing urea compounds, and specific examples include tetramethoxymethylglycoluril and dimethoxymethylurea and the like.

The cross-linking agent (D) of the fourth aspect of the present invention can be used singularly, or in mixtures of two or more such resins.

The relative proportions of each of the constituents in a positive type radiation sensitive resin composition of the third aspect of the present invention, and the relative proportions of each of the constituents in a negative type radiation sensitive resin composition of the fourth aspect of the present invention will vary depending on the characteristics required of the resist, although typical proportions are as follows.

In a resin of the third aspect of the present invention, the amount of the acid generator (A) is typically from 0.001 to 70 parts by weight, and preferably from 0.01 to 50 parts by weight, and even more preferably from 0.1 to 20 parts by weight, per 100 parts by weight of the acid dissociable group-containing resin (B). If the amount of the acid generator (A) is less than 0.001 parts by weight then the sensitivity and the resolution tend to fall, whereas at amounts exceeding 70 parts by weight, there is a tendency for the resist layer to become more difficult to apply and pattern.

In a resin of the fourth aspect of the present invention, the amount of the acid generator (A) is typically from 0.001 to 70 parts by weight, and preferably from 0.01 to 50 parts by weight, and even more preferably from 0.1 to 20 parts by weight, per 100 parts by weight of the alkali-soluble resin (C). If the amount of the acid generator (A) is less than 0.001 parts by weight then the sensitivity and the resolution tend to fall, whereas at amounts exceeding 70 parts by weight, there is a tendency for the resist layer to become more difficult to apply and pattern.

Furthermore, the amount of the cross-linking agent (D) is typically from 5 to 95 parts by weight, and preferably from 15 to 85 parts by weight, and even more preferably from 20 to 75 parts by weight, per 100 parts by weight of the alkali-soluble resin (C). If the amount of the cross-linking agent (D) is less than 5 parts by weight, then there is a tendency for the yield of residual film thickness to decrease, for shape to stretch into a zigzag line, and for swelling of the pattern to become more prevalent, whereas at values exceeding 95 parts by weight, the developability tends to deteriorate.

In a positive type radiation sensitive resin composition according to the third aspect of the present invention or a negative type radiation sensitive resin composition according to the fourth aspect of the present invention, other additives such as radiation sensitive acid generators other than the acid generator (A) (hereafter described as other acid generators), acid diffusion control agents, surface active agents, and sensitizers may also be added as required. Furthermore, an alkali-soluble resin (C) and/or a low molecular weight alkali solubility control agent with an acid dissociable protective group may also be incorporated in a positive type radiation sensitive resin composition of the third aspect of the present invention, and an acid dissociable group-containing resin (B) may also be incorporated within a negative type radiation sensitive resin composition of the fourth aspect of the present invention.

Other Acid Generators

Examples of the aforementioned other acid generators include sulfonimide compounds, onium salt compounds, sulfone compounds, sulfonate ester compounds, disulfonyldiazomethane compounds, disulfonylmethane compounds, oxime sulfonate compounds, and hydrazine sulfonate compounds.

Specific examples of each of these types of other acid generator are presented below.

Sulfonimide Compounds

Examples of suitable sulfonimide compounds include N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptane-5,6-oxy-2,3-dicarboxyimide, and N-(10-camphorsulfonyloxy)naphthylimide, N-(n-octanesulfonyloxy)succinimide, N-(n-octanesulfonyloxy)phthalimide, N-(n-octanesulfonyloxy)diphenylmaleimide, N-(n-octanesulfonyloxy)bicyclo[2.2.1]hept-5-ene-2,3-dicarboxyimide, N-(n-octanesulfonyloxy)-7-oxabicyclo[2.2.1]hept-5-ene-2,3-dicarboxyimide, N-(n-octanesulfonyloxy)bicyclo[2.2.1]heptane-5,6-oxy-2,3-dicarboxyimide, and N-(n-octanesulfonyloxy)naphthylimide, N-(p-toluenesulfonyloxy)succinimide, N-(p-toluenesulfonyloxy)phthalimide, N-(p-toluenesulfonyloxy)diphenylmaleimide, N-(p-toluenesulfonyloxy)bicyclo[2.2.1]hept-5-ene-2,3-dicarboxyimide, N-(p-toluenesulfonyloxy)-7-oxabicyclo[2.2.1]hept-5-ene-2,3-dicarboxyimide, N-(p-toluenesulfonyloxy)bicyclo[2.2.1]heptane-5,6-oxy-2,3-dicarboxyimide, and N-(p-toluenesulfonyloxy)naphthylimide, N-(2-trifluoromethylbenzenesulfonyloxy)succinimide, N-(2-trifluoromethylbenzenesulfonyloxy)phthalimide, N-(2-trifluoromethylbenzenesulfonyloxy)diphenylmaleimide, N-(2-trifluoromethylbenzenesulfonyloxy)bicyclo[2.2.1]hept-5-ene-2,3-dicarboxyimide, N-(2-trifluoromethylbenzenesulfonyloxy)-7-oxabicyclo[2.2.1]hept-5-ene-2,3-dicarboxyimide, N-(2-trifluoromethylbenzenesulfonyloxy)bicyclo [2.2.1]heptane-5,6-oxy-2,3-dicarboxyimide, and N-(2-trifluoromethylbenzenesulfonyloxy)naphthylimide, N-(4-trifluoromethylbenzenesulfonyloxy)succinimide, N-(4-trifluoromethylbenzenesulfonyloxy)phthalimide, N-(4-trifluoromethylbenzenesulfonyloxy)diphenylmaleimide, N-(4-trifluoromethylbenzenesulfonyloxy)bicyclo[2.2.1]hept-5-ene-2,3-dicarboxyimide, N-(4-trifluoromethylbenzenesulfonyloxy)-7-oxabicyclo[2.2.1]hept-5-ene-2,3-dicarboxyimide, N-(4-trifluoromethylbenzenesulfonyloxy)bicyclo [2.2.1]heptane-5,6-oxy-2,3-dicarboxyimide, and N-(4-trifluoromethylbenzenesulfonyloxy)naphthylimide, N-(perfluorobenzenesulfonyloxy)succinimide, N-(perfluorobenzenesulfonyloxy)phthalimide, N-(perfluorobenzenesulfonyloxy)diphenylmaleimide, N-(perfluorobenzenesulfonyloxy)bicyclo[2.2.1]hept-5-ene-2,3-dicarboxyimide, N-(perfluorobenzenesulfonyloxy)-7-oxabicyclo[2.2.1]hept-5-ene-2,3-dicarboxyimide, N-(perfluorobenzenesulfonyloxy)bicyclo[2.2.1]heptane-5,6-oxy-2,3-dicarboxyimide, and N-(perfluorobenzenesulfonyloxy)naphthylimide, N-(naphthalenesulfonyloxy)succinimide, N-(naphthalenesulfonyloxy)phthalimide, N-(naphthalenesulfonyloxy)diphenylmaleimide, N-(naphthalenesulfonyloxy)bicyclo[2.2.1]hept-5-ene-2,3-dicarboxyimide, N-(naphthalenesulfonyloxy)-7-oxabicyclo[2.2.1]hept-5-ene-2,3-dicarboxyimide, N-(naphthalenesulfonyloxy)bicyclo[2.2.1]heptane-5,6-oxy-2,3-dicarboxyimide, N-(naphthalenesulfonyloxy)naphthylimide, N-[(5-methyl-5-methoxycarbonylbicyclo[2.2.1]heptan-2-yl)sulfonyloxy]succinimide, and N-[(5-methyl-5-methoxycarbonylbicyclo[2.2.1]heptan-2-yl)sulfonyloxy]bicyclo[2.2.1]hept-5-ene-2,3-dicarboxyimide, N-(benzenesulfonyloxy)succinimide, N-(benzenesulfonyloxy)phthalimide, N-(benzenesulfonyloxy)diphenylmaleimide, N-(benzenesulfonyloxy)bicyclo[2.2.1]hept-5-ene-2,3-dicarboxyimide, N-(benzenesulfonyloxy)-7-oxabicyclo[2.2.1]hept-5-ene-2,3-dicarboxyimide, N-(benzenesulfonyloxy)bicyclo [2.2.1]heptane-5,6-oxy-2,3-dicarboxyimide, and N-(benzenesulfonyloxy)naphthylimide.

Onium Salt Compounds:

Onium salt compounds include, for example, iodonium salts, sulfonium salts, phosphonium salts, diazonium salts, ammonium salts, and pyridinum salts.

Specific examples of suitable onium salt compounds include bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, bis(4-t-butylphenyl)iodonium 2-trifluoromethylbenzenesulfonate, bis(4-t-butylphenyl)iodonium 4-trifluoromethylbenzenesulfonate, and bis(4-t-butylphenyl)iodonium perfluorobenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, diphenyliodonium 2-trifluoromethylbenzenesulfonate, diphenyliodonium 4-trifluoromethylbenzenesulfonate, and diphenyliodonium perfluorobenzenesulfonate, di(p-toluyl)iodonium pyrenesulfonate, di(p-toluyl)iodonium n-dodecylbenzenesulfonate, di(p-toluyl)iodonium p-toluenesulfonate, di(p-toluyl)iodonium benzenesulfonate, di(p-toluyl)iodonium 10-camphorsulfonate, di(p-toluyl)iodonium n-octanesulfonate, di(p-toluyl)iodonium 2-trifluoromethylbenzenesulfonate, di(p-toluyl)iodonium 4-trifluoromethylbenzenesulfonate, and di(p-toluyl)iodonium perfluorobenzenesulfonate, di(3,4-dimethylphenyl)iodonium pyrenesulfonate, di(3,4-dimethylphenyl)iodonium n-dodecylbenzenesulfonate, di(3,4-dimethylphenyl)iodonium p-toluenesulfonate, di(3,4-dimethylphenyl)iodonium benzenesulfonate, di(3,4-dimethylphenyl)iodonium 10-camphorsulfonate, di(3,4-dimethylphenyl)iodonium n-octanesulfonate, di(3,4-dimethylphenyl)iodonium 2-trifluoromethylbenzenesulfonate, di(3,4-dimethylphenyl)iodonium 4-trifluoromethylbenzenesulfonate, and di(3,4-dimethylphenyl)iodonium perfluorobenzenesulfonate, 4-nitrophenyl.phenyliodonium pyrenesulfonate, 4-nitrophenyl.phenyliodonium n-dodecylbenzenesulfonate, 4-nitrophenyl.phenyliodonium p-toluenesulfonate, 4-nitrophenyl.phenyliodonium benzenesulfonate, 4-nitrophenyl.phenyliodonium 10-camphorsulfonate, 4-nitrophenyl.phenyliodonium n-octanesulfonate, 4-nitrophenyl.phenyliodonium 2-trifluoromethylbenzenesulfonate, 4-nitrophenyl.phenyliodonium 4-trifluoromethylbenzenesulfonate, and 4-nitrophenyl.phenyliodonium perfluorobenzenesulfonate, di(3-nitrophenyl)iodonium pyrenesulfonate, di(3-nitrophenyl)iodonium n-dodecylbenzenesulfonate, di(3-nitrophenyl)iodonium p-toluenesulfonate, di(3-nitrophenyl)iodonium benzenesulfonate, di(3-nitrophenyl)iodonium 10-camphorsulfonate, di(3-nitrophenyl)iodonium n-octanesulfonate, di(3-nitrophenyl)iodonium 2-trifluoromethylbenzenesulfonate, di(3-nitrophenyl)iodonium 4-trifluoromethylbenzenesulfonate, and di(3-nitrophenyl)iodonium perfluorobenzenesulfonate, 4-methoxyphenyl.phenyliodonium pyrenesulfonate, 4-methoxyphenyl.phenyliodonium n-dodecylbenzenesulfonate, 4-methoxyphenyl.phenyliodonium p-toluenesulfonate, 4-methoxyphenyl.phenyliodonium benzenesulfonate, 4-methoxyphenyl.phenyliodonium 10-camphorsulfonate, 4-methoxyphenyl.phenyliodonium n-octanesulfonate, 4-methoxyphenyl.phenyliodonium 2-trifluoromethylbenzenesulfonate, 4-methoxyphenyl.phenyliodonium 4-trifluoromethylbenzenesulfonate, and 4-methoxyphenyl.phenyliodonium perfluorobenzenesulfonate, di(4-chlorophenyl)iodonium pyrenesulfonate, di(4-chlorophenyl)iodonium n-dodecylbenzenesulfonate, di(4-chlorophenyl)iodonium p-toluenesulfonate, di(4-chlorophenyl)iodonium benzenesulfonate, di(4-chlorophenyl)iodonium 10-camphorsulfonate, di(4-chlorophenyl)iodonium n-octanesulfonate, di(4-chlorophenyl)iodonium 2-trifluoromethylbenzenesulfonate, di(4-chlorophenyl)iodonium 4-trifluoromethylbenzenesulfonate, and di(4-chlorophenyl)iodonium perfluorobenzenesulfonate, di(4-trifluoromethylphenyl)iodonium pyrenesulfonate, di(4-trifluoromethylphenyl)iodonium n-dodecylbenzenesulfonate, di(4-trifluoromethylphenyl)iodonium p-toluenesulfonate, di(4-trifluoromethylphenyl)iodonium benzenesulfonate, di(4-trifluoromethylphenyl)iodonium 10-camphorsulfonate, di(4-trifluoromethylphenyl)iodonium n-octanesulfonate, di(4-trifluoromethylphenyl)iodonium 2-trifluoromethylbenzenesulfonate, di(4-trifluoromethylphenyl)iodonium 4-trifluoromethylbenzenesulfonate, and di(4-trifluoromethylphenyl)iodonium perfluorobenzenesulfonate, dinaphthyliodonium trifluoromethanesulfonate, dinaphthyliodonium nonafluoro-n-butanesulfonate, dinaphthyliodonium perfluoro-n-octanesulfonate, dinaphthyliodonium pyrenesulfonate, dinaphthyliodonium n-dodecylbenzenesulfonate, dinaphthyliodonium p-toluenesulfonate, dinaphthyliodonium benzenesulfonate, dinaphthyliodonium 10-camphorsulfonate, dinaphthyliodonium n-octanesulfonate, dinaphthyliodonium 2-trifluoromethylbenzenesulfonate, dinaphthyliodonium 4-trifluoromethylbenzenesulfonate, and dinaphthyliodonium perfluorobenzenesulfonate, biphenyleneiodonium pyrenesulfonate, biphenyleneiodonium n-dodecylbenzenesulfonate, biphenyleneiodonium p-toluenesulfonate, biphenyleneiodonium benzenesulfonate, biphenyleneiodonium 10-camphorsulfonate, biphenyleneiodonium n-octanesulfonate, biphenyleneiodonium 2-trifluoromethylbenzenesulfonate, biphenyleneiodonium 4-trifluoromethylbenzenesulfonate, and biphenyleneiodonium perfluorobenzenesulfonate, 2-chlorobiphenyleneiodonium pyrenesulfonate, 2-chlorobiphenyleneiodonium n-dodecylbenzenesulfonate, 2-chlorobiphenyleneiodonium p-toluenesulfonate, 2-chlorobiphenyleneiodonium benzenesulfonate, 2-chlorobiphenyleneiodonium 10-camphorsulfonate, 2-chlorobiphenyleneiodonium n-octanesulfonate, 2-chlorobiphenyleneiodonium 2-trifluoromethylbenzenesulfonate, 2-chlorobiphenyleneiodonium 4-trifluoromethylbenzenesulfonate, and 2-chlorobiphenyleneiodonium perfluorobenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, triphenylsulfonium 2-trifluoromethylbenzenesulfonate, triphenylsulfonium 4-trifluoromethylbenzenesulfonate, triphenylsulfonium hexafluoroantimonate, triphenylsulfonium naphthalenesulfonate, and triphenylsulfonium perfluorobenzenesulfonate, 4-t-butylphenyl.diphenylsulfonium pyrenesulfonate, 4-t-butylphenyl.diphenylsulfonium n-dodecylbenzenesulfonate, 4-t-butylphenyl.diphenylsulfonium p-toluenesulfonate, 4-t-butylphenyl.diphenylsulfonium benzenesulfonate, 4-t-butylphenyl.diphenylsulfonium 10-camphorsulfonate, 4-t-butylphenyl.diphenylsulfonium n-octanesulfonate, 4-t-butylphenyl.diphenylsulfonium 2-trifluoromethylbenzenesulfonate, 4-t-butylphenyl.diphenylsulfonium 4-trifluoromethylbenzenesulfonate, and 4-t-butylphenyl.diphenylsulfonium perfluorobenzenesulfonate, 4-t-butoxyphenyl.diphenylsulfonium pyrenesulfonate, 4-t-butoxyphenyl.diphenylsulfonium n-dodecylbenzenesulfonate, 4-t-butoxyphenyl.diphenylsulfonium p-toluenesulfonate, 4-t-butoxyphenyl.diphenylsulfonium benzenesulfonate, 4-t-butoxyphenyl.diphenylsulfonium 10-camphorsulfonate, 4-t-butoxyphenyl.diphenylsulfonium n-octanesulfonate, 4-t-butoxyphenyl.diphenylsulfonium 2-trifluoromethylbenzenesulfonate, 4-t-butoxyphenyl.diphenylsulfonium 4-trifluoromethylbenzenesulfonate, and 4-t-butoxyphenyl.diphenylsulfonium perfluorobenzenesulfonate, 4-hydroxyphenyl.diphenylsulfonium pyrenesulfonate, 4-hydroxyphenyl.diphenylsulfonium n-dodecylbenzenesulfonate, 4-hydroxyphenyl.diphenylsulfonium p-toluenesulfonate, 4-hydroxyphenyl.diphenylsulfonium benzenesulfonate, 4-hydroxyphenyl.diphenylsulfonium 10-camphorsulfonate, 4-hydroxyphenyl.diphenylsulfonium n-octanesulfonate, 4-hydroxyphenyl.diphenylsulfonium 2-trifluoromethylbenzenesulfonate, 4-hydroxyphenyl.diphenylsulfonium 4-trifluoromethylbenzenesulfonate, and 4-hydroxyphenyl.diphenylsulfonium perfluorobenzenesulfonate, tri(4-methoxyphenyl)sulfonium pyrenesulfonate, tri(4-methoxyphenyl)sulfonium n-dodecylbenzenesulfonate, tri(4-methoxyphenyl)sulfonium p-toluenesulfonate, tri(4-methoxyphenyl)sulfonium benzenesulfonate, tri(4-methoxyphenyl)sulfonium 10-camphorsulfonate, tri(4-methoxyphenyl)sulfonium n-octanesulfonate, tri(4-methoxyphenyl)sulfonium 2-trifluoromethylbenzenesulfonate, tri(4-methoxyphenyl)sulfonium 4-trifluoromethylbenzenesulfonate, and tri(4-methoxyphenyl)sulfonium perfluorobenzenesulfonate, di(4-methoxyphenyl).p-toluylsulfonium pyrenesulfonate, di(4-methoxyphenyl).p-toluylsulfonium n-dodecylbenzenesulfonate, di(4-methoxyphenyl).p-toluylsulfonium p-toluenesulfonate, di(4-methoxyphenyl).p-toluylsulfonium benzenesulfonate, di(4-methoxyphenyl).p-toluylsulfonium 10-camphorsulfonate, di(4-methoxyphenyl).p-toluylsulfonium n-octanesulfonate, di(4-methoxyphenyl).p-tolylsulfonium 2-trifluoromethylbenzenesulfonate, di(4-methoxyphenyl).p-tolylsulfonium 4-trifluoromethylbenzenesulfonate, and di(4-methoxyphenyl).p-toluylsulfonium perfluorobenzenesulfonate, phenyl.tetramethylenesulfonium pyrenesulfonate, phenyl.tetramethylenesulfonium n-dodecylbenzenesulfonate, phenyl.tetramethylenesulfonium p-toluenesulfonate, phenyl.tetramethylenesulfonium benzenesulfonate, phenyl.tetramethylenesulfonium 10-camphorsulfonate, phenyl.tetramethylenesulfonium n-octanesulfonate, phenyl.tetramethylenesulfonium 2-trifluoromethylbenzenesulfonate, phenyl.tetramethylenesulfonium 4-trifluoromethylbenzenesulfonate, and phenyl.tetramethylenesulfonium perfluorobenzenesulfonate, 4-hydroxyphenyl.tetramethylenesulfonium pyrenesulfonate, 4-hydroxyphenyl.tetramethylenesulfonium n-dodecylbenzenesulfonate, 4-hydroxyphenyl.tetramethylenesulfonium p-toluenesulfonate, 4-hydroxyphenyl.tetramethylenesulfonium benzenesulfonate, 4-hydroxyphenyl.tetramethylenesulfonium 10-camphorsulfonate, 4-hydroxyphenyl.tetramethylenesulfonium n-octanesulfonate, 4-hydroxyphenyl.tetramethylenesulfonium 2-trifluoromethylbenzenesulfonate, 4-hydroxyphenyl.tetramethylenesulfonium 4-trifluoromethylbenzenesulfonate, and 4-hydroxyphenyl.tetramethylenesulfonium perfluorobenzenesulfonate, phenyl.biphenylenesulfonium pyrenesulfonate, phenyl.biphenylenesulfonium n-dodecylbenzenesulfonate, phenyl.biphenylenesulfonium p-toluenesulfonate, phenyl.biphenylenesulfonium benzenesulfonate, phenyl.biphenylenesulfonium 10-camphorsulfonate, phenyl.biphenylenesulfonium n-octanesulfonate, phenyl.biphenylenesulfonium 2-trifluoromethylbenzenesulfonate, phenyl.biphenylenesulfonium 4-trifluoromethylbenzenesulfonate, and phenyl.biphenylenesulfonium perfluorobenzenesulfonate, (4-phenylthiophenyl)-diphenylsulfonium pyrenesulfonate, (4-phenylthiophenyl).diphenylsulfonium n-dodecylbenzenesulfonate, (4-phenylthiophenyl).diphenylsulfonium p-toluenesulfonate, (4-phenylthiophenyl).diphenylsulfonium benzenesulfonate, (4-phenylthiophenyl).diphenylsulfonium 10-camphorsulfonate, (4-phenylthiophenyl)-diphenylsulfonium n-octanesulfonate, (4-phenylthiophenyl).diphenylsulfonium 2-trifluoromethylbenzenesulfonate, (4-phenylthiophenyl).diphenylsulfonium 4-trifluoromethylbenzenesulfonate, and (4-phenylthiophenyl).diphenylsulfonium perfluorobenzenesulfonate, 4,4'-bis(diphenylsulfonylphenyl)sulfide di(pyrenesulfonate), 4,4'-bis(diphenylsulfonylphenyl)sulfide di(n-dodecylbenzenesulfonate), 4,4'-bis(diphenylsulfonylphenyl)sulfide di(p-toluenesulfonate), 4,4'-bis(diphenylsulfonylphenyl)sulfide di(benzenesulfonate), 4,4'-bis(diphenylsulfonylphenyl)sulfide di(10-camphorsulfonate), 4,4'-bis(diphenylsulfonylphenyl)sulfide di(n-octanesulfonate), 4,4'-bis(diphenylsulfonylphenyl)sulfide di(2-trifluoromethylbenzenesulfonate), 4,4'-bis(diphenylsulfonylphenyl)sulfide di(4-trifluoromethylbenzenesulfonate), and 4,4'-bis(diphenylsulfonylphenyl)sulfide di(perfluorobenzenesulfonate).

Sulfone Compounds

Examples of suitable sulfone compounds include β-ketosulfones, β-sulfonylsulfones, and α-diazo compounds of these sulfones.

Specific examples of these types of sulfone compounds include phenacylphenylsulfone, mesitylphenacylsulfone, bis(phenylsulfonyl)methane, and 4-trisphenacylsulfone.

Sulfonate Ester Compounds

Examples of suitable sulfonate ester compounds include alkylsulfonate esters, haloalkylsulfonate esters, arylsulfonate esters, and iminosulfonate esters.

Specific examples of these types of sulfonate ester compounds include benzoin tosylate, pyrogallolmethanesulfonate triester, nitrobenzyl-9,10-diethoxyanthracene-2-sulfonate, α-methylolbenzoin tosylate, α-methylolbenzoin n-octanesulfonate, and α-methylolbenzoin dodecylsulfonate.

Disulfonyldiazomethane Compounds

Specific examples of suitable disulfonyldiazomethane compounds include bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, methylsulfonyl-p-tolenesulfonyldiazomethane, bis(4-t-butylphenylsulfonyl)diazomethane, bis(p-chlorobenzenesulfonyl)diazomethane, cyclohexylsulfonyl-p-tolenesulfonyldiazomethane, (cyclohexylsulfonyl)(1,1-dimethylethylsulfonyl)diazomethane, bis(1,1-dimethylethylsulfonyl)diazomethane, bis(1-methylethylsulfonyl)diazomethane, bis(3,3-dimethyl-1,5-dioxaspiro[5.5]dodecane-8-sulfonyl)diazomethane, and bis(1,4-dioxaspiro[4.5]decane-7-sulfonyl)diazomethane.

Hydrazinesulfonate Compounds

Specific examples of suitable hydrazinesulfonate compounds include bis(benzene)sulfonylhydrazine, bis(p-toluene)sulfonylhydrazine, bis(n-propane)sulfonylhydrazine, benzenesulfonylhydrazine, p-toluenesulfonylhydrazine, and n-propanesulfonylhydrazine.

These other acid generators may be used singularly, or in mixtures of two or more such compounds.

The amount of such other acid generators incorporated within a resin should be decided in accordance with the type(s) of acid generator selected, although typically no more than 95 parts by weight, and preferably no more than 90 parts by weight should be included per 100 parts by weight of the combined acid generator (A) and other acid generators. If the amount of the other acid generators exceeds 95 parts by weight then there is a tendency for a reduction in the desired effect produced by the present invention.

Acid Diffusion Control Agents

It is preferable that resins of the third and fourth aspects of the present invention also incorporate an acid diffusion control agent, which controls the diffusion within the resist film of the acid generated from the acid generator (A) or the other acid generator during exposure, and suppresses any unfavorable chemical reactions within the unexposed areas.

By using this type of acid diffusion control agent, the storage stability of the resin composition improves, the resolution of the resulting resist layer also improves, and line width variation of the resist pattern resulting from variations in the post exposure delay time (PED) from the time of exposure until the developing process can be suppressed, enabling the production of a product with superior process stability.

Examples of preferred acid diffusion control agents include nitrogen containing organic compounds in which the basicity does not vary on exposure or heating during the resist pattern formation process.

Examples of this type of nitrogen containing organic compound include compounds represented by a formula (9) shown below (hereafter referred to as a nitrogen containing compound (I)),

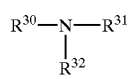
(9)

wherein in the formula (9), $R^{30}$, $R^{31}$ and $R^{32}$ each represent independently a hydrogen atom, a substituted or unsubstituted alkyl group, a substituted or unsubstituted aryl group, or a substituted or unsubstituted aralkyl group, diamino compounds with two nitrogen atoms within the same molecule (hereafter referred to as a nitrogen containing compound (II)), diamino polymers with three or more nitrogen atoms (hereafter referred to as a nitrogen containing compound (III)), amide group-containing compounds, urea compounds, and nitrogen containing heterocyclic compounds.

Specific examples of the nitrogen containing compounds (I) include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; and alkanolamines such as ethanolamine, diethanolamine and triethanolamine.

Specific example of the nitrogen containing compounds (II) include ethylenediamine, N,N,N',N'-tetramethylethylenediamine, tetramethylenediamine, hexamethylenediamine, N,N,N',N'-tetrakis(2-hydroxyethyl) ethylenediamine, N,N,N',N'-tetrakis(2-hydroxypropyl) ethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis [1-(4-aminophenyl)-1-methylethyl]benzene, and 1,3-bis[1-(4-aminophenyl)-1-methylethyl]benzene.

Specific examples of the nitrogen containing compounds (III) include polyethyleneimine, polyallylamine; and polymers of dimethylaminoethylacrylamide.

Specific examples of the aforementioned amide group-containing compounds include formamide, N-methylformamide, N,N-dimethylformamide, acetoamide, N-methylacetoamide, N,N-dimethylacetoamide, propionamide, benzamide, pyrolidone, and N-methylpyrolidone.

Specific examples of the aforementioned urea compounds include urea, methylurea, 1,1-dimethylurea, 1,3-dimethylurea, 1,1,3,3-tetramethylurea, 1,3-diphenylurea and tributylthiourea.

Specific examples of the aforementioned nitrogen containing heterocyclic compounds include imidazoles such as imidazole, benzimidazole, 2-phenylbenzimidazole, 2-methylimidazole, 4-methylimidazole, 2-phenylimidazole, 4-phenylimidazole, and 4-methyl-2-phenylimidazole; pyridine based compounds such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; as well as pyrazine, pyrazol, pyridazine, quinoxaline, purine, pyrrolidine, piperidine, 1-piperidineethanol, 2-piperidineethanol, morpholine, 4-methylmorpholine, piperazine, 1,4-dimethylpiperazine, and 1,4-diazabicyclo[2.2.2]octane.

Of these nitrogen containing organic compounds, the nitrogen containing compounds (I) and the nitrogen containing heterocyclic compounds are preferred. Furthermore, of the nitrogen containing compounds (I), trialkylamines are particularly desirable, whereas of the nitrogen containing heterocyclic compounds, imidazoles are particularly desirable.

These acid diffusion control agents may be used singularly, or in mixtures of two or more such compounds.

The amount of an acid diffusion control agent incorporated within a resin should typically be no more than 15 parts by weight, and preferably from 0.001 to 10 parts by weight, and even more preferably from 0.005 to 5 parts by weight per 100 parts by weight of the acid dissociable group-containing resin (B) or the alkali-soluble resin (C). If the amount of the acid diffusion control agent exceeds 15 parts by weight then there is a tendency for both the sensitivity and the developability of the exposed portions of the resist to deteriorate. In contrast, if the amount of the acid diffusion control agent is less than 0.001 parts by weight, then depending on the process conditions, there is a danger that the pattern shape and the fidelity of the dimensions of the resist may deteriorate.

Surface Active Agents

The aforementioned surface active agent improves the applicability, striation, and developability of the radiation sensitive resin composition. Anionic, cationic, nonionic, or amphoteric surface active agents may be used, although nonionic surface active agents are preferred.

Specific examples of such nonionic surface active agents include polyoxyethylene higher alkyl ethers, polyoxyethylene higher alkyl phenyl ethers, and higher fatty acid diesters of polyethylene glycol, as well as a range of commercial products including the KP series (manufactured by Shin-Etsu Chemical Co. Ltd.), the Polyflow series (manufactured by Kyoeisha Chemical Co. Ltd.), the Eftop series (manufactured by Tochem Products Incorporated), the Megafac series (manufactured by Dainippon Ink and Chemicals Inc.), the Florade series (manufactured by Sumitomo 3M Ltd.), and the Asahiguard and Surfron series (manufactured by Asahi Glass Company Ltd.)

These surface active agents may be used singularly, or in mixtures of two or more such agents.

The amount of the surface active agent added should typically provide no more than 2 parts by weight of the surface active agent active ingredient per 100 parts by weight of the combination of all the resin constituents of the radiation sensitive resin composition.

Sensitizers

The aforementioned sensitizer absorbs the energy from the radiation, and transmits that energy to the acid generator (A) or the other acid generator, thereby increasing the amount of acid generated, and producing an apparent improvement in the sensitivity of the radiation sensitive resin composition.

Examples of preferred sensitizers include acetophenones, benzophenones, naphthalene compounds, biacetyl, eosin, rose bengal, pyrene compounds, anthracene compounds, and phenothiazine compounds.

These sensitizers may be used singularly, or in mixtures of two or more such compounds. The amount of sensitizer added should typically be no more than 50 parts by weight, and preferably no more than 30 parts by weight, per 100 parts by weight of the combination of all the resin constituents of the radiation sensitive resin composition.

By also including a dye or a pigment, the latent image of the exposed portion can be made visible and the halation effect during exposure can be moderated. Furthermore, by including an adhesion assistant, the adhesion with the substrate can also be improved.

In addition, other additives such as halation inhibitors, storage stabilizing agents, antifoaming agents, and shape improvement agents, and more specifically additives such as 4-hydroxy-4'-methylchalcone, may also be added.

Solubility Control Agents

Examples of solubility control agents include compounds with an acidic functional group such as a phenolic hydroxyl group or a carboxyl group, and compounds in which the hydrogen atom of an acidic functional group has been substituted with at least one type of substituent which can be dissociated in the presence of an acid (hereafter described as an acid dissociable substituent).

Examples of the acid dissociable substituents described above include the same acid dissociable groups described above with reference to the acid dissociable group-containing resins, such as substituted methyl groups, 1-substituted ethyl groups, 1-substituted n-propyl groups, 1-branched alkyl groups, silyl groups, germyl groups, alkoxycarbonyl groups, acyl groups, and cyclic acid dissociable groups.

The solubility control agent may be either a low molecular weight compound or a high molecular weight compound, and specific examples of suitable low molecular weight compounds include the compounds represented by the formulas (10) to (14) shown below.

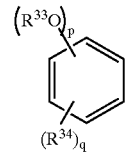
(10)

wherein in the formula (10), $R^{33}$ represents a hydrogen atom or an acid dissociable substituent, and the plurality of $R^{33}$ groups may be the same or different, $R^{34}$ represents a straight chain or branched chain alkyl group of 1 to 4 carbon atoms, a phenyl group, or a 1-naphthyl group, and the plurality of $R^{34}$ groups may be the same or different, p represents an integer of 1 or greater, q represents an integer of 0 or greater, and $p+q \leq 6$.

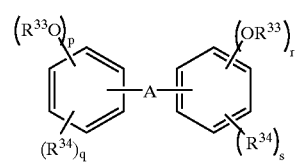
(11)

wherein in the formula (11), $R^{33}$ and $R^{34}$ each represent the same meaning as in the formula (10), A represents a single bond, —O—, —S—, —CO—, —COO—, —SO—, $SO_2$—, —C($R^{35}$)($R^{36}$)— (wherein, $R^{35}$ and $R^{36}$ each represent, independently, a hydrogen atom, a straight chain, branched chain or cyclic alkyl group of 1 to 6 carbon atoms, an acyl group of 2 to 11 carbon atoms, a phenyl group, a 1-naphthyl group), or a group represented by the formula shown below,

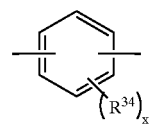

(wherein, $R^{34}$ represents the same meaning as described above, and x represents an integer of 0 to 4), p, q, r and s each represent an integer of 0 or greater, and $p+q \leq 5$, $r+s \leq 5$, and $p+r \geq 1$.

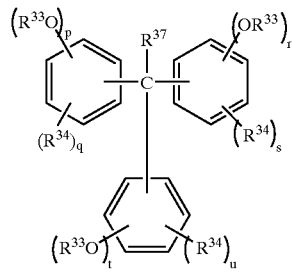
(12)

wherein in the formula (12), $R^{33}$ and $R^{34}$ each represent the same meaning as in the formula (10), $R^{37}$ represents a hydrogen atom, a straight chain or branched chain alkyl group of 1 to 4 carbon atoms, or a phenyl group, p, q, r, s, t and u each represent an integer of 0 or greater, and $p+q \leq 5$, $r+s \leq 5$, $t+u \leq 5$, and $p+r+t \geq 1$.

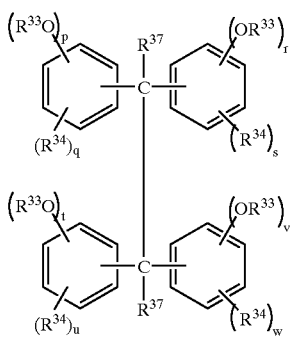

(13)

wherein in the formula (13), $R^{33}$ and $R^{34}$ each represent the same meaning as in the formula (10), A represents the same meaning as in the formula (12), $R^{37}$ represents the same meaning as in the formula (12) and the plurality of $R^{37}$ groups may be the same or different, p, q, r, s, t, u, v and w each represent an integer of 0 or greater, and $p+q \leq 5$, $r+s \leq 5$, $t+u \leq 5$, $v+w \leq 5$, and $p+r+t+v \geq 1$.

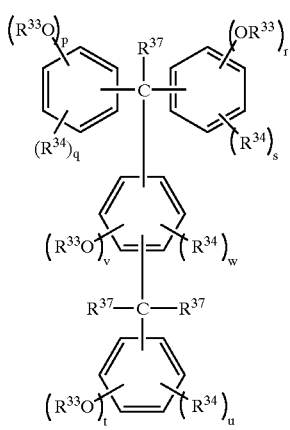

(14)

wherein in the formula (14), $R^{33}$ and $R^{34}$ each represent the same meaning as in the formula (10), $R^{37}$ represents the same meaning as in the formula (12) and the plurality of $R^{37}$ groups may be the same or different, p, q, r, s, t, u, v and w each represent an integer of 0 or greater, and $p+q \leq 5$, $r+s \leq 5$, $t+u \leq 5$, $v+w \leq 4$, and $p+r+t+v \geq 1$.

These solubility control agents may be used singularly, or in mixtures of two or more such agents.

Solvents

During use, a positive type radiation sensitive resin composition of the third aspect of the present invention, or a negative type radiation sensitive resin composition of the fourth aspect of the present invention is typically dissolved in a solvent to produce a solution with a dissolved solids concentration of 5 to 50% by weight, and then filtered through a filter with a pore size of approximately 0.2 μm, to produce a composition solution.

Suitable examples of the solvent include ethers, esters, ether esters, ketones, ketone esters, amides, amide esters, lactams, lactones, and (halogenated) hydrocarbons, and more specifically, ethylene glycol monoalkyl ethers, diethylene glycol dialkyl ethers, propylene glycol monoalkyl ethers, propylene glycol dialkyl ethers, ethylene glycol monoalkyl ether acetates, propylene glycol monoalkyl ether acetates, acetate esters, hydroxyacetate esters, lactate esters, alkoxyacetate esters, cyclic ketones, acyclic ketones, acetoacetate esters, pyruvate esters, propionate esters, N,N-dialkylformamides, N,N-dialkylacetoamides, N-alkylpyrolidones, γ-lactones, (halogenated) aliphatic hydrocarbons, and (halogenated) aromatic hydrocarbons.

Specific examples of suitable solvents include ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, propylene glycol monomethyl ether acetate, propylene glycol monoethyl ether acetate, propylene glycol mono-n-propyl ether acetate, isopropenyl acetate, isopropenyl propionate, toluene, xylene, methyl ethyl ketone, cyclohexanone, 2-heptanone, 3-heptanone, 4-heptanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl lactate, ethyl lactate, n-propyl lactate, i-propyl lactate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl 3-methoxypropionate, ethyl 3-methoxypropionate, methyl 3-ethoxypropionate, ethyl 3-ethoxypropionate, N-methylpyrolidone, N,N-dimethylformamide, and N,N-dimethylacetoamide.

Of the above solvents, the propylene glycol monoalkyl ether acetates, 2-heptanone, the lactate esters, the 2-hydroxypropionate esters, and the 3-alkoxypropionate esters are preferred.

These solvents can be used singularly, or in mixtures of two or more solvents.

Furthermore, where necessary, one or more high boiling point solvents such as benzyl ethyl ether, di-n-hexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, or ethylene glycol monophenyl ether acetate may also be added to the solvent.

Resist Pattern Formation

To form a resist pattern from either a positive type radiation sensitive resin composition according to the third aspect of the present invention or a negative type radiation sensitive resin composition according to the fourth aspect of the present invention, a composition solution prepared in the manner described above is applied to a substrate such as a silicon wafer or an aluminum coated wafer using a technique such as spin coating, cast coating or roll coating, to form a resist film, and following heat treatment (hereafter this heat treatment is described as "PB"), the resist film is exposed through a predetermined mask pattern. Examples of the radiation that can be used for the exposure process include far ultraviolet radiation such as the line spectrum of a mercury light (wavelength 254 nm), a KrF excimer laser (wavelength 248 nm), or an ArF excimer laser (wavelength 193 nm), X rays such as synchrotron radiation, and charged particle beams such as electron beams, although far ultraviolet radiation and charged particle beams are preferred, and a KrF excimer laser (wavelength 248 nm), an ArF excimer laser (wavelength 193 nm) or an electron beam are particularly preferred. The conditions during exposure such as the amount of radiation should be selected appropriately in accordance with factors such as the relative composition of the radiation sensitive resin composition and the types of additives used.

Following exposure, it is preferable that further heat treatment is conducted (hereafter, this heat treatment is described as "PEB") in order to improve the apparent sensitivity of the resist. The conditions for this heat treatment will vary depending on factors such as the relative composition of the radiation sensitive resin composition and the types of additives used, although typically a temperature of 30 to 200° C., and preferably 50 to 150° C., is used.

Subsequently, an alkali developing solution is used to develop and form the predetermined resist pattern.

Examples of suitable alkali developing solutions include alkali aqueous solutions containing one or more alkali compounds such as alkali metal hydroxides, aqueous ammonia, alkyl amines, alkanol amines, heterocyclic amines, tetraalkylammonium hydroxides, choline, 1,8-diazabicyclo[5.4.0]-7-undecene, or 1,5-diazabicyclo[4.3.0]-5-nonene, at a concentration of 1 to 10% by weight, and preferably 2 to 5% by weight. Particularly preferred alkali developing solutions include aqueous solutions of tetraalkylammonium hydroxides.

Furthermore, appropriate quantities of water soluble organic solvents such as methanol or ethanol or surface active agents or the like may also be added to a developing solution formed from an alkali aqueous solution.

In those cases when a developing solution formed from an alkali aqueous solution is used, the substrate is typically washed with water following the developing process.

EXAMPLES

As follows is a more detailed description of the present invention based on a series of examples. However, the present invention is in no way restricted to the examples presented here.

Synthesis of a Sulfonyloxime Compound

Synthetic Example 1

2.25 g of sodium ethoxide was dissolved in 100 g of methanol in a reaction flask, and 5.76 g of hydroxylamine hydrochloride was then added to the solution, followed by 12.3 g of 2,2-difluoro-2-phenylsulfonylacetophenone (manufactured by Daikin Industries Ltd.). The reaction mixture was stirred for 8 hours at 60° C., and then water was poured into the mixture, and the resulting precipitate was collected. This precipitate was dissolved in methanol, and water was added to reform a precipitate, which when collected yielded 12.0 g of 2,2-difluoro-2-phenylsulfonylacetophenoneoxime.

Example 1

Figure 2:
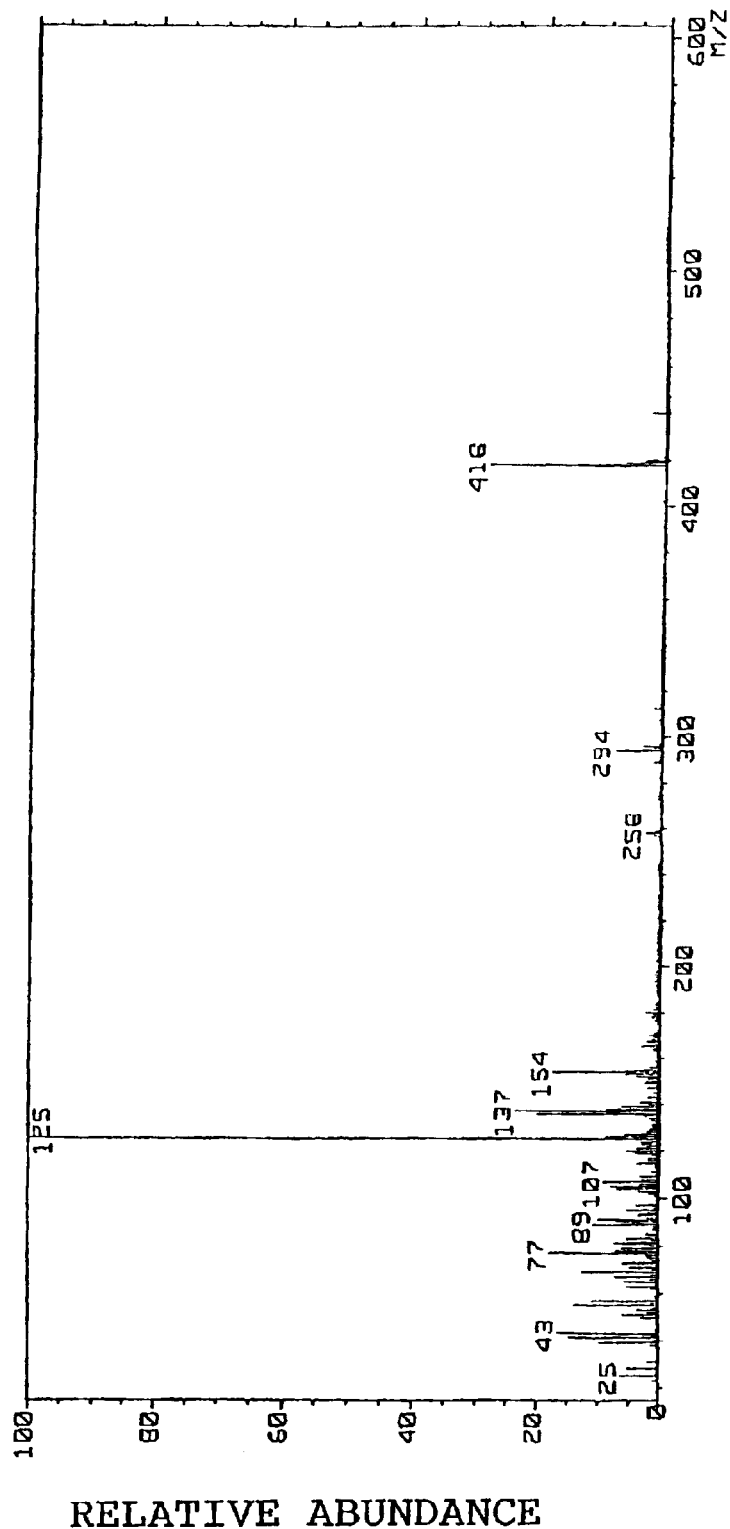
FIG. 2 is a diagram showing results of mass spectrometry analysis for the sulfonyloxime compound obtained in the example 1.

3.00 g of the 2,2-difluoro-2-phenylsulfonylacetophenoneoxime obtained in the synthetic example 1 was dissolved in 150 g of tetrahydrofuran in a reaction flask, and following the addition of 2.82 g of propylsulfonyl chloride to the solution, 3.00 g of triethylamine was added dropwise to the solution at room temperature. The resulting reaction mixture was stirred for 10 minutes at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried over anhydrous magnesium sulfate. The solvent was then removed under reduced pressure to yield 3.30 g of 2,2-difluoro-2-phenylsulfonylacetophenone-O-(n-propyl)sulfonyloxime. This compound is hereafter abbreviated as P-1. The results of $^1$H-NMR and mass spectrometry measurements on this product compound are shown in FIG. 1 and FIG. 2 respectively.

Example 2

Figure 3:
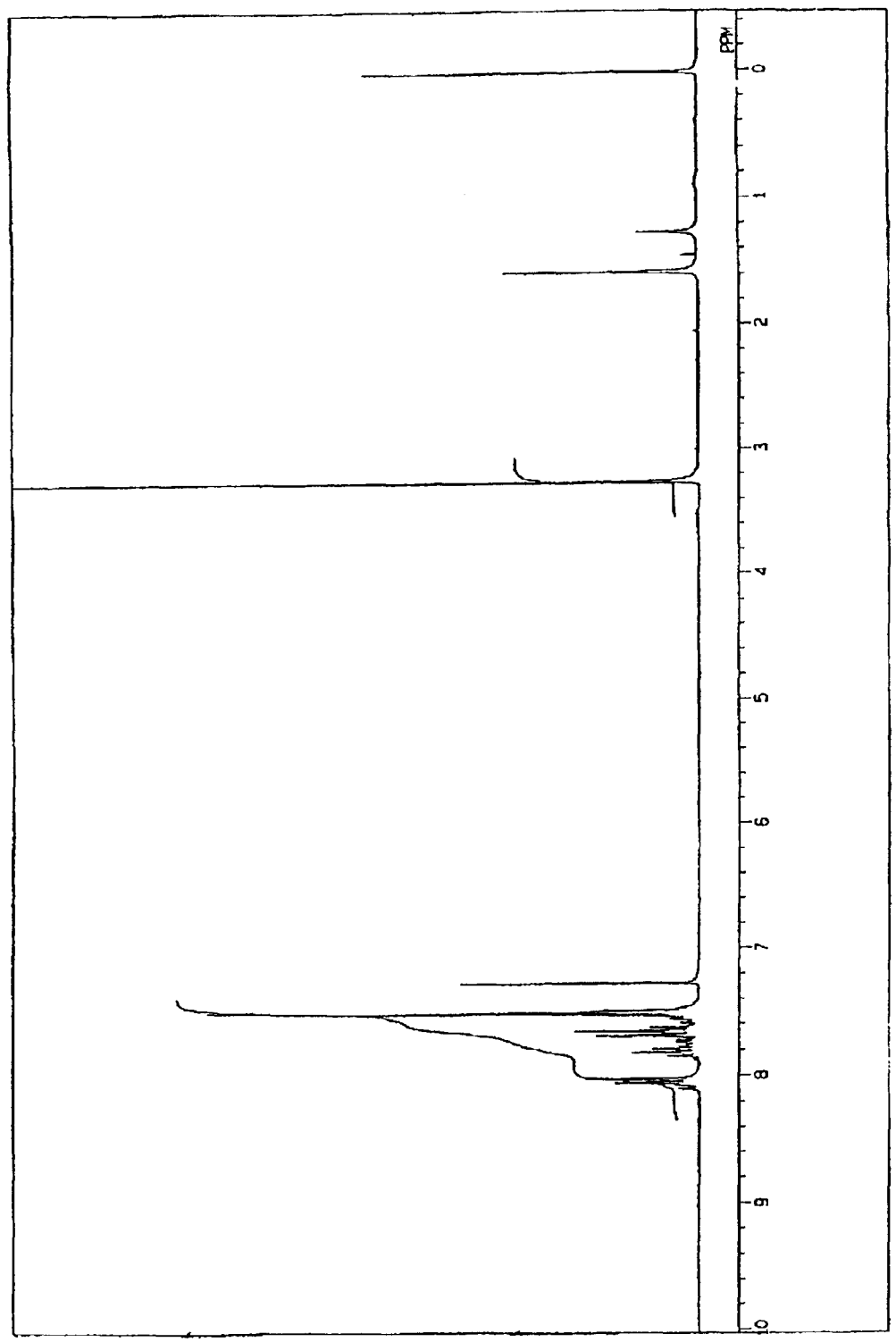
FIG. 3 is a diagram showing results of $^1$H-NMR spectrometry analysis of a sulfonyloxime compound obtained in an example 2.
Figure 4:
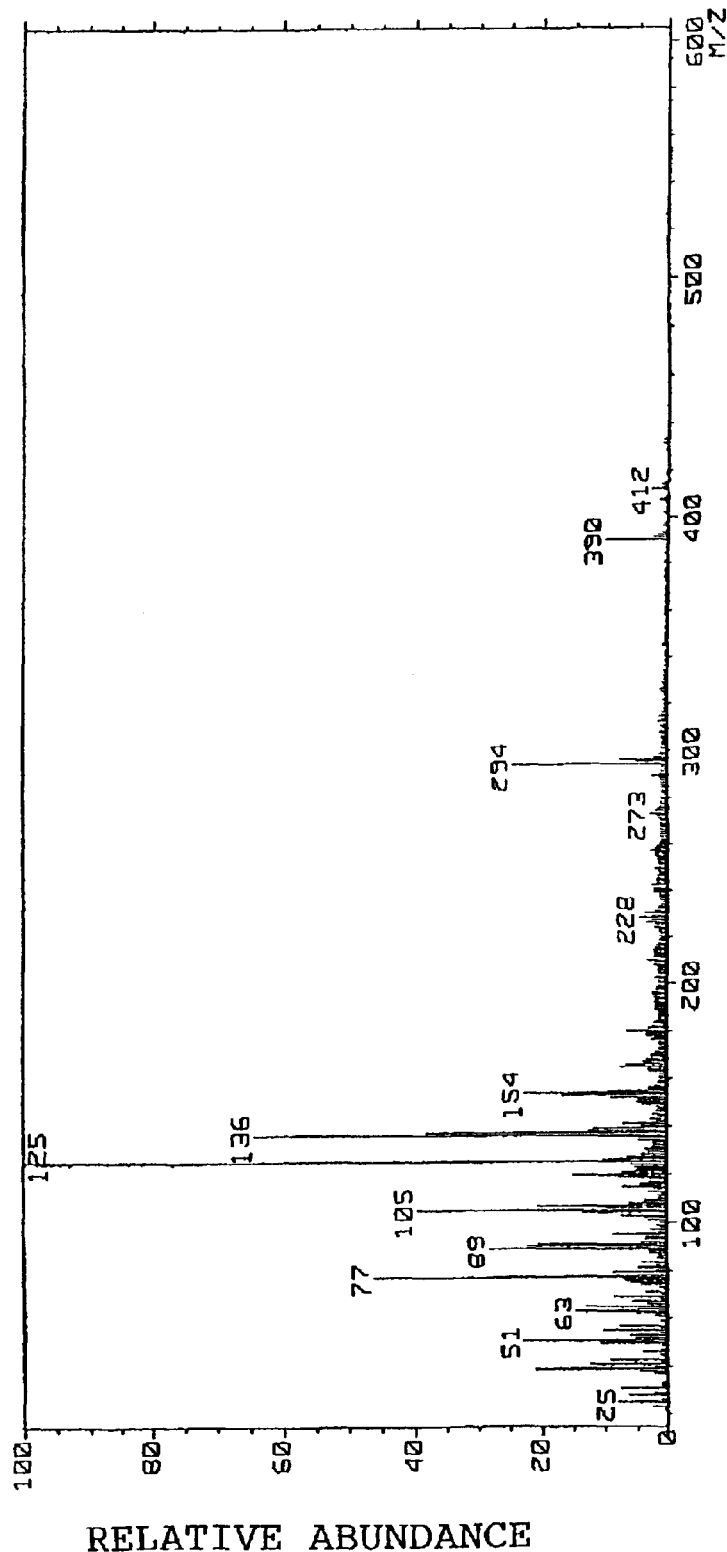
FIG. 4 is a diagram showing results of mass spectrometry analysis for the sulfonyloxime compound obtained in the example 2.

3.00 g of the 2,2-difluoro-2-phenylsulfonylacetophenoneoxime obtained in the synthetic example 1 was dissolved in 150 g of tetrahydrofuran in a reaction flask, and following the addition of 2.21 g of methylsulfonyl chloride to the solution, 2.92 g of triethylamine was added dropwise to the solution at room temperature. The resulting reaction mixture was stirred for 10 minutes at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried over anhydrous magnesium sulfate. The solvent was then removed under reduced pressure to yield 3.52 g of 2,2-difluoro-2-phenylsulfonylacetophenone-O-methylsulfonyloxime. This compound is hereafter abbreviated as P-2. The results of $^1$H-NMR and mass spectrometry measurements on this product compound are shown in FIG. 3 and FIG. 4 respectively.

Example 3

Figure 5:
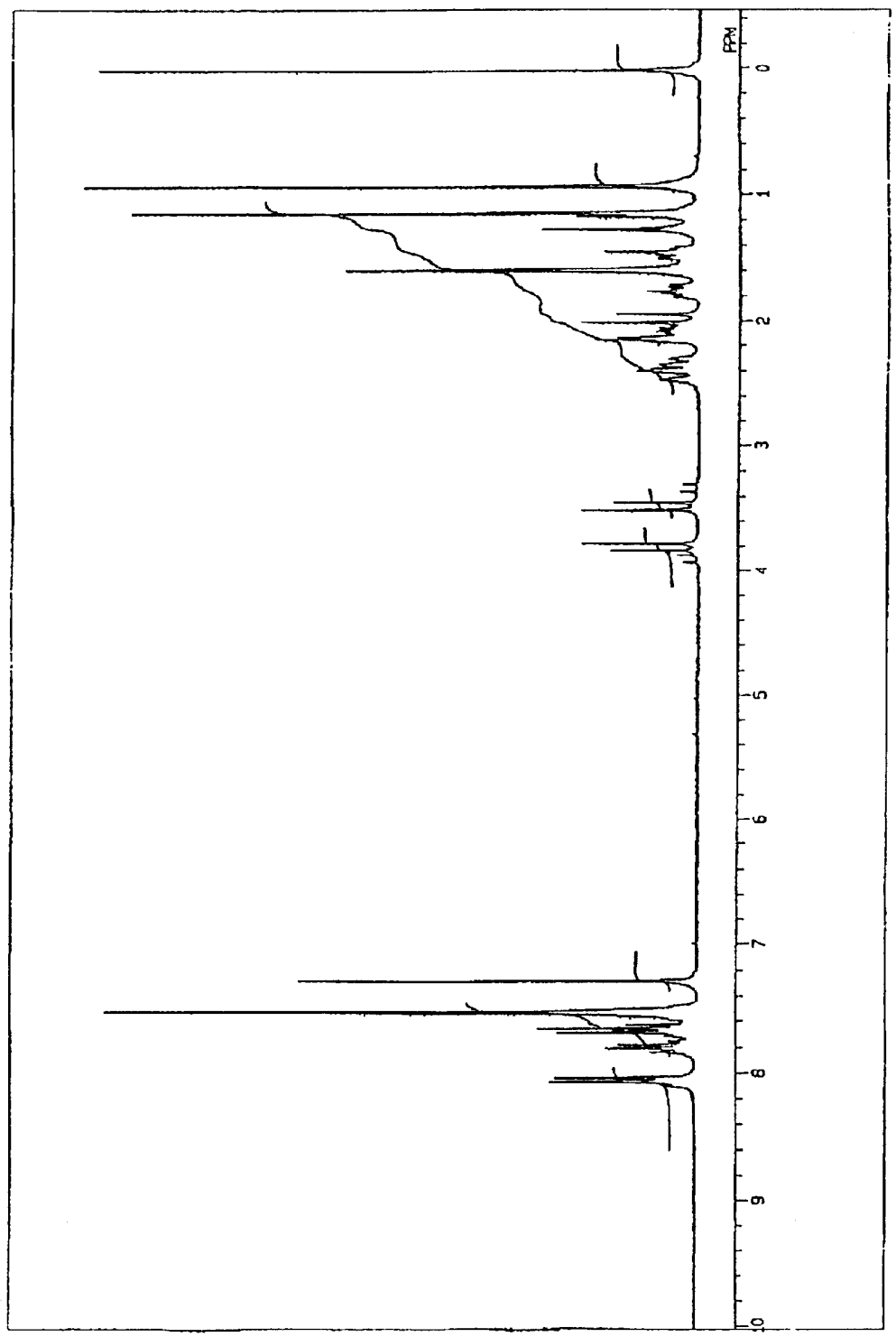
FIG. 5 is a diagram showing results of $^1$H-NMR spectrometry analysis of a sulfonyloxime compound obtained in an example 3.
Figure 6:
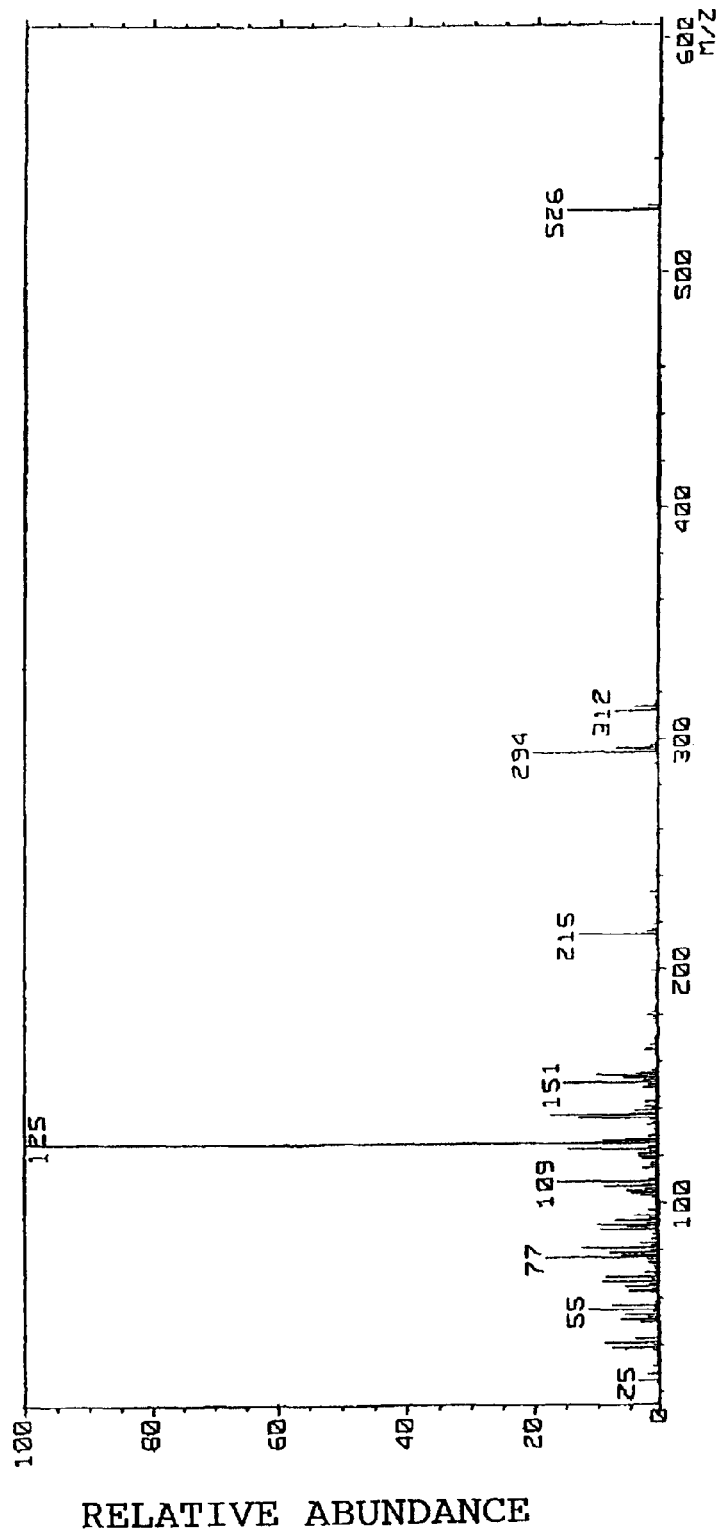
FIG. 6 is a diagram showing results of mass spectrometry analysis for the sulfonyloxime compound obtained in the example 3.

3.00 g of the 2,2-difluoro-2-phenylsulfonylacetophenoneoxime obtained in the synthetic example 1 was dissolved in 150 g of tetrahydrofuran in a reaction flask, and following the addition of 3.62 g of camphorsulfonyl chloride to the solution, 2.92 g of triethylamine was added dropwise to the solution. The resulting reaction mixture was stirred for 4 hours at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried over anhydrous magnesium sulfate. The solvent was then removed to yield 4.80 g of 2,2-difluoro-2-phenylsulfonylacetophenone-O-camphorsulfonyloxime. This compound is hereafter abbreviated as P-3. The results of $^1$H-NMR and mass spectrometry measurements on this product compound are shown in FIG. 5 and FIG. 6 respectively.

Example 4

Figure 7:
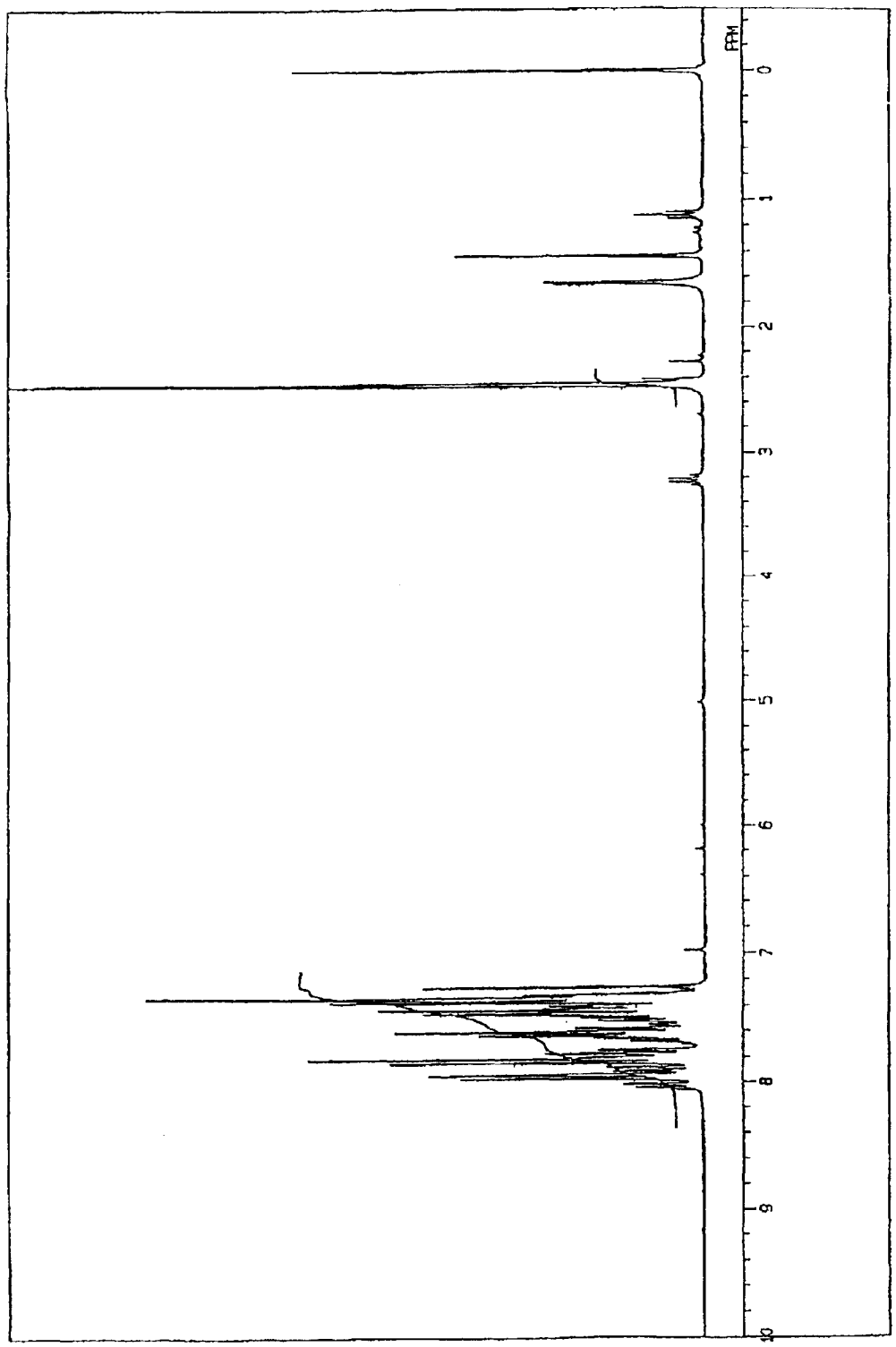
FIG. 7 is a diagram showing results of $^1$H-NMR spectrometry analysis of a sulfonyloxime compound obtained in an example 4.
Figure 8:
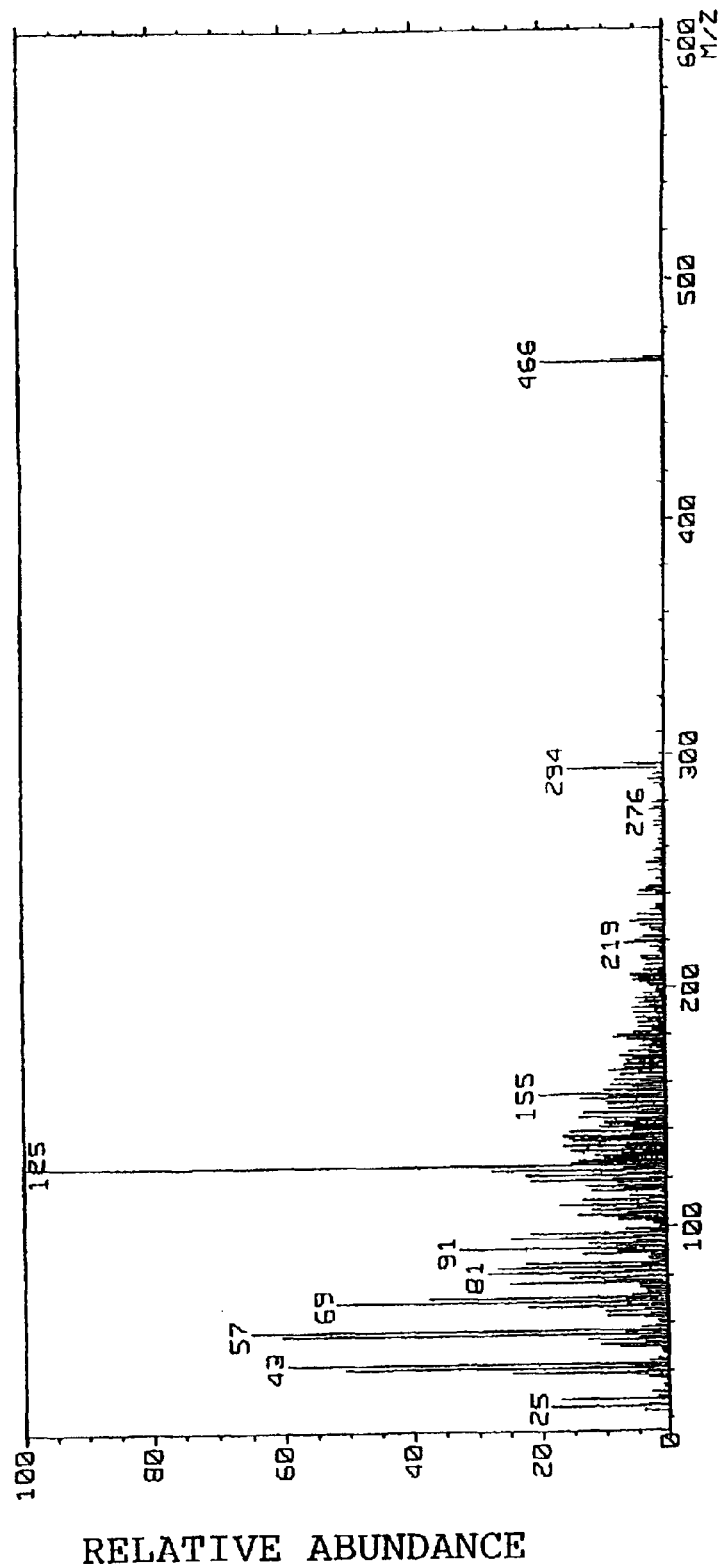
FIG. 8 is a diagram showing results of mass spectrometry analysis for the sulfonyloxime compound obtained in the example 4.

3.00 g of the 2,2-difluoro-2-phenylsulfonylacetophenoneoxime obtained in the synthetic example 1 was dissolved in 150 g of tetrahydrofuran in a reaction flask, and following the addition of 2.75 g of tosylsulfonyl chloride to the solution, 2.92 g of triethylamine was added dropwise to the solution. The resulting reaction mixture was stirred for 5 hours at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried over anhydrous magnesium sulfate. The solvent was then removed to yield 4.11 g of 2,2-difluoro-2-phenylsulfonylacetophenone-O-(p- methylphenyl)sulfonyloxime. This compound is hereafter abbreviated as P-4. The results of $^1$H-NMR and mass spectrometry measurements on this product compound are shown in FIG. 7 and FIG. 8 respectively.

Example 5

Figure 9:
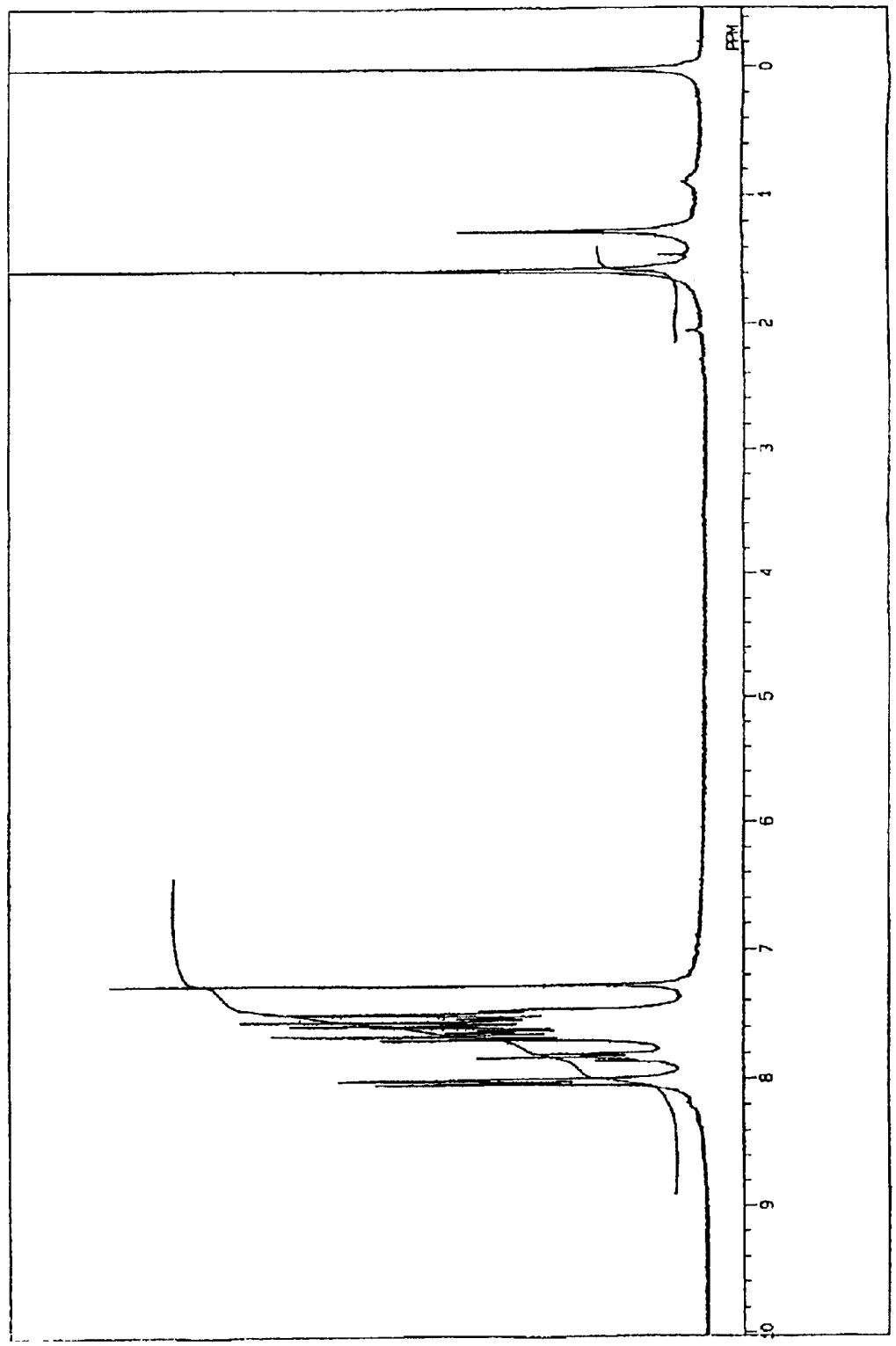
FIG. 9 is a diagram showing results of $^1$H-NMR spectrometry analysis of a sulfonyloxime compound obtained in an example 5.
Figure 10:
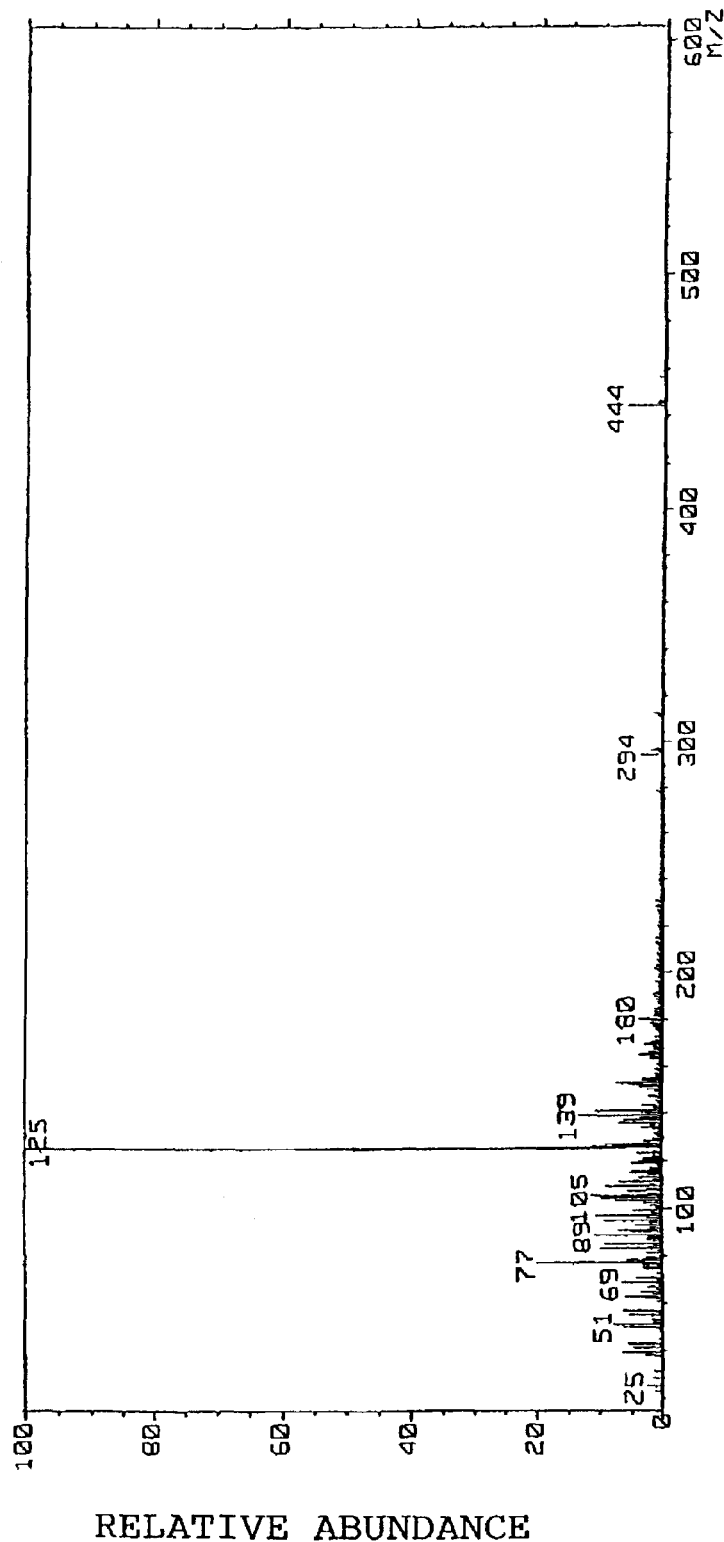
FIG. 10 is a diagram showing results of mass spectrometry analysis for the sulfonyloxime compound obtained in the example 5.

3.00 g of the 2,2-difluoro-2-phenylsulfonylacetophenoneoxime obtained in the synthetic example 1 was dissolved in 300 g of methylene chloride in a reaction flask, and following the addition of 11.0 g of trifluoroacetic anhydride to the solution, 9.71 g of pyridine was added dropwise to the solution. The resulting reaction mixture was stirred for one hour at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried over anhydrous magnesium sulfate. The solvent was then removed to yield 4.20 g of 2,2-difluoro-2-phenylsulfonylacetophenone-O-trifluoromethylsulfonyloxime. This compound is hereafter abbreviated as P-5. The results of $^1$H-NMR and mass spectrometry measurements on this product compound are shown in FIG. 9 and FIG. 10 respectively.

Synthetic Example 2

2.34 g of sodium ethoxide was dissolved in 100 g of methanol in a reaction flask, and 5.98 g of hydroxylamine hydrochloride was then added to the solution, followed by 13.0 g of 2,2-difluoro-2-cyclohexylsulfonylacetophenone (manufactured by Daikin Industries Ltd.). The reaction mixture was stirred for 8 hours at 60° C., and then water was poured into the mixture, and the resulting precipitate was collected. This precipitate was dissolved in methanol, and water was added to reform a precipitate, which when collected yielded 13.0 g of 2,2-difluoro-2-cyclohexylsulfonylacetophenoneoxime.

Example 6

Figure 11:
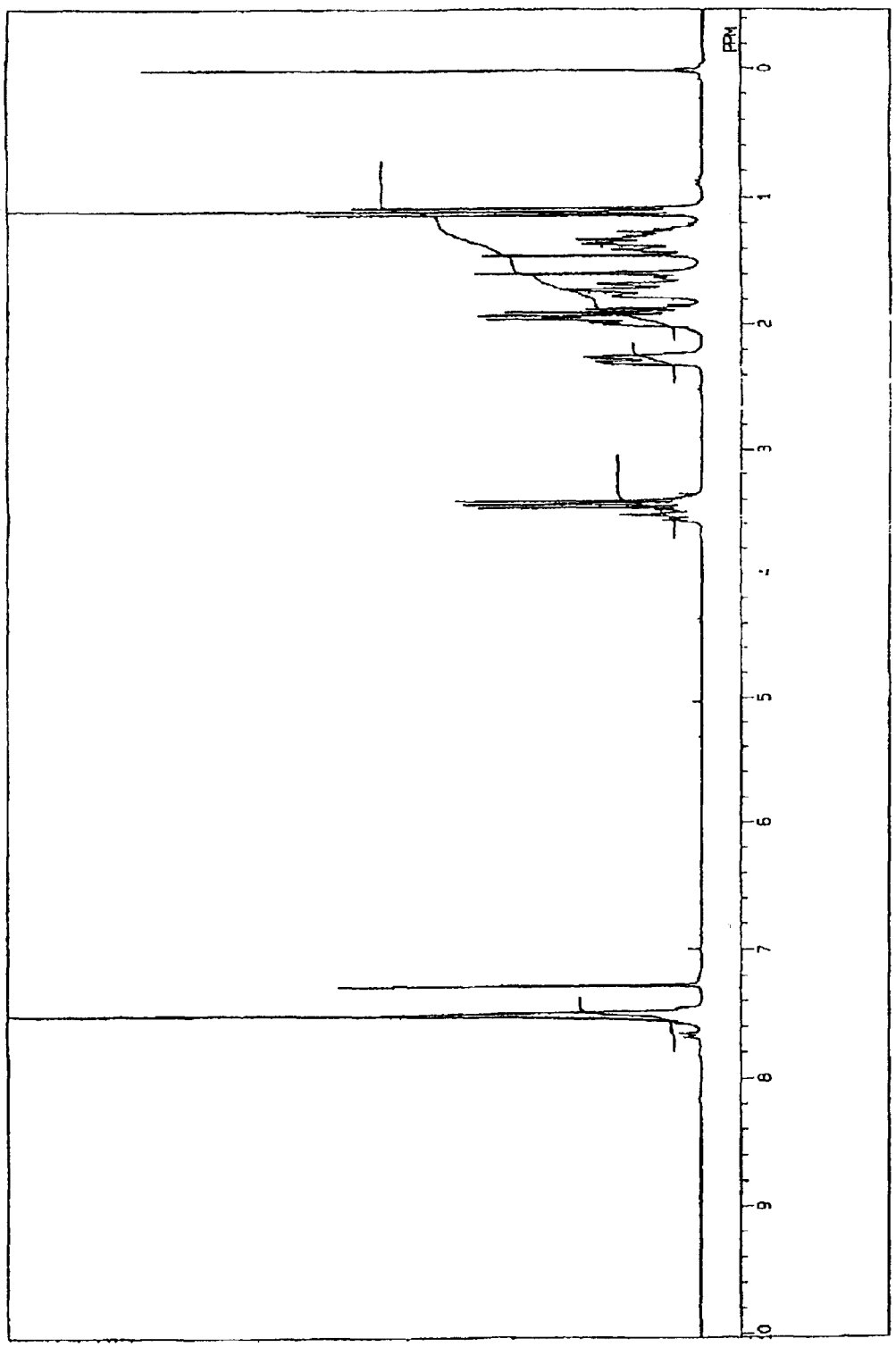
FIG. 11 is a diagram showing results of $^1$H-NMR spectrometry analysis of a sulfonyloxime compound obtained in an example 6.
Figure 12:
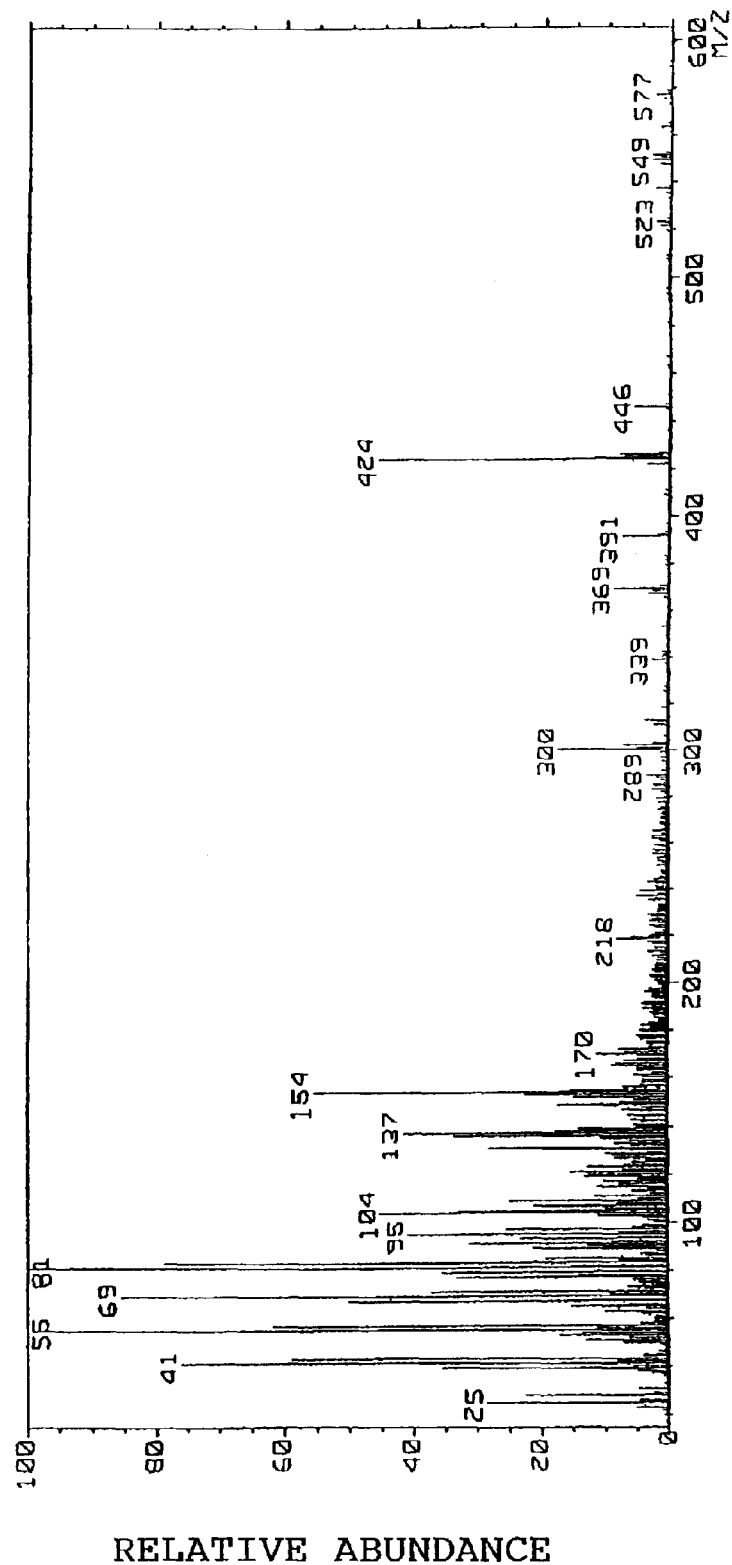
FIG. 12 is a diagram showing results of mass spectrometry analysis for the sulfonyloxime compound obtained in the example 6.

3.00 g of the 2,2-difluoro-2-cyclohexylsulfonylacetophenoneoxime obtained in the synthetic example 2 was dissolved in 150 g of tetrahydrofuran in a reaction flask, and following the addition of 2.71 g of propylsulfonyl chloride to the solution, 2.88 g of triethylamine was added dropwise to the solution. The resulting reaction mixture was stirred for 10 minutes at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried over anhydrous magnesium sulfate. The solvent was then removed to yield 3.52 g of 2,2-difluoro-2-cyclohexylsulfonylacetophenone-O-(n-propyl)sulfonyloxime. This compound is hereafter abbreviated as P-6. The results of $^1$H-NMR and mass spectrometry measurements on this product compound are shown in FIG. 11 and FIG. 12 respectively.

Example 7

Figure 13:
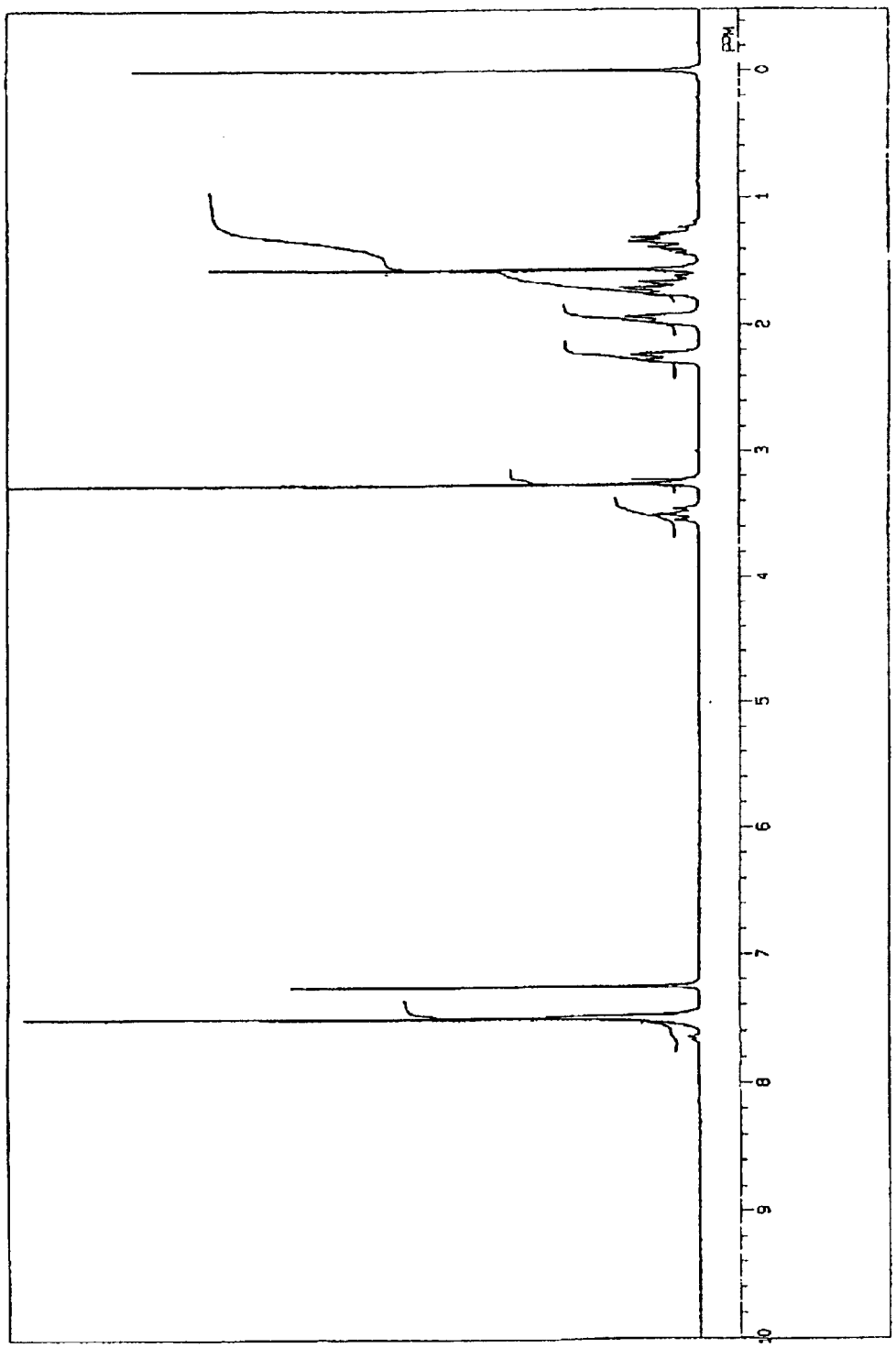
FIG. 13 is a diagram showing results of $^1$H-NMR spectrometry analysis of a sulfonyloxime compound obtained in an example 7.
Figure 14:
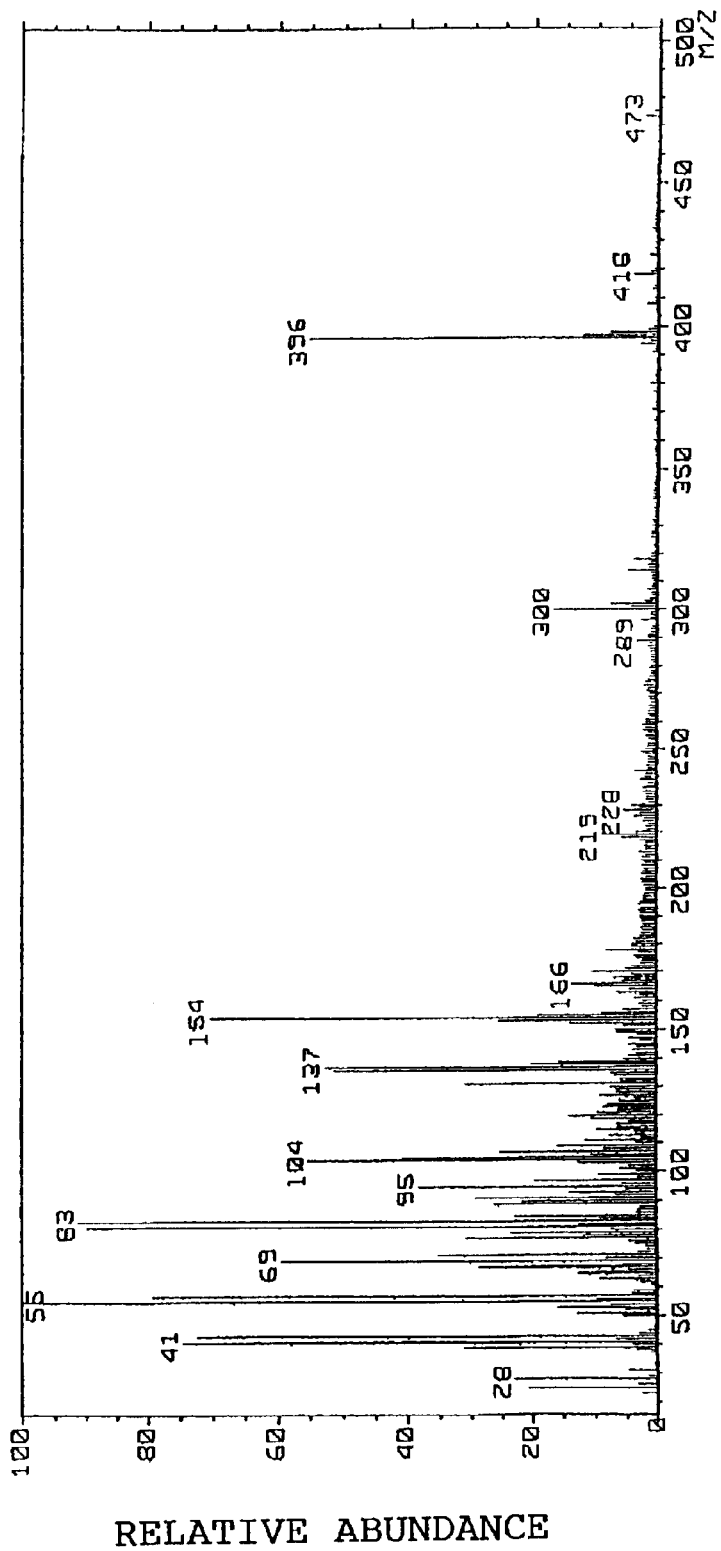
FIG. 14 is a diagram showing results of mass spectrometry analysis for the sulfonyloxime compound obtained in the example 7.

5.00 g of the 2,2-difluoro-2-cyclohexylsulfonylacetophenoncoxime obtained in the synthetic example 2 was dissolved in 150 g of tetrahydrofuran in a reaction flask, and following the addition of 3.61 g of methylsulfonyl chloride to the solution, 4.79 g of triethylamine was added dropwise to the solution. The resulting reaction mixture was stirred for 10 minutes at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried over anhydrous magnesium sulfate. The solvent was then removed to yield 3.50 g of 2,2-difluoro-2-cyclohexylsulfonylacetophenone-O-methylsulfonyloxime. This compound is hereafter abbreviated as P-7. The results of $^1$H-NMR and mass spectrometry measurements on this product compound are shown in FIG. 13 and FIG. 14 respectively.

Example 8

Figure 15:
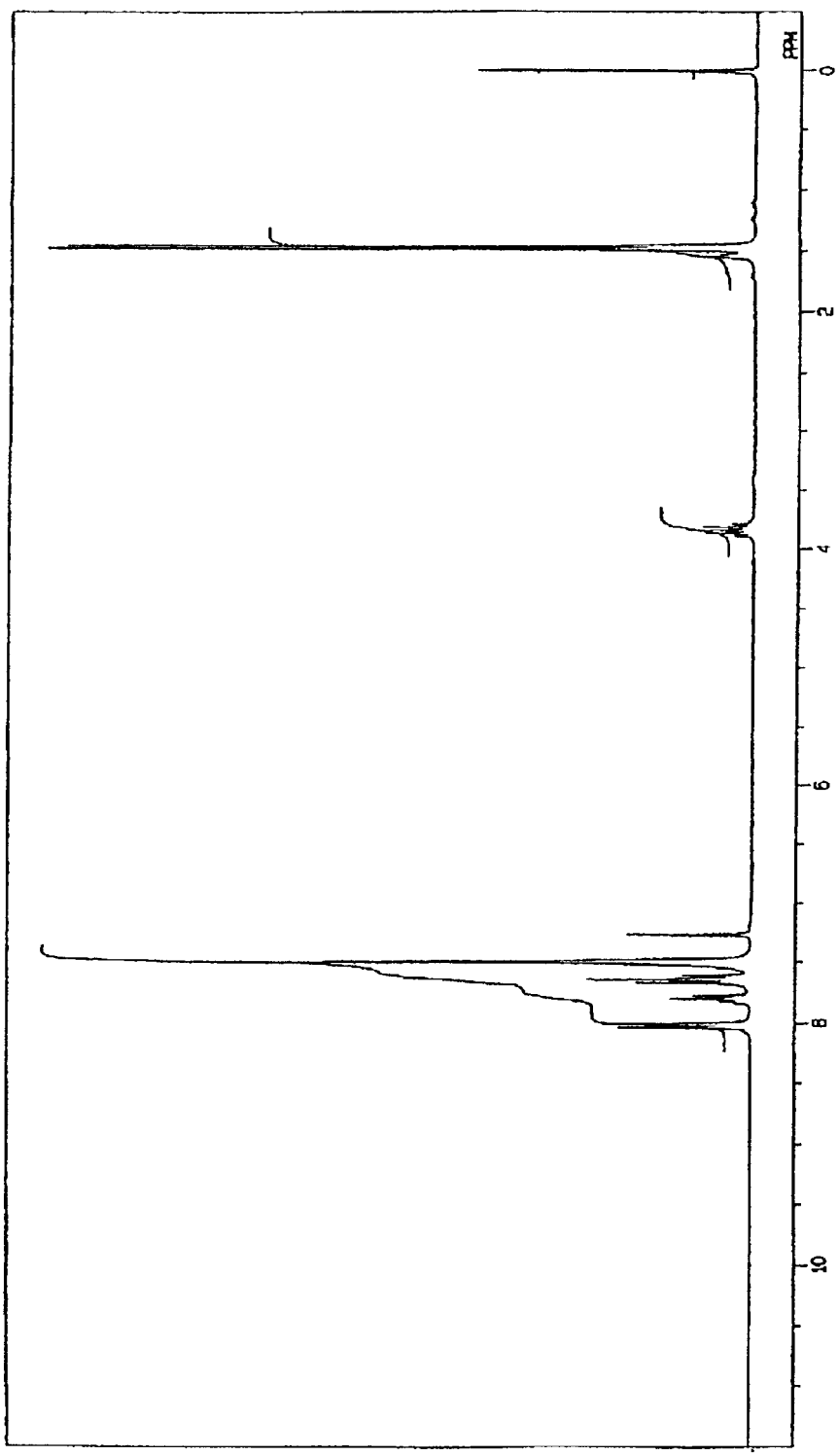
FIG. 15 is a diagram showing results of $^1$H-NMR spectrometry analysis of a sulfonyloxime compound obtained in an example 8.
Figure 16:
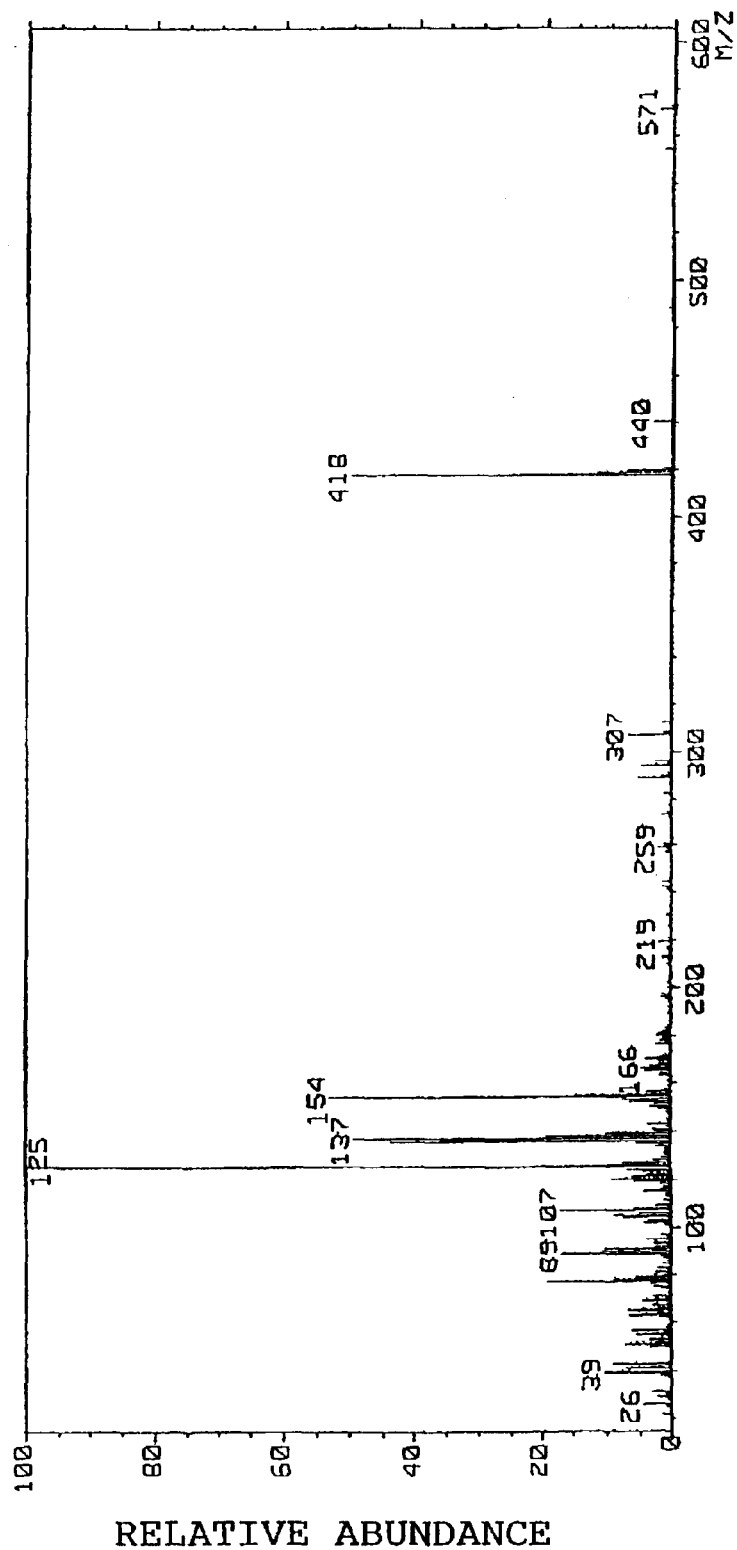
FIG. 16 is a diagram showing results of mass spectrometry analysis for the sulfonyloxime compound obtained in the example 8.

3.00 g of the 2,2-difluoro-2-phenylsulfonylacetophenoneoxime obtained in the synthetic example 1 was dissolved in 150 g of tetrahydrofuran in a reaction flask, and following the addition of 2.71 g of isopropylsulfonyl chloride to the solution, 2.88 g of triethylamine was added dropwise to the solution. The resulting reaction mixture was stirred for 30 minutes at room temperature, and then water was poured into the mixture to form a precipitate. Following collection of the precipitate by filtration, the precipitate was dissolved in methylene chloride, the solution was washed sequentially with a 5% aqueous solution of sodium bicarbonate, a 5% aqueous solution of oxalic acid, and water, and was then dried and dehydrated over anhydrous magnesium sulfate, followed by removal of methylene chloride, with the result that 2.7 g of 2,2-difluoro-2-phenylsulfonylacetophenone-O-(isopropyl)sulfonyloxime was yielded. This compound is hereafter abbreviated as P-8. The results of $^1$H-NMR and mass spectrometry measurements on this product compound are shown in FIG. 15 and FIG. 16 respectively.

Example 9

Figure 17:
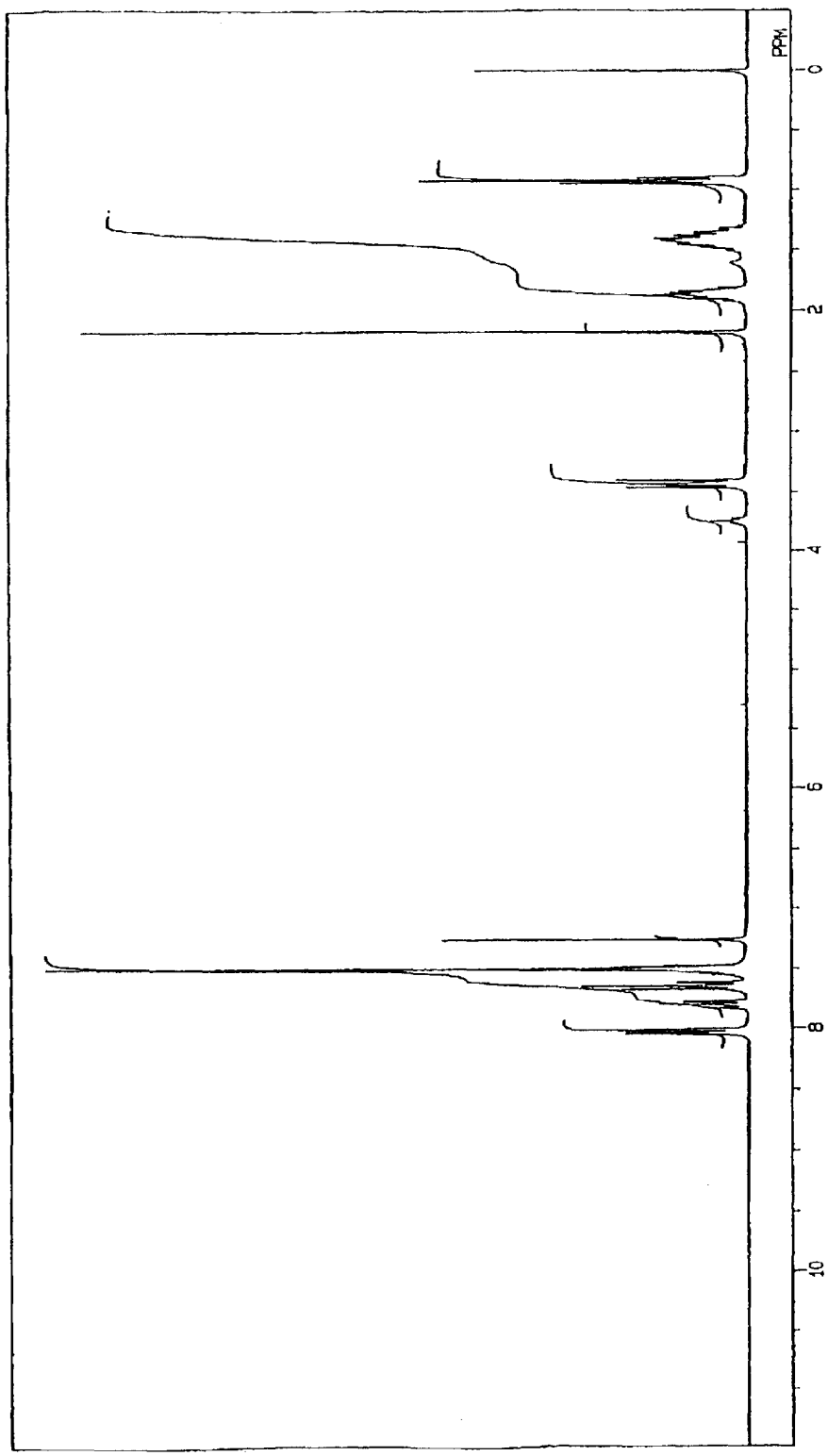
FIG. 17 is a diagram showing results of $^1$H-NMR spectrometry analysis of a sulfonyloxime compound obtained in an example 9.
Figure 18:
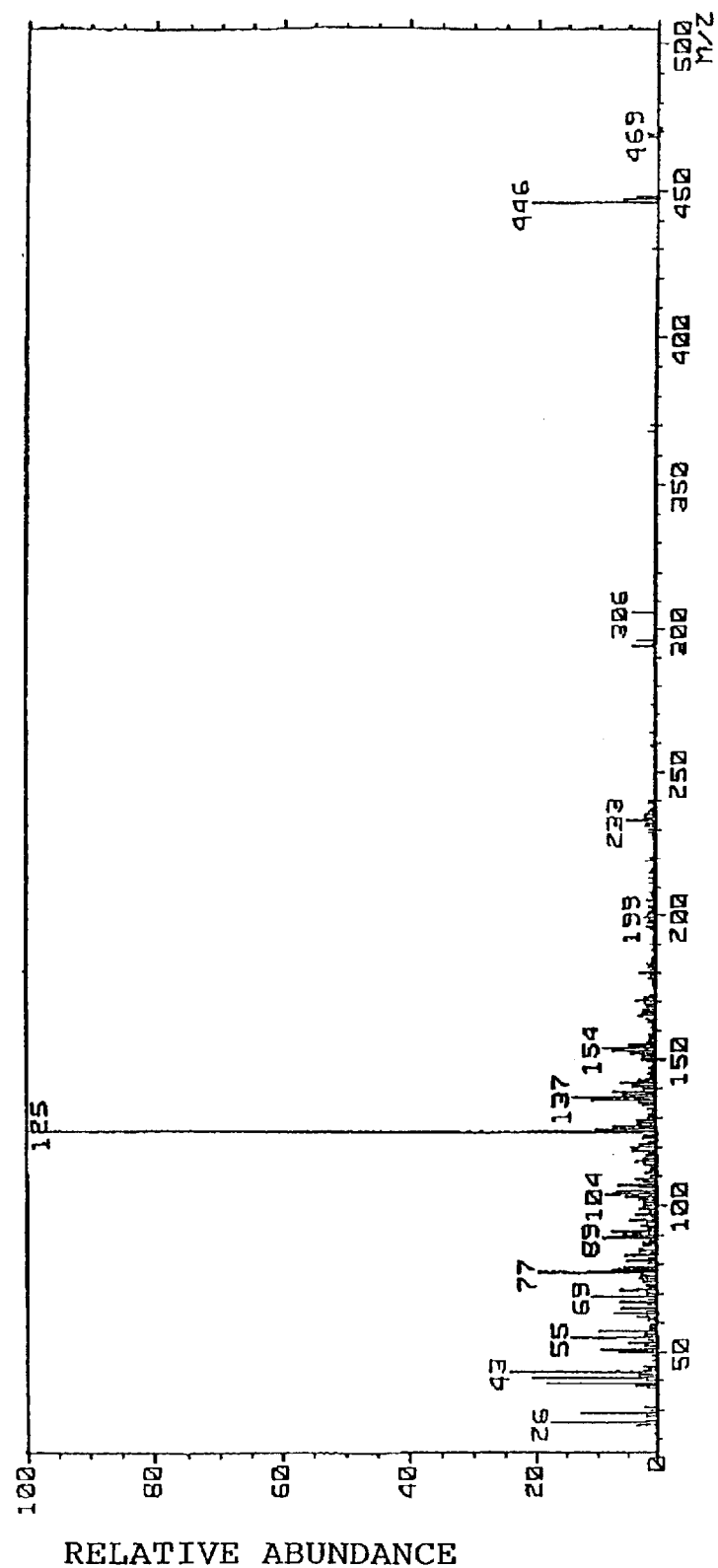
FIG. 18 is a diagram showing results of mass spectrometry analysis for the sulfonyloxime compound obtained in the example 9.

10.00 g of the 2,2-difluoro-2-phenylsulfonylacetophenoneoxime obtained in the synthetic example 1 was dissolved in 92.85 g of methylene chloride in a reaction flask, and following the addition of 10.96 g of pentanesulfonyl chloride, synthesized by known methods, 9.75 g of triethylamine was added dropwise to the solution. The resulting reaction mixture was stirred for 30 minutes at 0° C., and then water was poured into the mixture. Following washing with water, the reaction mixture was extracted into methylene chloride, and the methylene chloride solution was washed sequentially with a 5% aqueous solution of sodium bicarbonate, a 5% aqueous solution of oxalic acid, and then water, and was then dried and dehydrated over anhydrous magnesium sulfate, followed by removal of methylene chloride, with the result that 10.15 g of 2,2-difluoro-2-phenylsulfonylacetophenone-O-(pentyl)sulfonyloxime was yielded. This compound is hereafter abbreviated as P-9. The results of $^1$H-NMR and mass spectrometry measurements on this product compound are shown in FIG. 17 and FIG. 18 respectively.

Example 10

Figure 19:
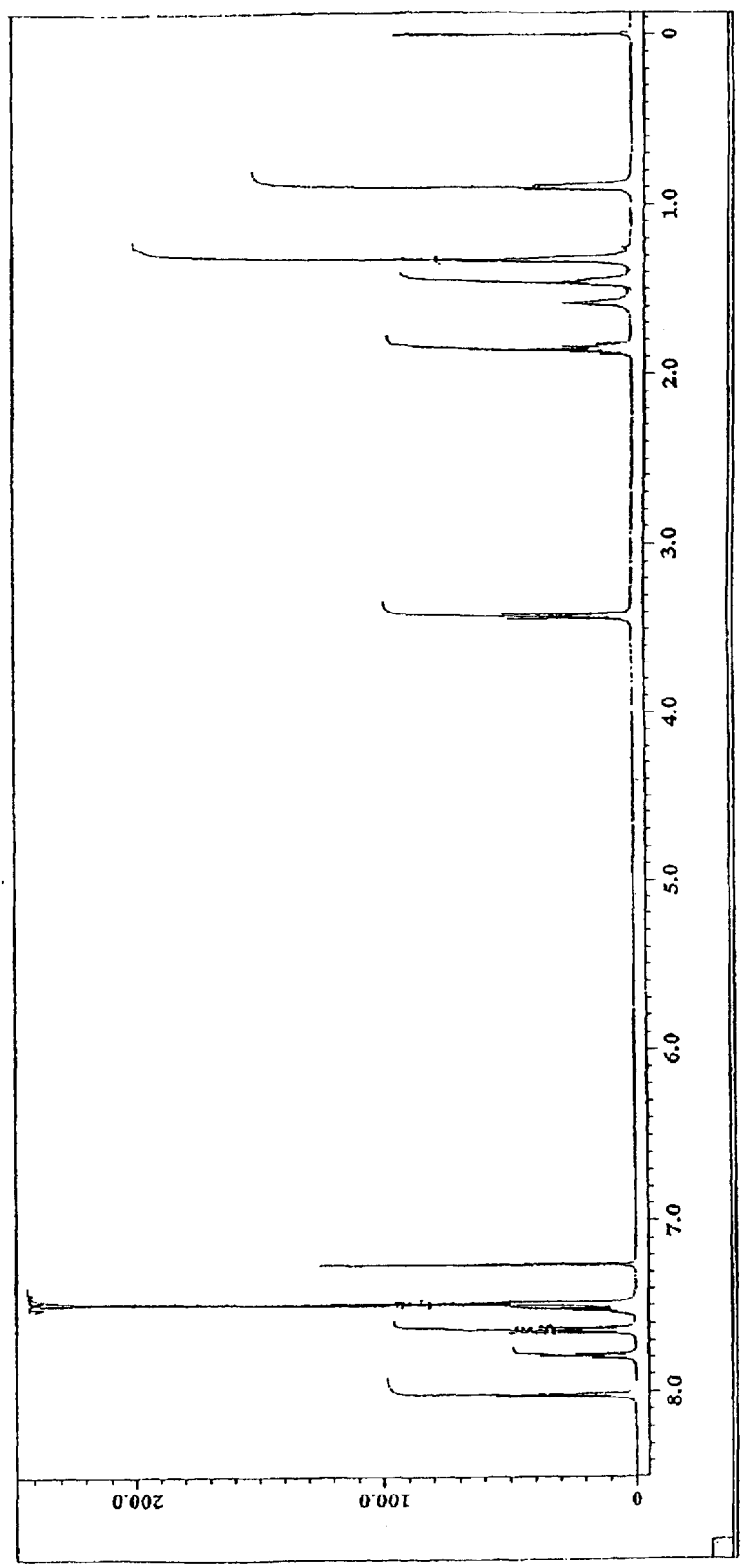
FIG. 19 is a diagram showing results of $^1$H-NMR spectrometry analysis of a sulfonyloxime compound obtained in an example 10.
Figure 20:
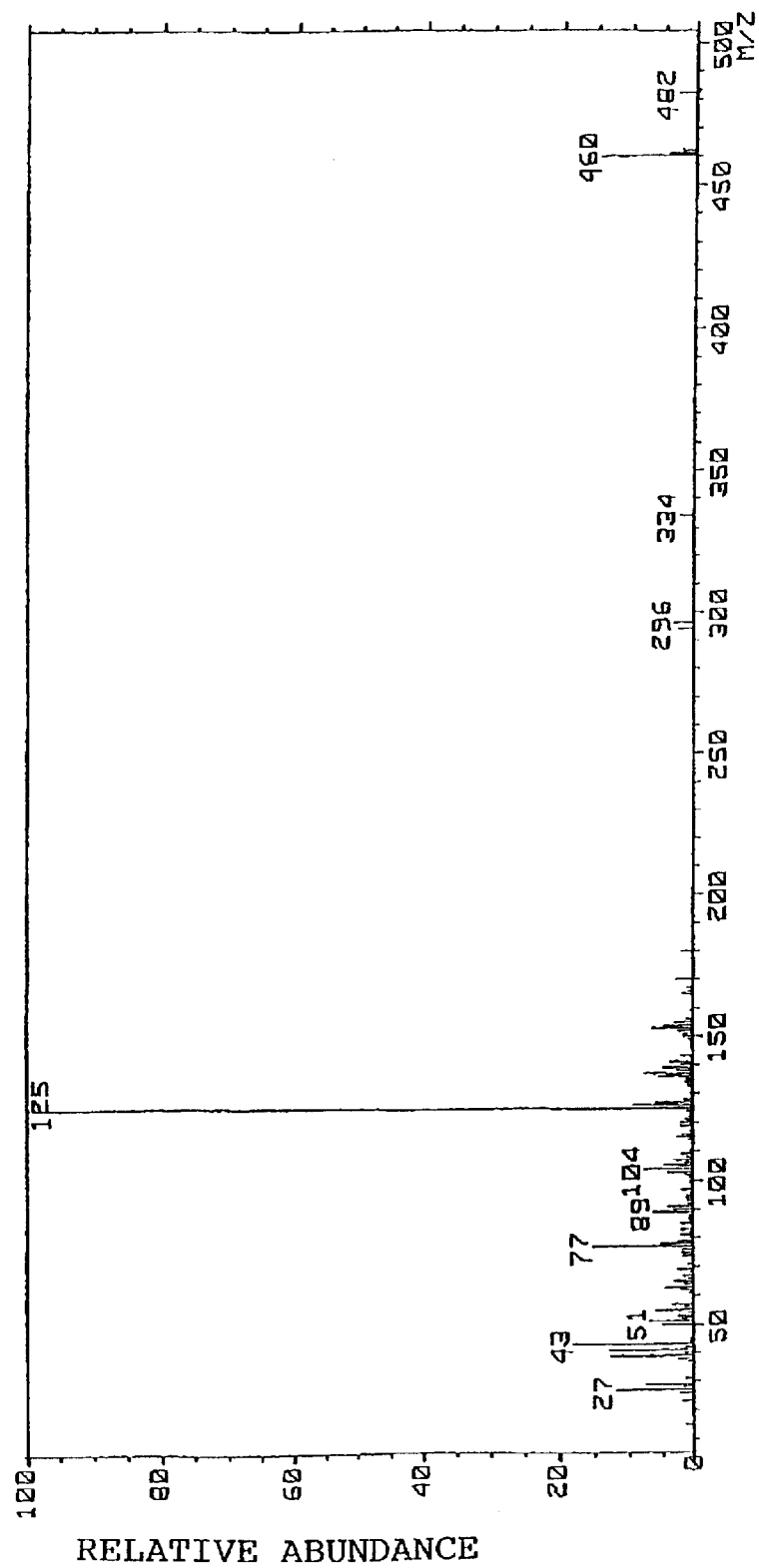
FIG. 20 is a diagram showing results of mass spectrometry analysis for the sulfonyloxime compound obtained in the example 10.

10.00 g of the 2,2-difluoro-2-phenylsulfonylacetophenoneoxime obtained in the synthetic example 1 was dissolved in 92.85 g of methylene chloride in a reaction flask, and following the addition of 11.26 g of hexanesulfonyl chloride, synthesized by known methods, 9.26 g of triethylamine was added dropwise to the solution. The resulting reaction mixture was stirred for 30 minutes at 0° C., and then water was poured into the mixture. Following washing with water, the reaction mixture was extracted into methylene chloride, and the methylene chloride solution was washed sequentially with a 5% aqueous solution of sodium bicarbonate, a 5% aqueous solution of oxalic acid, and then water, and was then dried and dehydrated over anhydrous magnesium sulfate, followed by removal of methylene chloride, with the result that 12.05 g of 2,2-difluoro-2-phenylsulfonylacetophenone-O-(hexyl)sulfonyloxime was yield. This compound is hereafter abbreviated as P-10. The results of $^1$H-NMR and mass spectrometry measurements on this product compound are shown in FIG. 19 and FIG. 20 respectively.

Synthetic Example 3

3.10 g of sodium ethoxide was dissolved in 142.37 g of methanol in a reaction flask, and 21.05 g of hydroxyamine hydrochloride was then added to the solution, followed by 20.0 g of 2,2-difluoro-2-methylsulfonyl-4'-methylacetophenone (manufactured by Daikin Industries Ltd.). The reaction mixture was stirred for 17 hours at 60° C., and then water was poured into the mixture, and the resulting precipitate was collected. This precipitate was dissolved in methanol, and water was added to reform a precipitate, which when collected yielded 19.00 g of 2,2-difluoro-2-methylsulfonyl-4'-methylacetophenoneoxime.

Example 11

Figure 21:
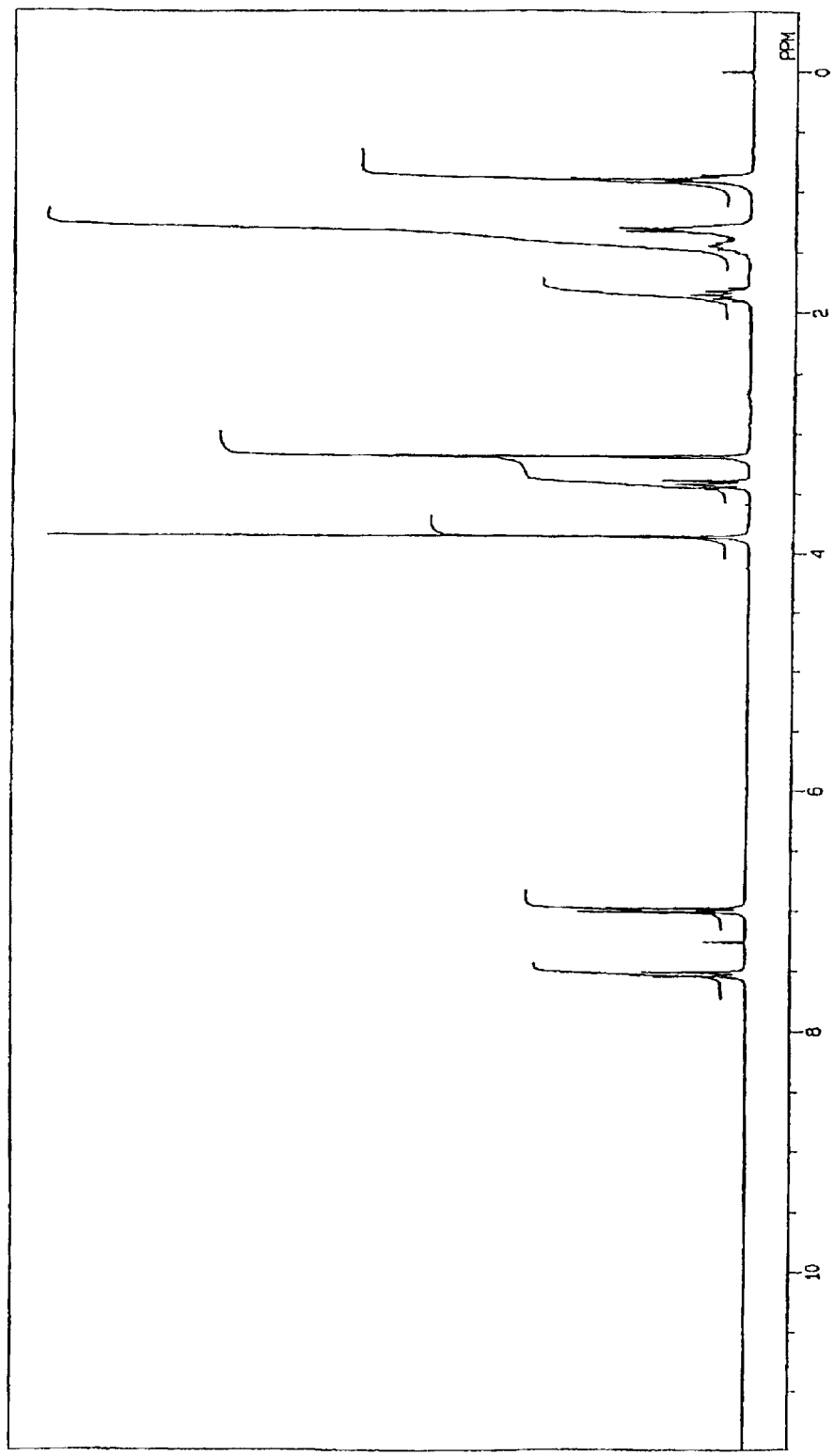
FIG. 21 is a diagram showing results of $^1$H-NMR spectrometry analysis of a sulfonyloxime compound obtained in an example 11.
Figure 22:
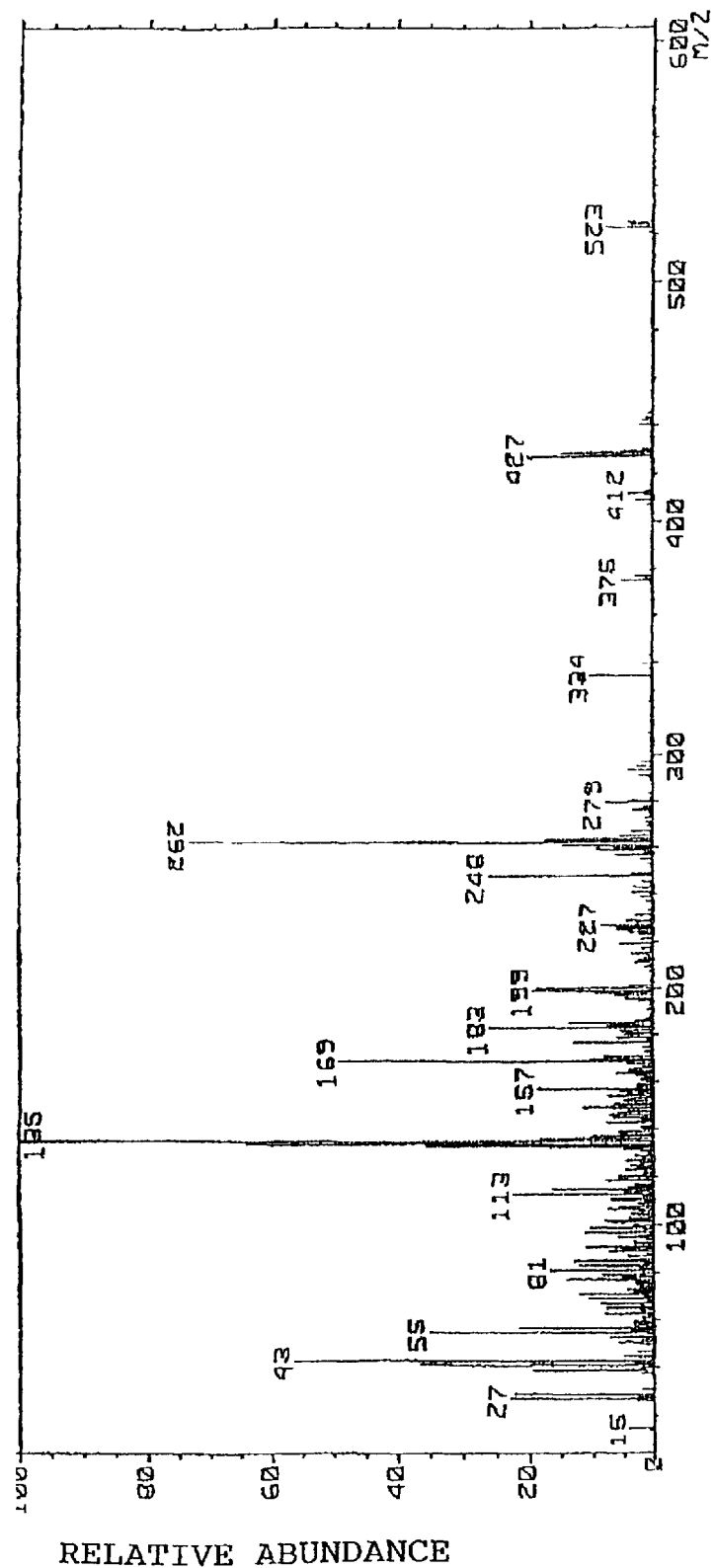
FIG. 22 is a diagram showing results of mass spectrometry analysis for the sulfonyloxime compound obtained in the example 11.

10.00 g of the 2,2-difluoro-2-methylsulfonyl-4'-methylacetophenoneoxime obtained in the synthetic example 3 was dissolved in 409.47 g of methylene chloride in a reaction flask, and following the addition of 12.22 g of pentanesulfonyl chloride, synthesized by known methods, 10.89 g of triethylamine was added dropwise to the solution. The resulting reaction mixture was stirred for 60 minutes at 0° C., and then water was poured into the mixture. Following washing with water, the reaction mixture was extracted into methylene chloride, and the methylene chloride solution was washed sequentially with a 5% aqueous solution of sodium bicarbonate, a 5% aqueous solution of oxalic acid, and then water, and was then dried and dehydrated over anhydrous magnesium sulfate, followed by removal of methylene chloride, with the result that 13.65 g of 2,2-difluoro-2-methylsulfonyl-4'-methylacetophenone-O-(pentyl)sulfonyloxime was yielded. This compound is hereafter abbreviated as P-11. The results of $^1$H-NMR and mass spectrometry measurements on this product compound are shown in FIG. 21 and FIG. 22 respectively.

The $^1$H-NMR spectrometry measurements of the compounds (P-1) to (P-11) were conducted using a JNM-EX270 device (manufactured by Jeol Ltd.) (solvent, CDCl$_3$). The mass spectrometry measurements were conducted under the conditions listed below.

| Device: | JMS-AX505W mass spectrometer manufactured by Jeol Ltd. |
|---|---|
| Emitter current: | 5 mA (gas used: Xe) |
| Acceleration voltage: | 3.0 kV |
| Ion Multi: | 1.3 |
| Ionization method: | Fast atom bombardment (FAB) |

-continued

| Detected ions: | Cation (+) |
|---|---|
| Mass range measured: | 20 to 1500 m/z |
| Scan: | 30 seconds |
| Resolution: | 1500 |
| Matrix: | 3-nitrobenzylalcohol |

Examples 12 to 37, Comparative Examples 1 to 3
(Examples 36 and 37, and Comparative Example 3
Relate to Negative Type Radiation Sensitive Resin
Compositions)

A series of composition solutions were prepared by mixing the constituents shown in Table 1 and Table 2 to form a uniform solution (parts refer to parts by weight), and then filtering each solution through a 0.2 μm Teflon membrane filter with a pore diameter of 0.2 μm.

Subsequently, each composition solution was spin coated onto a silicon wafer, and PB was then performed at the temperature, and for the length of time, shown in Table 3 and Table 4 to form a resist film with a film thickness of 0.5 μm, or a resist film with a film thickness of 0.1 μm (in the case of exposure with a F$_2$ excimer laser). Each resist film was then exposed with a KrF excimer laser (wavelength 248 nm) through a mask pattern with varying amounts of exposure, using a KrF excimer laser irradiation device (brand name NSR-2005 EX8A, manufactured by Nikon Ltd.). Furthermore, in a portion of the examples, the resist film was exposed with either an electron beam with varying amounts of exposure, using a simple electron beam direct writing device (50 KeV) (brand name HL700D-M, (current density 4.5 A) manufactured by Hitachi, Ltd.), or with a F$_2$ excimer laser through a mask pattern with varying amounts of exposure, using a simple F$_2$ excimer laser irradiation device (manufactured by Exitech Ltd.), instead of the KrF excimer laser. Following exposure, PEB was performed at the temperature, and for the length of time, shown in Table 2 and Table 5. Subsequently, using a 2.38% by weight aqueous solution of tetramethylammonium hydroxide as the developing solution, each film was developed for 60 seconds at 23° C., washed in water for 30 seconds, and then dried to complete the formation of the resist pattern.

The results of evaluating each of the examples and the comparative examples are shown in Table 5 and Table 6. However, in the case of exposure with the F$_2$ excimer laser, because the film thickness of the resist film is extremely thin, only the sensitivity and resolution are shown.

Evaluations of each resist were conducted for the major properties described below.

Sensitivity

During formation of the resist pattern by exposure of the resist film formed on a silicon wafer with varying amounts of exposure, post-exposure baking, subsequent alkali developing, washing in water and subsequent drying, the optimum amount of exposure to form a 1:1 line width from a line-and-space pattern (1L1S) with a line width of 0.25 μm was taken as the optimum amount of exposure, and the sensitivity was defined as this optimum amount of exposure.

Resolution

The resolution was defined as the minimum dimensions (μm) of a resist pattern which could be resolved on exposure to the optimum amount of exposure.

Pattern Shape

The lower side dimension La and the upper side dimension Lb of the square cross section of the line-and-space pattern (1L1S) with a line width of 0.25 μm formed on a silicon wafer were measured using a scanning type electron microscope. When the resulting pattern satisfied the requirement $$0.85 \leq Lb/La \leq 1$$

the pattern shape was determined to be good, whereas those patterns that did not satisfy these conditions were determined to be unsatisfactory.

Tailing

Figure 23:
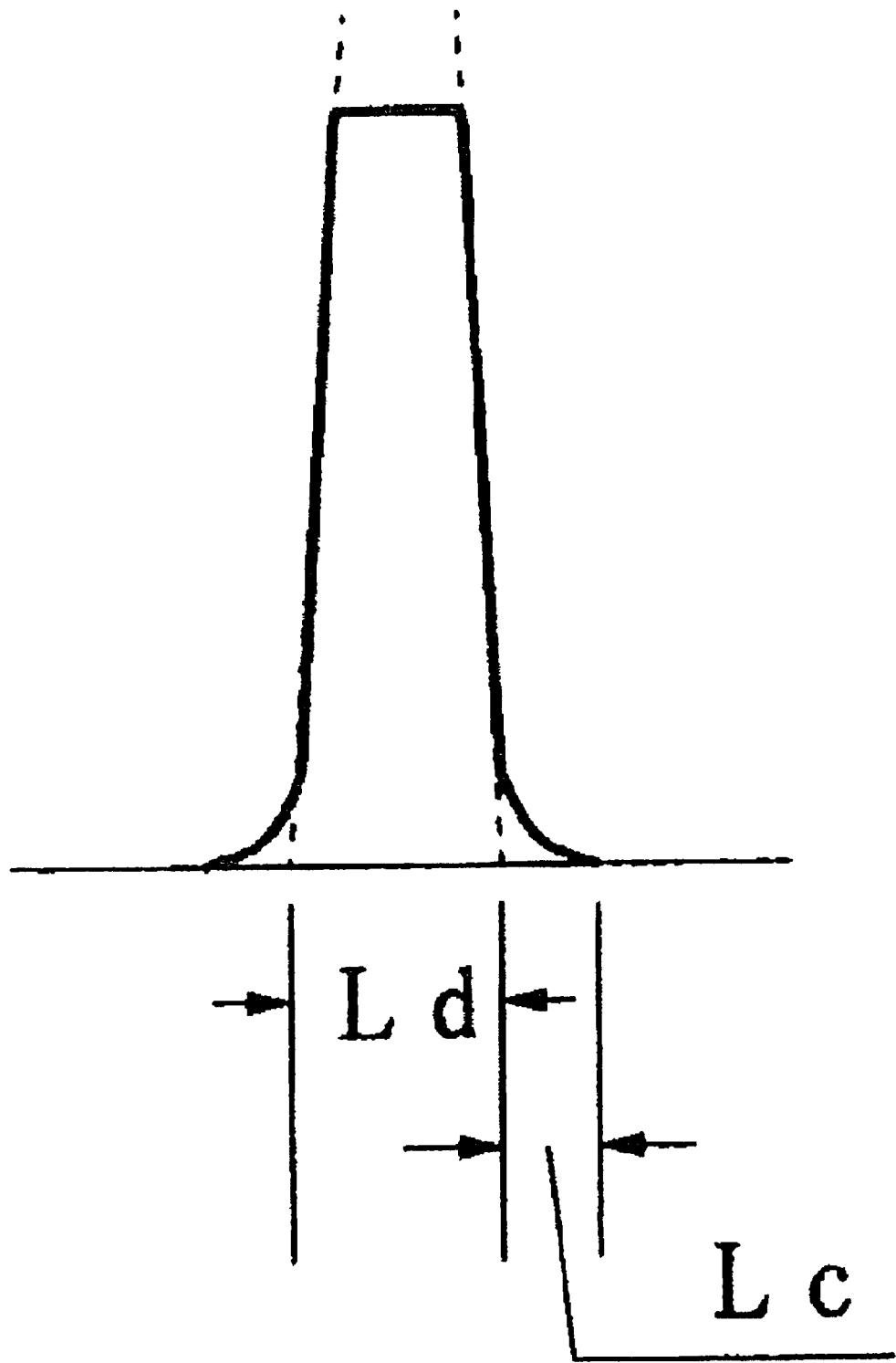
FIG. 23 is a diagram describing the evaluation criterion for line broadening.

For those compositions for which exposure with the optimum amount of exposure produced a good pattern shape for a line-and-space pattern (1L1S) with a line width of 0.25 μm formed on the surface of a silicon wafer, a further resist pattern was formed in an identical manner using a silicon nitride wafer, and a square cross section of the produced line-and-space pattern (1L1S) with a line width of 0.25 μm was inspected using a scanning type electron microscope, and the values of Lc and Ld shown in FIG. 23 were measured. When the resulting pattern satisfied the requirement $$Lc/Ld < 0.05$$

the tailing was determined to be good, whereas those patterns that did not satisfy these conditions were determined to have unsatisfactory tailing.

Nano Edge Roughness

Figure 24:
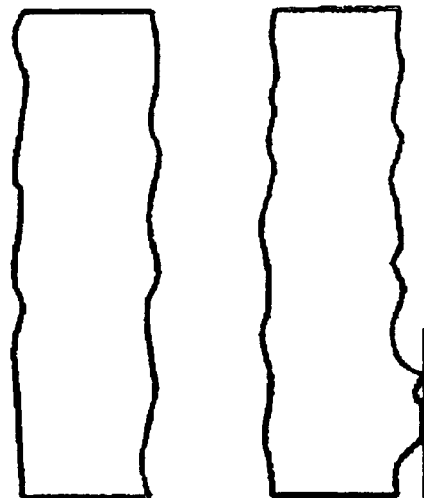
FIG. 24 is a diagram describing the evaluation criterion for nano edge roughness.
Figure 24:
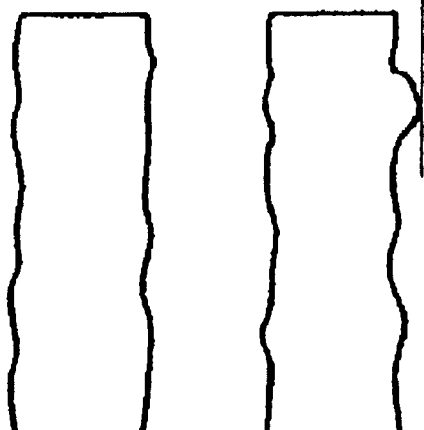

The line pattern of a line-and-space pattern (1L1S) with a designed line width of 0.25 μm was inspected using a scanning type electron microscope, and as shown in FIG. 24, the irregularities along the side surface of the line pattern were inspected, and the difference ΔCD between the actual line width and the design line width of 0.25 μm at the point of maximum irregularity was measured and then evaluated using the criterion below. In FIG. 24, (a) is a plan view of the resist pattern, and (b) is a side view of the resist pattern, and the irregularities have been exaggerated for clarity.

ΔCD of less than 0.01 μm: Good

ΔCD of at least 0.01 μm: Unsatisfactory

Each of the constituents used in the examples and the comparative examples are detailed below.

[I] Positive Type Radiation Sensitive Resin Compositions

Other Acid Generators (a)
- a-1: triphenylsulfonium nonafluoro-n-butanesulfonate
- a-2: bis(4-t-butylphenyl)iodonium 10-camphorsulfonate
- a-3: bis(4-t-butylphenyl)iodonium nonafluoro-n-butanesulfonate
- a-4: bis(cyclohexylsulfonyl)diazomethane
- a-5: bis(1,4-dioxaspiro[4.5]decane-7-sulfonyl) diazomethane
- a-6: bis(t-butylsulfonyl)diazomethane
- a-7: N-(trifluoromethanesulfonyloxy)bicyclo[2.2.1]hept-5-ene-2,3-dicarboxyimide Resin (B)
- B-1: A poly(p-hydroxystyrene) resin in which 34 mol % of the phenolic hydroxyl group hydrogen atoms have been substituted with 1-ethoxyethyl groups (Mw=9,000, Mw/Mn=1.9)
- B-2: A poly(p-hydroxystyrene) resin in which 25 mol % of the phenolic hydroxyl group hydrogen atoms have been substituted with 1-ethoxyethyl groups, and 8 mol % have been substituted with t-butoxycarbonyl groups (Mw=10,000, Mw/Mn=1.1)
- B-3: A poly(p-hydroxystyrene) resin in which 23 mol % of the phenolic hydroxyl group hydrogen atoms have been substituted with 1-ethoxyethyl groups, and 10 mol % have been substituted with t-butyl groups (Mw=12,000, Mw/Mn=1.2)
- B-4: A poly(p-hydroxystyrene) resin in which 30 mol % of the phenolic hydroxyl group hydrogen atoms have been substituted with 1-cyclohexyloxyethyl groups (Mw=18,000, Mw/Mn=1.9)
- B-5: A copolymer of p-hydroxystyrene, styrene and p-t-butoxystyrene (copolymerization molar ratio=72:5:23, Mw=16,000, Mw/Mn=1.7)
- B-6: A poly(p-hydroxystyrene) resin in which 26 mol % of the phenolic hydroxyl group hydrogen atoms have been substituted with t-butoxycarbonyl groups (Mw=9,000, Mw/Mn=1.9)
- B-7: A poly(p-hydroxystyrene) resin in which 25 mol % of the phenolic hydroxyl group hydrogen atoms have been substituted with t-butoxycarbonylmethyl groups (Mw=25,000, Mw/Mn=1.2)
- B-8: A poly(p-hydroxystyrene) resin in which 32 mol % of the phenolic hydroxyl group hydrogen atoms have been substituted with t-butyl groups (Mw=15,000, Mw/Mn=1.7)
- B-9: A copolymer of p-hydroxystyrene, styrene and t-butyl acrylate (copolymerization molar ratio=60:20:20, Mw=12,500, Mw/Mn=1.8)
- B-10: A copolymer of p-hydroxystyrene, p-t-butoxystyrene and 2,5-dimethyl-2,5-hexanediol diacrylate (copolymerization molar ratio=72:25:3, Mw=30,000, Mw/Mn=4.3)
- B-11: A copolymer of p-hydroxystyrene, p-t-butoxystyrene and t-butyl acrylate (copolymerization molar ratio=70:15:15, Mw=16,000, Mw/Mn=1.9)

Solubility Control Agents
- E-1: diphenolic acid
- E-2: 2-hydroxybenzophenone

Acid Diffusion Control Agents
- F-1: n-dodecyldimethylamine
- F-2: tri-n-hexylamine
- F-3: 2-benzylpyridine
- F-4: 2-phenylbenzimidazole
- F-5: triethanolamine
- F-6: tri-n-octylamine Solvents
- S-1: ethyl lactate
- S-2: ethyl ethoxypropionate
- S-3: propylene glycol monomethyl ether acetate
- S-4: 2-heptanone

[II] Negative Type Radiation Sensitive Resin Compositions

Other Acid Generators (a)

The same compounds as those used for the [I] positive type radiation sensitive resin compositions were used.

Alkali-soluble Resins (C)
- C-1: poly(p-hydroxystyrene) (Mw=7,500)
- C-2: A copolymer of p-hydroxystyrene and styrene (copolymerization molar ratio=80:20, Mw=4,000)

Cross-linking Agents (D)
- D-1: dimethoxymethylurea (brand name MX290, manufactured by Sanwa Chemical (Ltd.))
- D-2: tetramethoxymethylglycoluril (brand name CYMEL1174, manufactured by Mitsui Cyanamid (Ltd.))

Acid Diffusion Control Agents

The same compounds as those used for the [I] positive type radiation sensitive resin compositions were used.

Solvents

The same compounds as those used for the [I] positive type radiation sensitive resin compositions were used.

TABLE 1

| | Acid generator (parts) | | Resin (B) | Solubility control agent | Acid diffusion control agent | Solvent |
|---|---|---|---|---|---|---|
| | constituent A | constituent a | (parts) | (parts) | (parts) | (parts) |
| Example | | | | | | |
| 12 | P-1(3) | — | B-1(65) B-6(35) | — | F-2(0.81) | S-3(650) |
| 13 | P-7(4) | — | B-1(65) B-6(35) | — | F-2(1.14) | S-3(650) |
| 14 | P-2(3.5) | — | B-1(70) B-8(30) | — | F-1(1.05) | S-1(195) S-3(455) |
| 15 | P-6(3) | — | B-1(70) B-8(30) | — | F-1(0.92) | S-1(195) S-3(455) |
| 16 | P-8(3.5) | — | B-1(70) B-8(30) | — | F-1(1.07) | S-1(195) S-3(455) |
| 17 | P-2(1) | a-2(2) a-3(2) | B-9(100) | — | F-2(0.52) F-4(0.28) | S-1(455) S-2(195) |
| 18 | P-3(1) | a-2(2) a-3(2) | B-9(100) | — | F-2(0.48) F-4(0.18) | S-1(455) S-2(195) |
| 19 | P-4(4) P-7(2) | — | B-6(80) B-7(20) | — | F-3(0.67) | S-1(195) S-3(455) |
| 20 | P-3(2) | — | B-6(100) | — | F-4(0.26) F-5(0.25) | S-1(455) S-2(195) |
| 21 | P-3(3) P-4(2) | — | B-2(100) | E-1(5) | F-5(0.91) | S-1(195) S-3(455) |
| 22 | P-7(2.5) | — | B-3(100) | — | F-5(0.32) F-6(0.44) | S-1(195) S-3(455) |
| 23 | P-1(4.5) | — | B-4(70) B-6(30) | — | F-1(1.21) | S-1(195) S-3(455) |
| 24 | P-6(3) | a-7(6) | B-5(100) | — | F-4(0.78) | S-1(455) S-3(195) |
| 25 | P-5(1.5) | a-2(3) a-7(3) | B-11(100) | — | F-3(0.22) F-4(0.47) | S-1(455) S-2(195) |
| 26 | P-2(3) | a-2(1) | B-1(50) B-6(50) | E-2(5) | F-4(0.41) F-6(0.21) | S-4(650) |
| 27 | P-8(3) | a-2(1) | B-1(50) B-6(50) | E-2(5) | F-4(0.25) F-6(0.43) | S-4(650) |
| 28 | P-4(2) | a-1(1) a-7(6) | B-10(100) | — | F-4(0.61) | S-1(455) S-3(195) |
| 29 | P-1(2) P-3(2) | a-6(2) | B-2(100) | — | F-3(1.17) | S-3(650) |
| 30 | P-7(4) | a-1(0.5) | B-3(100) | — | F-1(1.08) | S-1(195) |
| 31 | P-2(2.5) P-3(1.5) | a-2(1) a-5(2) | B-2(60) B-3(40) | — | F-4(0.57) F-5(0.38) | S-1(195) S-3(455) |
| 32 | P-7(4) | a-1(2) | B-5(100) | — | F-1(0.82) F-5(0.30) | S-1(455) S-3(195) |
| 33 | P-9(5) | — | B-3(100) | — | F-4(0.1) | S-1(195) S-3(455) |
| 34 | P-10(5) | — | B-3(100) | — | F-4(0.1) | S-1(195) S-3(455) |
| 35 | P-6(3) | a-1(2) | B-1(80) B-8(20) | — | F-6(1.21) | S-1(195) S-3(455) |
| Comparative example | | | | | | |
| 1 | — | a-4(6) | B-1(65) B-6(35) | — | F-6(0.42) | S-3(650) |
| 2 | — | a-2(2) a-3(2) | B-9(100) | — | F-2(0.35) | S-1(455) S-2(195) |

TABLE 2

| | Acid generator (parts) | | Alkali-soluble resin (C) | Cross-linking agent (D) | Acid diffusion control agent | Solvent |
|---|---|---|---|---|---|---|
| | constituent A | constituent a | (parts) | (parts) | (parts) | (parts) |
| Example | | | | | | |
| 36 | P-1(2) | — | C-1(50) | D-1(7) | F-1(132) | S-1(420) |
| | P-7(2) | | C-2(50) | | | S-2(180) |
| 37 | P-2(5) | — | C-1(50) | D-2(7) | F-2(1.25) | S-1(420) |
| | | | C-2(50) | | | S-2(180) |
| Comparative example | | | | | | |
| 3 | | a-1(3) | C-1(50) | D-1(7) | F-6(0.50) | S-1(420) |
| | | | C-2(50) | | | S-2(180) |

TABLE 3

| | PB | | | PEB | |
|---|---|---|---|---|---|
| | temperature (° C.) | time (seconds) | Exposure light source | temperature (° C.) | time (seconds) |
| Example | | | | | |
| 36 | 90 | 90 | KrF excimer laser | 100 | 90 |
| 37 | 90 | 90 | KrF excimer laser | 90 | 90 |
| Comparative example | | | | | |
| 3 | 90 | 90 | KrF excimer laser | 90 | 90 |

TABLE 4

| | PB | | | PEB | |
|---|---|---|---|---|---|
| | temperature (° C.) | time (seconds) | Exposure light source | temperature (° C.) | time (seconds) |
| Example | | | | | |
| 12 | 100 | 90 | KrF excimer laser | 110 | 90 |
| 13 | 100 | 90 | KrF excimer laser | 110 | 90 |
| 14 | 100 | 90 | KrF excimer laser | 110 | 60 |
| 15 | 100 | 90 | KrF excimer laser | 110 | 60 |
| 16 | 100 | 60 | KrF excimer laser | 110 | 60 |
| 17 | 130 | 90 | KrF excimer laser | 130 | 90 |
| 18 | 130 | 90 | KrF excimer laser | 130 | 90 |
| 19 | 100 | 90 | KrF excimer laser | 110 | 90 |
| 20 | 100 | 90 | KrF excimer laser | 100 | 90 |
| 21 | 100 | 90 | KrF excimer laser | 100 | 90 |
| 22 | 100 | 90 | KrF excimer laser | 110 | 90 |
| 23 | 100 | 90 | KrF excimer laser | 100 | 90 |
| 24 | 130 | 60 | KrF excimer laser | 130 | 90 |
| 25 | 130 | 60 | KrF excimer laser | 120 | 90 |
| 26 | 100 | 90 | KrF excimer laser | 110 | 90 |
| 27 | 100 | 90 | KrF excimer laser | 110 | 90 |
| 28 | 130 | 90 | KrF excimer laser | 130 | 90 |
| 29 | 100 | 60 | KrF excimer laser | 110 | 60 |
| 30 | 100 | 90 | KrF excimer laser | 100 | 90 |
| 31 | 100 | 90 | KrF excimer laser | 110 | 90 |
| 32 | 130 | 90 | electron beam | 110 | 90 |
| 33 | 100 | 90 | electron beam | 110 | 90 |
| 34 | 100 | 90 | electron beam | 110 | 90 |
| 35 | 100 | 90 | $F_2$ excimer laser | 110 | 90 |
| Comparative example | | | | | |
| 1 | 100 | 90 | KrF excimer laser | 110 | 90 |
| 2 | 130 | 90 | KrF excimer laser | 110 | 90 |

TABLE 5

| Sensitivity | Resolution (μm) | Pattern shape | Line broadening | Roughness |
|---|---|---|---|---|
| Example | | | | |
| 12 | 31 mJ/cm² | 0.21 μm | Good | Good | Good |
| 13 | 32 mJ/cm² | 0.21 μm | Good | Good | Good |
| 14 | 32 mJ/cm² | 0.21 μm | Good | Good | Good |
| 15 | 31 mJ/cm² | 0.21 μm | Good | Good | Good |
| 16 | 33 mJ/cm² | 0.21 μm | Good | Good | Good |
| 17 | 33 mJ/cm² | 0.22 μm | Good | Good | Good |
| 18 | 34 mJ/cm² | 0.22 μm | Good | Good | Good |
| 19 | 32 mJ/cm² | 0.22 μm | Good | Good | Good |
| 20 | 32 mJ/cm² | 0.22 μm | Good | Good | Good |
| 21 | 34 mJ/cm² | 0.21 μm | Good | Good | Good |
| 22 | 31 mJ/cm² | 0.22 μm | Good | Good | Good |
| 23 | 34 mJ/cm² | 0.22 μm | Good | Good | Good |
| 24 | 34 mJ/cm² | 0.21 μm | Good | Good | Good |
| 25 | 32 mJ/cm² | 0.21 μm | Good | Good | Good |
| 26 | 33 mJ/cm² | 0.21 μm | Good | Good | Good |
| 27 | 31 mJ/cm² | 0.21 μm | Good | Good | Good |
| 28 | 34 mJ/cm² | 0.22 μm | Good | Good | Good |
| 29 | 35 mJ/cm² | 0.22 μm | Good | Good | Good |
| 30 | 32 mJ/cm² | 0.21 μm | Good | Good | Good |
| 31 | 33 mJ/cm² | 0.21 μm | Good | Good | Good |
| 32 | 4.2 μC/cm² | 0.10 μm | Good | Good | Good |
| 33 | 4.8 μC/cm² | 0.10 μm | Good | Good | Good |
| 34 | 4.8 μC/cm² | 0.10 μm | Good | Good | Good |
| 35 | 21 mJ/cm² | 0.21 μm | Good | Good | — |
| Comparative example | | | | |
| 1 | 36 mJ/cm² | 0.22 μm | Good | Good | Unsatisfactory |
| 2 | 34 mJ/cm² | 0.23 μm | Good | Unsatisfactory | Unsatisfactory |

TABLE 6

| Sensitivity | Resolution (μm) | Pattern shape | Roughness |
|---|---|---|---|
| Example | | | |
| 36 | 42 mJ/cm² | 0.22 μm | Good | Good |
| 37 | 44 mJ/cm² | 0.22 μm | Good | Good |
| Comparative example | | | |
| 3 | 45 mJ/cm² | 0.22 μm | Good | Unsatisfactory |

A sulfonyloxime compound of the present invention functions as an acid generator which is sensitive to activated radiation such as KrF excimer lasers, ArF excimer lasers or F₂ excimer lasers, far ultraviolet radiation typified by EUV, or electron beams and the like, and displays superior heat stability and storage stability. Furthermore, a positive type radiation sensitive resin composition or a negative type radiation sensitive resin composition using such a sulfonyloxime as a radiation sensitive acid generator can be used for generating a resist pattern with good sensitivity and superior smoothness of the surface and side walls thereof. Consequently, a radiation sensitive resin composition of the present invention is extremely useful in the generation of chemically amplified resists used in the manufacture of semiconductor devices, especially considering the move towards even greater miniaturization within this industry.

What is claimed is:

1. A sulfonyloxime compound represented by a general formula (1) shown below,

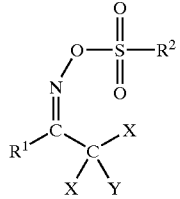
(1)

wherein, $R^1$ represents a hydrogen atom, or a substituted or unsubstituted alkyl group of 1 to 20 carbon atoms, substituted or unsubstituted aryl group, or substituted or unsubstituted heteroaryl group, $R^2$ represents a substituted or unsubstituted alkyl group of 1 to 20 carbon atoms, substituted or unsubstituted aryl group, or substituted or unsubstituted heteroaryl group, X represents a halogen atom, Y represents —$R^3$, a —CO—$R^3$ group, —COO—$R^3$ group, —CONR³R⁴ group, —S—$R^3$ group, —SO₂—$R^3$ group, a —CN group or a —NO₂ group, and $R^3$ and $R^4$ within said Y group each represent, independently, a hydrogen atom, or a substituted or unsubstituted alkyl group of 1 to 20 carbon atoms, substituted or unsubstituted aryl group, or substituted or unsubstituted heteroaryl group, with the proviso that, when Y is —$R^3$, $R^3$ represents a hydrogen atom, an unsubstituted alkyl group of 1 to 20 carbon atoms, a substituted or unsubstituted aryl group, or a substituted or unsubstituted heteroaryl group, and including cases in which any two of $R^1$, $R^2$ and $R^3$ are bonded together to form a cyclic structure having formula (2-1), formula (2-2) or formula (2-3) below,

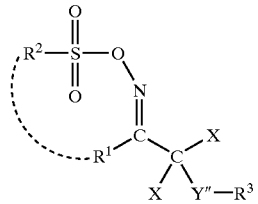
(2-1)

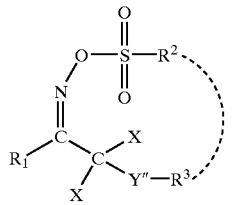
(2-2)

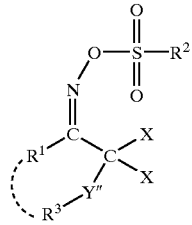
(2-3)

wherein, Y″ represents a single bond or a bivalent group formed when said $R^3$ group is removed from said Y group, and dimers represented by formula (3-1), formula (3-2) or formula (3-3) shown below, in which one of said groups $R^1$, $R^2$ or Y functions as a linkage group R¹', R²' or Y respectively

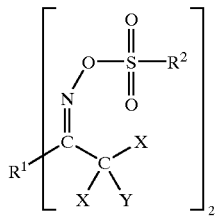

(3-1)

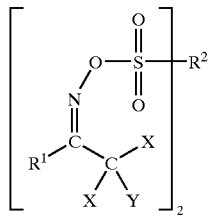

(3-2)

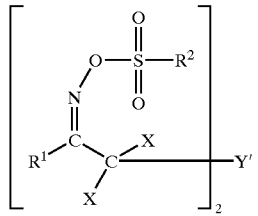

(3-3)

wherein, R¹', R²' and Y' each represent a bivalent group formed by bonding together residues generated by dissociating one atom or group from two separate R¹, R² or Y groups belonging to separate molecules.

2. The compound according to claim 1, wherein in said general formula (1), R¹ represents a substituted or unsubstituted aryl group, R² represents an substituted or unsubstituted alkyl group with 1–20 carbon atoms, Y represents —R³, a —CONR³R⁴ group, a —SO—R³ group, a —SO—R³ group, or a —NO₂ group, and X represents a fluorine or chlorine atom.

3. The compound according to claim 1, wherein in the general formula (1) R¹ represents a substituted or unsubstituted phenyl group, R² represents a substituted or unsubstituted alkyl group with 3–8 carbon atoms, X represents a fluorine atom, Y represents —SO₂—R³ group or a —NO₂ group.

4. The compound according to claim 1, wherein said sulfonyloxime compound is any one of 2,2-difluoro-2-methylacetophenone-O-methylsulfonyloxime, 2,2-dichloro-2-methoxymethyl-2'-methylacetophenone-O-(n-propyl)sulfonyloxime, 2,2-difluoro-2-ethylacetophenone-O-(n-propyl)sulfonyloxime, 2,2-difluoro-2-phenylacetophenone-O-ethylsulfonyloxime, 2-chloro-2-fluoro-2-cyclohexylacetophenone-O-(p-methylphenyl)sulfonyloxime, 2,2-difluoro-2-propylacetophenone-O-camphorsulfonyloxime, 2,2-difluoro-2-methyl-4'-methoxyacetophenone-O-(n-propyl)sulfonyloxime, 2,2-difluoro-2-methylacetonaphthone-O-trifluoromethylsulfonyloxime, 1,1-difluoro-1-phenylacetone-O-(n-butyl)sulfonyloxime, (1,1-difluoro-1-cyclohexyl)methyl-2'-thienylketone-O-methylsulfonyloxime, (1,1-dichloro-1-phenyl)methyl-2'-furylketone-O-propylsulfonyloxime, 2,2-difluoro-2-methylcarbonylacetophenone-O-methylsulfonyloxime, 2,2-dichloro-2-methoxymethylcarbonyl-2'-methylacetophenone-O-(n-propyl)sulfonyloxime, 2,2-difluoro-2-ethylcarbonylacetophenone-O-(n-propyl)sulfonyloxime, 2,2-difluoro-2-phenylcarbonylacetophenone-O-ethylsulfonyloxime, 2-chloro-2-fluoro-2-cyclohexylcarbonylacetophenone-O-(p-methylphenyl)sulfonyloxime, 2,2-difluoro-2-propylcarbonylacetophenone-O-camphorsulfonyloxime, 2,2-difluoro-2-methylcarbonyl-4'-methoxyacetophenone-O-(n-propyl)sulfonyloxime, 2,2-difluoro-2-methylcarbonylacetonaphthone-O-trifluoromethylsulfonyloxime, 1,1-difluoro-1-phenylcarbonylacetone-O-(n-butyl)sulfonyloxime, (1,1-difluoro-1-cyclohexylcarbonyl)methyl-2'-thienylketone-O-methylsulfonyloxime, (1,1-dichloro-1-phenylcarbonyl)methyl-2'-furylketone-O-propylsulfonyloxime, 2,2-difluoro-2-methoxycarbonylacetophenone-O-methylsulfonyloxime, 2,2-difluoro-2-ethoxycarbonylacetophenone-O-(n-propyl)sulfonyloxime, 2,2-difluoro-2-phenoxycarbonylacetophenone-O-ethylsulfonyloxime, 2-chloro-2-fluoro-2-cyclohexyloxycarbonylacetophenone-O-(p-methylphenyl)sulfonyloxime, 2,2-difluoro-2-propoxycarbonylacetophenone-O-camphorsulfonyloxime, 2,2-difluoro-2-methoxycarbonyl-4'-methoxyacetophenone-O-(n-propyl)sulfonyloxime, 2,2-difluoro-2-methoxycarbonylacetonaphthone-O-trifluoromethylsulfonyloxime, 1,1-difluoro-1-phenoxycarbonylacetone-O-(n-butyl)sulfonyloxime, (1,1-dichloro-1-cyclohexyloxycarbonyl)methyl-2'-thienylketone-O-methylsulfonyloxime, (1,1-difluoro-1-phenoxycarbonyl)methyl-2'-furylketone-O-propylsulfonyloxime, 2,2-difluoro-2-(N,N-dimethylamide)acetophenone-O-methylsulfonyloxime, 2,2-difluoro-2-(N-ethylamide)-2'-methyl-acetophenone-O-(n-propyl)sulfonyloxime, 2,2-difluoro-2-(N-phenylamide)acetophenone-O-ethylsulfonyloxime, 2-chloro-2-fluoro-2-(N-methyl-N-cyclohexylamide)acetophenone-O-(p-methylphenyl)sulfonyloxime, 2,2-difluoro-2-(N-propylamide)acetophenone-O-camphorsulfonyloxime, 2,2-difluoro-2-(N-methyl-N-cyclohexylamide)-4'-methoxyacetophenone-O-(n-propyl)sulfonyloxime, 2,2-difluoro-2-(N,N-dimethylamide)acetonaphthone-O-trifluoromethylsulfonyloxime, 1,1-difluoro-1-(N-phenylamide)acetone-O-(n-butyl)sulfonyloxime, (1,1-difluoro-1-(N-cyclohexylamide))methyl-2'-thienylketone-O-methylsulfonyloxime, (1,1-dichloro-1-(N-phenylamide))methyl-2'-furylketone-O-propylsulfonyloxime, 2,2-difluoro-2-thiomethoxyacetophenone-O-methylsulfonyloxime, 2,2-difluoro-2-thioethoxyacetophenone-O-(n-propyl)sulfonyloxime, 2,2-difluoro-2-thiophenoxyacetophenone-O-ethylsulfonyloxime, 2-chloro-2-fluoro-2-thiocyclohexyloxyacetophenone-O-(p-methylphenyl)sulfonyloxime, 2,2-difluoro-2-thiomethoxy-4'-methoxyacetophenone-O-(n-propyl)sulfonyloxime, 2,2-difluoro-2-thiomethoxyacetonaphthone-O-trifluoromethylsulfonyloxime, 1,1-difluoro-1-thiophenoxyacetone-O-(n-butyl)sulfonyloxime, (1,1-difluoro-1-thiocyclohexyloxy)methyl-2'-thienylketone-O-methylsulfonyloxime, (1,1-dichloro-1-thiophenoxy)methyl-2'-furylketone-O-propylsulfonyloxime, 2,2-difluoro-2-methylsulfinylacetophenone-O-methylsulfonyloxime, 2,2-difluoro-2-ethylsulfinylacetophenone-O-(n-propyl)sulfonyloxime, 2,2-difluoro-2-phenylsulfinylacetophenone-O-ethylsulfonyloxime, 2-chloro-2-fluoro-2-cyclohexylsulfinylacetophenone-O-(p-methylphenyl)sulfonyloxime, 2,2-difluoro-2-propylsulfinylacetophenone-O-camphorsulfonyloxime, 2,2-difluoro-2-methylsulfinyl-4'- methoxyacetophenone-O-(n-propyl)sulfonyloxime, 2,2-difluoro-2-methylsulfinylacetonaphthone-O-trifluoromethylsulfonyloxime, 1,1-difluoro-1-phenylsulfinylacetone-O-(n-butyl)sulfonyloxime, (1,1-difluoro-1-cyclohexylsulfinyl)methyl-2'-thienylketone-O-methylsulfonyloxime, (1,1-dichloro-1-phenylsulfinyl)methyl-2'-furylketone-O-propylsulfonyloxime, 2,2-difluoro-2-phenylsulfonylacetophenone-O-(n-propyl)sulfonyloxime, 2,2-difluoro-2-phenylsulfonylacetophenone-O-(n-hexyl)sulfonyloxime, 2,2-difluoro-2-phenylsulfonylacetophenone (n-pentyl)sulfonyloxime, 2,2-difluoro-2-phenylsulfonylacetophenone-O-methylsulfonyloxime, 2,2-difluoro-2-phenylsulfonylacetophenone-O-ethylsulfonyloxime, 2,2-dichloro-2-phenylsulfonylacetophenone-O-methylsulfonyloxime, 2,2-difluoro-2-phenylsulfonylacetophenone-O-camphorsulfonyloxime, 2,2-difluoro-2-phenylsulfonylacetophenone-O-(p-methylphenyl)sulfonyloxime, 2,2-difluoro-2-phenylsulfonylacetophenone-O-trifluoromethylsulfonyloxime, 2,2-difluoro-2-phenylsulfonyl-4'-methoxyacetophenone-O-(n-propyl)sulfonyloxime, 2,2-difluoro-2-phenylsulfonyl-4'-methoxyacetophenone-O-methylsulfonyloxime, 2,2-difluoro-2-phenylsulfonyl-4'-methoxyacetophenone-O-ethylsulfonyloxime, 2,2-dichloro-2-phenylsulfonyl-4'-methoxyacetophenone-O-methylsulfonyloxime, 2,2-difluoro-2-phenylsulfonyl-4'-methoxyacetophenone-O-camphorsulfonyloxime, 2,2-difluoro-2-phenylsulfonyl-4'-methoxyacetophenone-O-(p-methylphenyl)sulfonyloxime, 2,2-difluoro-2-phenylsulfonyl-4'-methoxyacetophenone-O-trifluoromethylsulfonyloxime, 2,2-difluoro-2-phenylsulfonyl-2'-methylacetophenone-O-(n-propyl)sulfonyloxime, 2,2-difluoro-2-phenylsulfonyl-2'-methylacetophenone-O-methylsulfonyloxime, 2,2-difluoro-2-phenylsulfonyl-2'-methylacetophenone-O-ethylsulfonyloxime, 2,2-dichloro-2-phenylsulfonyl-2'-methylacetophenone-O-methylsulfonyloxime, 2,2-difluoro-2-phenylsulfonyl-2'-methylacetophenone-O-camphorsulfonyloxime, 2,2-difluoro-2-cyclohexylsulfonylacetophenone-O-(n-propyl)sulfonyloxime, 2,2-difluoro-2-cyclohexylsulfonylacetophenone-O-methylsulfonyloxime, 2,2-difluoro-2-cyclohexylsulfonylacetophenone-O-ethylsulfonyloxime, 2,2-dichloro-2-cyclohexylsulfonylacetophenone-O-methylsulfonyloxime, 2,2-difluoro-2-cyclohexylsulfonylacetophenone-O-camphorsulfonyloxime, 2,2-difluoro-2-cyclohexylsulfonylacetophenone-O-trifluoromethylsulfonyloxime, 2,2-difluoro-2-methylsulfonyl-4'-methoxyacetophenone-O-(n-propyl)sulfonyloxime, 2,2-difluoro-2-methylsulfonyl-4'-methoxyacetophenone-O-(n-hexyl)sulfonyloxime, 2,2-difluoro-2-methylsulfonyl-4'-methoxyacetophenone-O-(n-pentyl)sulfonyloxime, 2,2-difluoro-2-methylsulfonyl-4'-methoxyacetophenone-O-methylsulfonyloxime, 2,2-difluoro-2-methylsulfonyl-4'-methoxyacetophenone-ethylsulfonyloxime, 2,2-dichloro-2-methylsulfonyl-4'-methoxyacetophenone-O-methylsulfonyloxime, 2,2-difluoro-2-methylsulfonyl-4'-methoxyacetophenone-O-camphorsulfonyloxime, 2,2-difluoro-2-methylsulfonyl-4'-methoxyacetophenone-O-trifluoromethylsulfonyloxime, 2,2-dibromo-2-phenylsulfonylacetophenone-O-camphorsulfonyloxime, 2-chloro-2-fluoro-2-phenylsulfonylacetophenone-O-ethylsulfonyloxime, 2-chloro-2-fluoro-2-phenylsulfonylacetophenone-O-benzylsulfonyloxime, 2,2-difluoro-2-phenylsulfonylacetophenone-O-(1-naphthyl)sulfonyloxime, 2,2-dichloro-2-methylsulfonylacetophenone-O-(p-bromophenyl)sulfonyloxime, 2,2-difluoro-2-phenylsulfonylacetophenone-O-(2-thienyl)sulfonyloxime, 2,2-difluoro-2-cyclohexylsulfonyl-2'-cyanoacetophenone-O-ethylsulfonyloxime, 2,2-difluoro-2-ethylsulfonylacetophenone-O-(n-propyl)sulfonyloxime, 2,2-difluoro-2-propylsulfonylacetophenone-O-camphorsulfonyloxime, 2,2-difluoro-2-methylsulfonylacetonaphthone-O-trifluoromethylsulfonyloxime, 1,1-difluoro-1-phenylacetone-O-(n-butyl)sulfonyloxime, (1,1-difluoro-1-cyclohexyl)methylsulfonyl-2'-thienylketone-O-methylsulfonyloxime, (1,1-dichloro-1-phenyl)methylsulfonyl-2'-furylketone-O-propylsulfonyloxime, 2,2-difluoro-2-cyanoacetophenone-O-methylsulfonyloxime, 2,2-dichloro-2-cyano-2'-methylacetophenone-O-(n-propyl)sulfonyloxime, 2,2-difluoro-2-cyanoacetophenone-O-ethylsulfonyloxime, 2-chloro-2-fluoro-2-cyanoacetophenone-O-(p-methylphenyl)sulfonyloxime, 2,2-difluoro-2-cyanoacetophenone-O-camphorsulfonyloxime, 2,2-difluoro-2-cyano-4'-methoxyacetophenone-O-(n-propyl)sulfonyloxime, 2,2-difluoro-2-cyanoacetonaphthone-O-trifluoromethylsulfonyloxime, 1,1-difluoro-1-cyanoacetone-O-(n-butyl)sulfonyloxime, (1,1-difluoro-1-cyano)methyl-2'-thienylketone-O-methylsulfonyloxime, (1,1-dichloro-1-cyano)methyl-2'-furylketone-O-propylsulfonyloxime, 2,2-difluoro-2-nitroacetophenone-O-methylsulfonyloxime, 2,2-dichloro-2-nitro-2'-methylacetophenone-O-(n-propyl)sulfonyloxime, 2,2-difluoro-2-nitroacetophenone-O-ethylsulfonyloxime, 2-chloro-2-fluoro-2-nitroacetophenone-O-(p-methylphenyl)sulfonyloxime, 2,2-difluoro-2-nitroacetophenone-O-camphorsulfonyloxime, 2,2-difluoro-2-nitro-4'-methoxyacetophenone-O-(n-propyl)sulfonyloxime, 2,2-difluoro-2-nitroacetonaphthone-O-trifluoromethylsulfonyloxime, 1,1-difluoro-1-nitroacetone-O-(n-butyl)sulfonyloxime, (1,1-difluoro-1-nitro)methyl-2'-thienylketone-O-methylsulfonyloxime, (1,1-dichloro-1-nitro)methyl-2'-furylketone-O-propylsulfonyloxime, 2,2-dioxo-5-phenylsulfonyldifluoromethyl-3H,4H-1,2,5-oxathiazine, 2,2-dioxo-4,4-difluoro-5-phenyl-3H-1,2,5-oxathiazine, 1,1-dioxo-2,2-difluoro-3-propylsulfonyloxyiminothiazine, 2,2-difluoro-1,3-di(phenylsulfonyl)-1,3-propanediol-O-(n-propylsulfonyl)dioxime, 1,1,5,5-tetrafluoro-1,5-di(methylsulfonyl)-2,4-pentanedione-O,O-dimethylsulfonyldioxime, bis(2',2'-difluoro-2'-cyanoacetophenoneoxime)-O-1,4-benzenesulfonic acid, 1,4-bis(1'-propylsulfonyloxyimino)-2',2'-difluoro-2'-(methylsulfonyl)ethyl)benzene, and 1,1,4,4-tetrafluoro-1,4-di(methylsulfonyl)-2,3-butanedione-O,O-dimethylsulfonyldioxime.

5. A radiation sensitive acid generator comprising a sulfonyloxime compound represented by said general formula (1) as defined in claim 1.

6. A chemically amplified positive type radiation sensitive resin composition comprising (A) a radiation sensitive acid generator comprising a sulfonyloxime compound represented by said general formula (1) as defined in claim 1, and (B) an alkali insoluble or alkali sparingly soluble resin protected with an acid dissociable group, which becomes alkali-soluble on dissociation of said acid dissociable group.

7. The composition according to claim 6, wherein said alkali insoluble or alkali sparingly soluble resin protected with said acid dissociable group is a resin in which a hydrogen atom of an acidic functional group within an alkali-soluble resin containing at least one type of acidic functional group is substituted with at least one type of acid dissociable group which can be dissociated in presence of an acid.

8. The composition according to claim 7, wherein said alkali-soluble resin is either one of an addition polymerization type resin with at least one type of repeating unit represented by any of formulas (7-1) to (7-3) shown below, and a condensation polymerization type resin with at least one type of repeating unit represented by a formula (7-4) shown below:

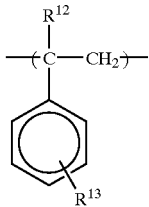
(7-1)

wherein in formula (7-1), $R^{12}$ represents a hydrogen atom or a methyl group, $R^{13}$ represents an —OH, —COOH, —$R^{14}$COOH, —O$R^{14}$OOH, or —OCO$R^{14}$COOH group wherein $R^{14}$ represents —$(CH_2)_g$—, and g is an integer of 1 to 4,

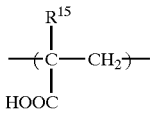
(7-2)

wherein in formula (7-2), $R^{15}$ represents a hydrogen atom or a methyl group,

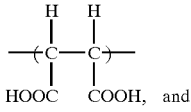
(7-3)

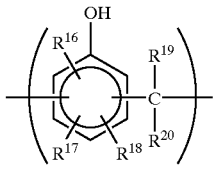
(7-4)

wherein in formula (7-4), $R^{16}$, $R^{17}$, $R^{18}$, $R^{19}$ and $R^{20}$ each represent independently a hydrogen atom or an alkyl group of 1 to 4 carbon atoms.

9. The composition according to claim 6, wherein said acid dissociable group is any one of a substituted methyl group, 1-substituted ethyl group, 1-branched alkyl group, silyl group, germyl group, alkoxycarbonyl group, acyl group, and cyclic acid dissociable group.

10. The composition according to claim 6, wherein a rate of incorporation of an acid dissociable group within an acid dissociable group-containing resin of said constituent (B) is within a range from 10 to 100%.

11. The composition according to claim 6, wherein said acid dissociable group-containing resin is any one of a resin in which either a portion of, or all hydrogen atoms of phenolic hydroxyl groups within a poly(p-hydroxystyrene) have been substituted with said acid dissociable group, a resin in which either a portion of, or all hydrogen atoms of phenolic hydroxyl groups and/or hydrogen atoms of carboxyl groups within a copolymer of p-hydroxystyrene and/or p-hydroxy-α-methylstyrene with (meth)acrylic acid have been substituted with said acid dissociable group, and other resins based on such resins.

12. A chemically amplified negative type radiation sensitive resin composition comprising (A) a radiation sensitive acid generator comprising a sulfonyloxime compound represented by said general formula (1) as defined in claim 1, (C) an alkali-soluble resin, and (D) a compound which is capable of cross-linking with said alkali-soluble resin in presence of an acid.

13. The composition according to claim 6, wherein an amount of said radiation sensitive acid generator of constituent (A) is within a range from 0.001 to 70 parts by weight per 100 parts by weight of said resin protected with an acid dissociable group of said constituent (B).

14. The composition according to claim 13, wherein said alkali-soluble resin of constituent (C) is either one of an addition polymerization type resin with at least one type of repeating unit represented by any of formulas (7-1) to (7-3) shown in claim 7, and condensation polymerization type resin with at least one type of repeating unit represented by a formula (7-4) shown in claim 7.

15. The composition according to claim 13, wherein said compound of constituent (D) which is capable of cross-linking with said alkali-soluble resin in presence of an acid is a compound with at least one type of substituent with cross-linking reactivity relative to said alkali-soluble resin of constituent (C).

16. The composition according to claim 15, wherein said substituent with cross-linking reactivity relative to said alkali-soluble resin is a group represented by any one of formulas (8-1) to (8-5) shown below:

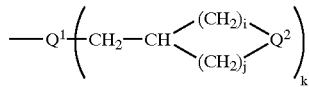
(8-1)

wherein in formula (8-1), k represents 1 or 2, $Q^1$ represents a single bond, —O—, —S—, —COO— or —NH— when k=1, or a trivalent nitrogen atom when k=2, $Q^2$ represents either —O— or —S—, i represents an integer of 0 to 3, j represents an integer of 1 to 3, and i+j=1 to 4,

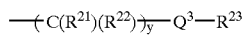
(8-2)

wherein in formula (8-2), $Q^3$ represents —O—, —COO— or —CO—, $R^{21}$ and $R^{22}$ each represent independently a hydrogen atom or an alkyl group of 1 to 4 carbon atoms, $R^{23}$ represents an alkyl group of 1 to 5 carbon atoms, an aryl group of 6 to 12 carbon atoms or an aralkyl group of 7 to 14 carbon atoms, and y represents an integer of 1 or greater, $$—C(R^{24})=C(R^{25})(R^{26})$$ (8-3)

wherein in formula (8-3), $R^{24}$, $R^{25}$ and $R^{26}$ each represent independently a hydrogen atom or an alkyl group of 1 to 4 carbon atoms,

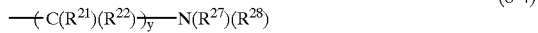
(8-4)

wherein in formula (8-4), $R^{21}$ and $R^{22}$ are identical with $R^{21}$ and $R^{22}$ in said formula (8–20), $R^{27}$ and $R^{28}$ each represent independently an alkyloyl group of 1 to 5 carbon atoms, and y represents an integer of 1 or greater, and

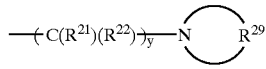
(8-5)

wherein in formula (8-5), $R^{21}$ and $R^{22}$ are identical with $R^{21}$ and $R^{22}$ in said formula (8-2), $R^{29}$ represents a bivalent organic group in a form of a 3 to 8 membered cyclic structure containing an oxygen atom, a sulfur atom or a nitrogen atom as a hetero atom, and y represents an integer of 1 or greater.

17. The composition according to claim 13, wherein per 100 parts by weight of said alkali-soluble resin (C), from 0.001 to 70 parts by weight of said radiation sensitive acid generator of constituent (A), and from 5 to 95 parts by weight of said cross-linking agent of constituent (D) are present.

* * * * *